United States Patent
Pan et al.

(10) Patent No.: US 12,349,407 B2
(45) Date of Patent: Jul. 1, 2025

(54) METHOD FOR MANUFACTURING SEMICONDUCTOR STRUCTURE WITH DIELECTRIC FEATURE

(71) Applicant: Taiwan Semiconductor Manufacturing Company, Ltd., Hsinchu (TW)

(72) Inventors: Kuan-Ting Pan, Taipei (TW); Kuo-Cheng Chiang, Zhubei (TW); Yi-Ruei Jhan, Keelung (TW); Shi-Ning Ju, Hsinchu (TW); Chih-Hao Wang, Baoshan Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 619 days.

(21) Appl. No.: 17/580,453

(22) Filed: Jan. 20, 2022

(65) Prior Publication Data
US 2023/0006051 A1    Jan. 5, 2023

Related U.S. Application Data

(60) Provisional application No. 63/216,866, filed on Jun. 30, 2021.

(51) Int. Cl.
*H10D 30/67*   (2025.01)
*H10D 62/10*   (2025.01)
*H10D 64/27*   (2025.01)

(52) U.S. Cl.
CPC ..... *H10D 30/6735* (2025.01); *H10D 30/6757* (2025.01); *H10D 62/118* (2025.01); *H10D 64/514* (2025.01)

(58) Field of Classification Search
CPC ......... H01L 29/42392; H01L 29/78696; H01L 29/0673; H01L 21/823481;
(Continued)

(56) References Cited

U.S. PATENT DOCUMENTS 9,209,247 B2   12/2015  Colinge et al.
9,236,267 B2   1/2016   De et al.
(Continued)

FOREIGN PATENT DOCUMENTS

TW   201847783 A   12/2019

*Primary Examiner* — Matthew C Landau
*Assistant Examiner* — Jesse S Kysar
(74) *Attorney, Agent, or Firm* — Birch, Stewart, Kolasch & Birch, LLP

(57) ABSTRACT

Semiconductor structures and methods for manufacturing the same are provided. The semiconductor structure includes a substrate and first nanostructures and second nanostructures formed over the substrate. The semiconductor structure also includes a gate structure including a first portion wrapping around the first nanostructures and a second portion wrapping around the second nanostructures. The semiconductor structure also includes a dielectric feature sandwiched between the first portion and the second portion of the gate structure. In addition, the dielectric feature includes a bottom portion and a top portion over the bottom portion, and the top portion of the dielectric feature includes a shell layer and a core portion surrounded by the shell layer.

20 Claims, 53 Drawing Sheets

(58) Field of Classification Search
CPC ............ H01L 21/76897; H01L 29/775; H01L 29/66439; H01L 29/66545; H01L 29/0649; H01L 29/0653; H01L 21/76224–76237

See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2012/0138886 A1* | 6/2012 | Kuhn ................ H01L 29/0673 438/479 |
| 2017/0104061 A1* | 4/2017 | Peng ................ H01L 29/78696 |
| 2018/0259819 A1 | 9/2018 | Kajita et al. |
| 2020/0006559 A1 | 1/2020 | Mehandru et al. |
| 2020/0152736 A1 | 5/2020 | Yu et al. |
| 2020/0119163 A1 | 8/2020 | Xie et al. |

\* cited by examiner

US 12,349,407 B2

METHOD FOR MANUFACTURING SEMICONDUCTOR STRUCTURE WITH DIELECTRIC FEATURE

PRIORITY CLAIM AND CROSS-REFERENCE

This application claims the benefit of U.S. Provisional Application No. 63/216,866, filed on Jun. 30, 2021, the entirety of which is incorporated by reference herein.

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
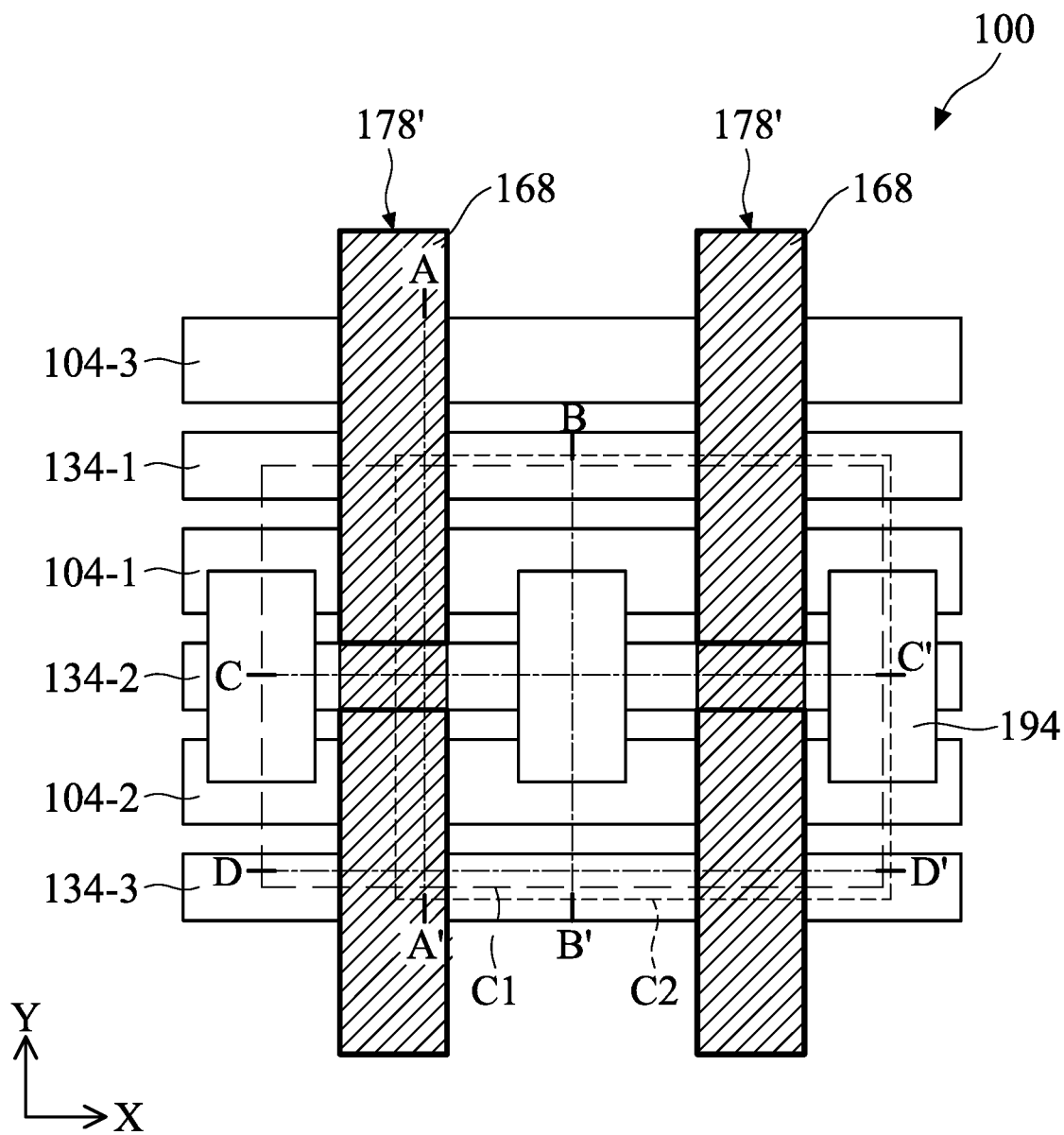
FIG. 1 illustrates a diagrammatic top view of a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The nanostructure transistor (e.g. nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of semiconductor structures and methods for forming the same are provided. The semiconductor structures may include nanostructures formed over a substrate and a gate structure wraps around the nanostructures. Dielectric features may be formed to separate the gate structure into different portions. In addition, the dielectric features may include bottom portions and top portions, and the top portions may include core portions and shell layers around the core portions. The core portion of the dielectric features may be made of a low k dielectric material and therefore may help to reduce the capacitance and improve the speed and performance of the resulting devices.

FIG. 1 illustrates a diagrammatic top view of a semiconductor structure 100 in accordance with some embodiments. FIG. 1 has been simplified for the sake of clarity to better understand the inventive concepts of the present disclosure. Additional features may be added in the semiconductor structure 100, and some of the features described below may be replaced, modified, or eliminated.

The semiconductor structure 100 may include multi-gate devices and may be included in a microprocessor, a memory, or other IC devices. For example, the semiconductor structure 100 may be a portion of an IC chip that include various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other applicable components, or combinations thereof.

Figure 2A:
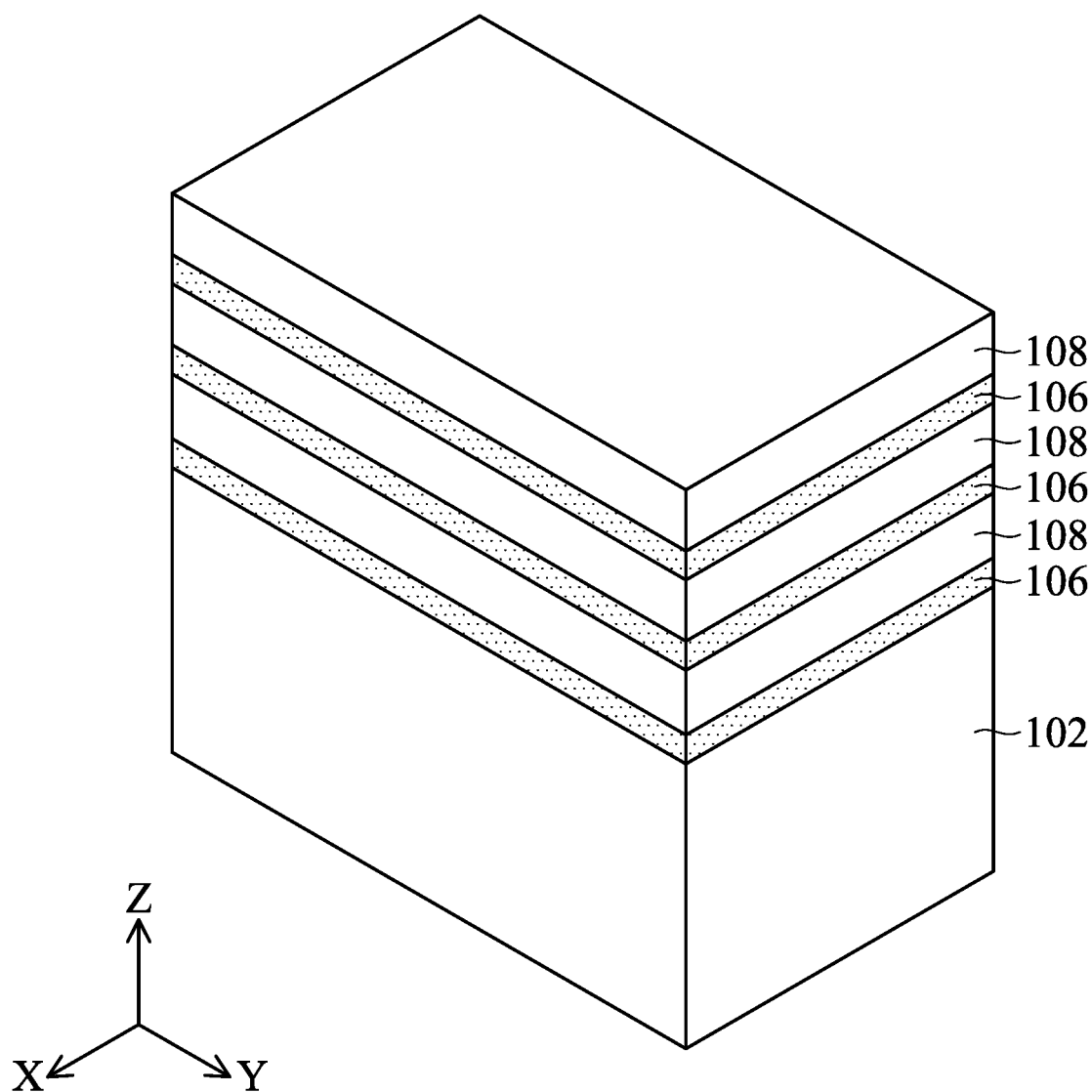
FIGS. 2A to 2Z illustrate diagrammatic perspective views of intermediate stages of manufacturing the semiconductor structure in accordance with some embodiments.
Figure 2B:
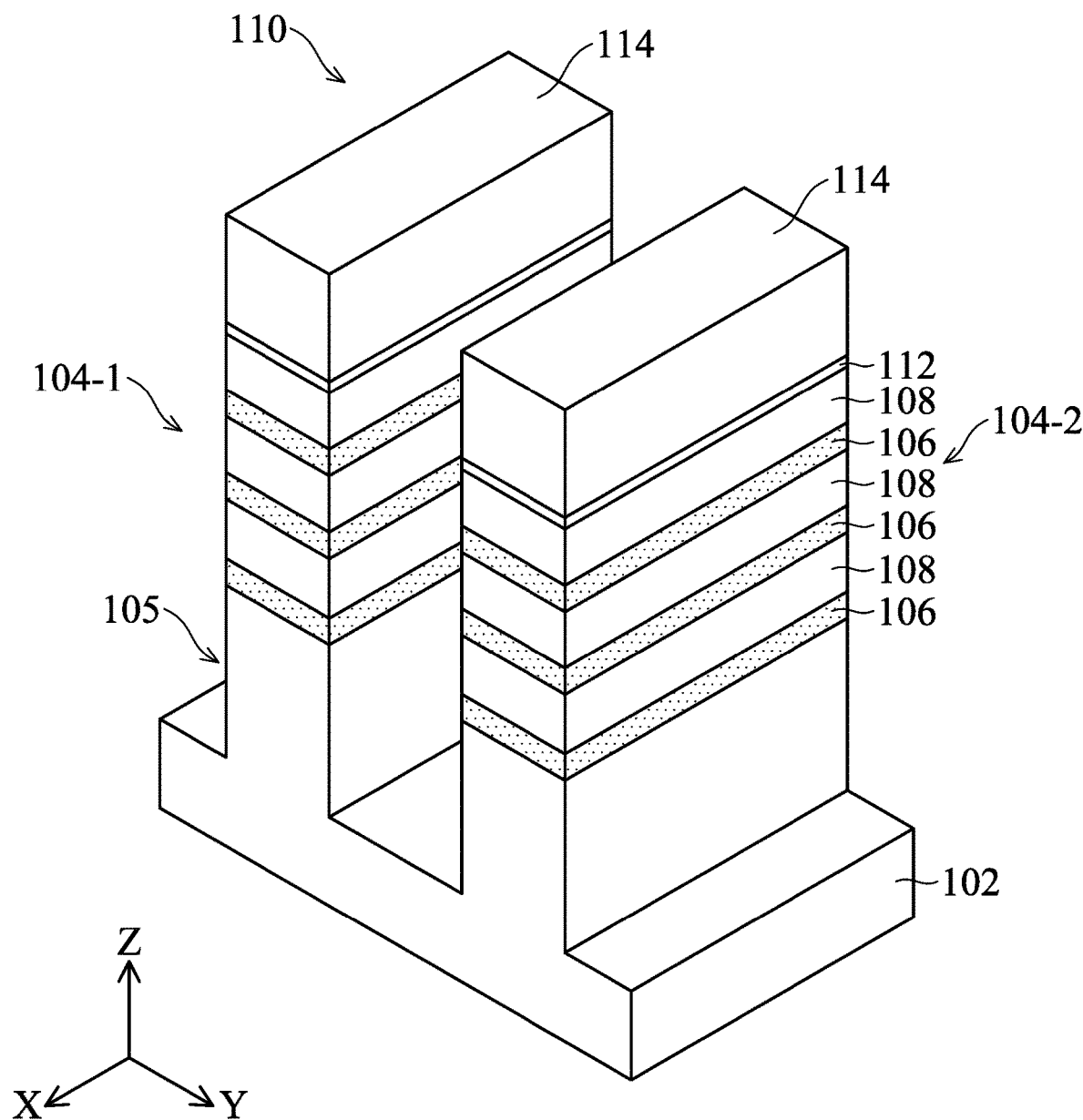
Figure 2C:
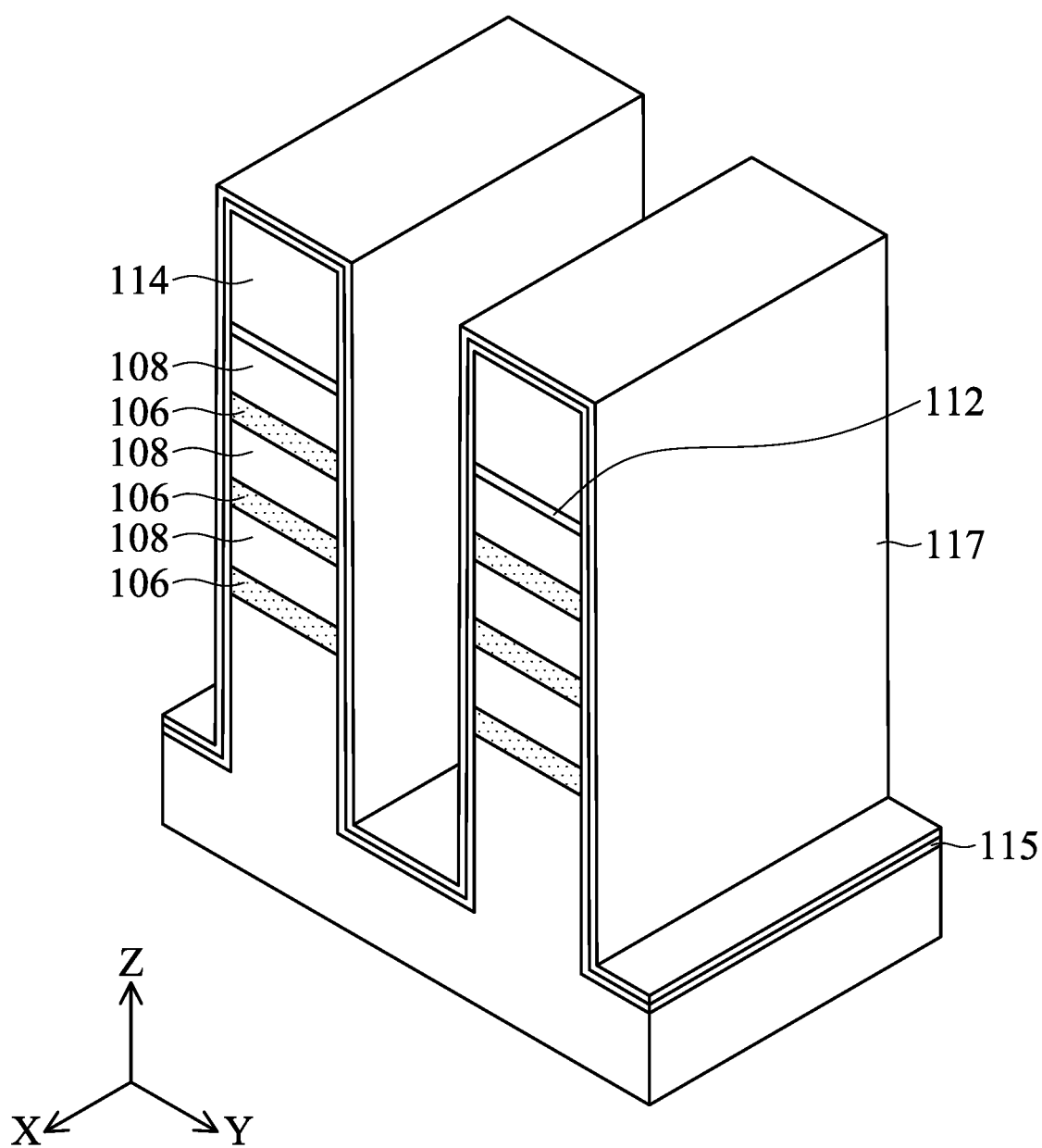
Figure 2D:
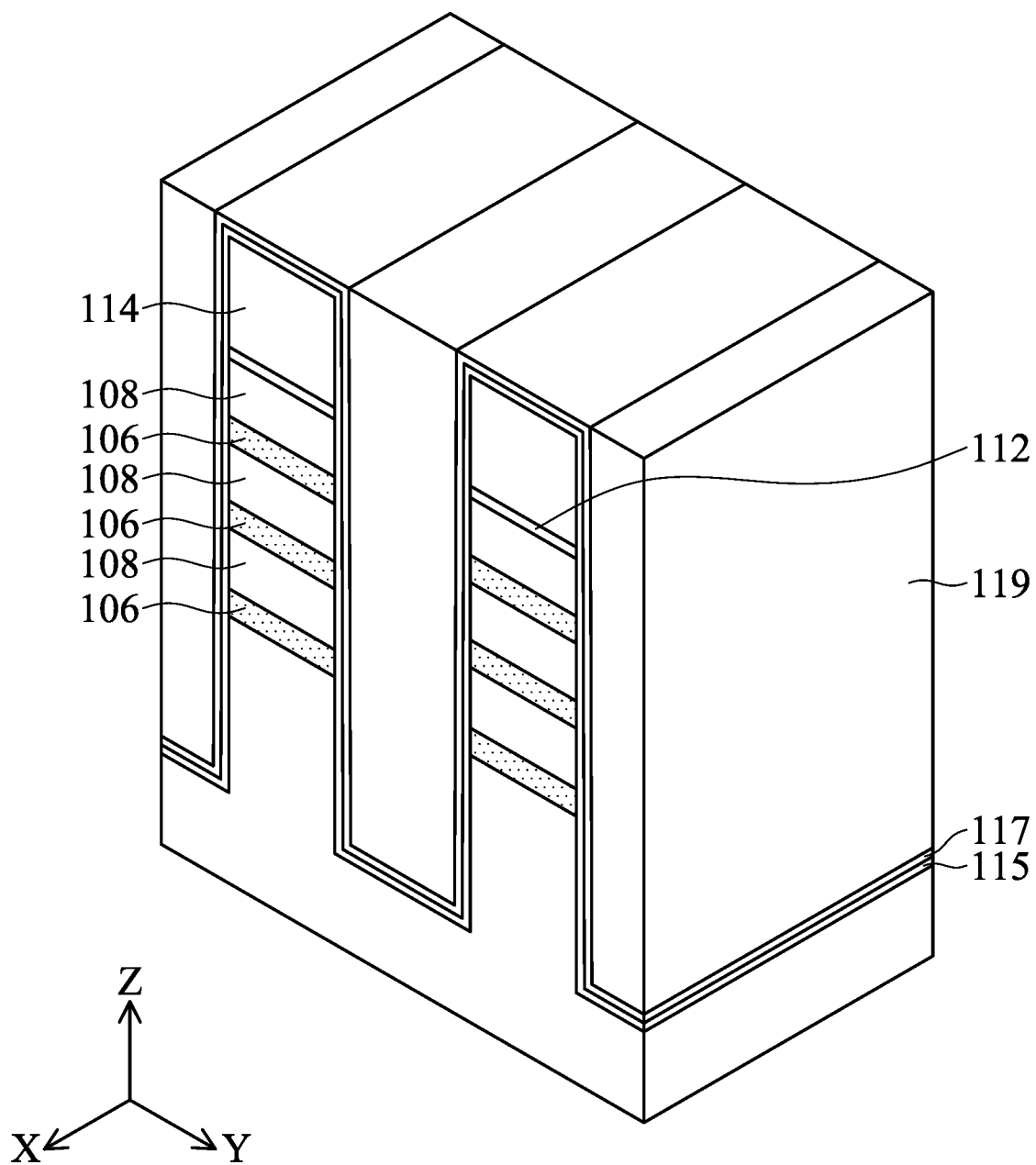
Figure 2E:
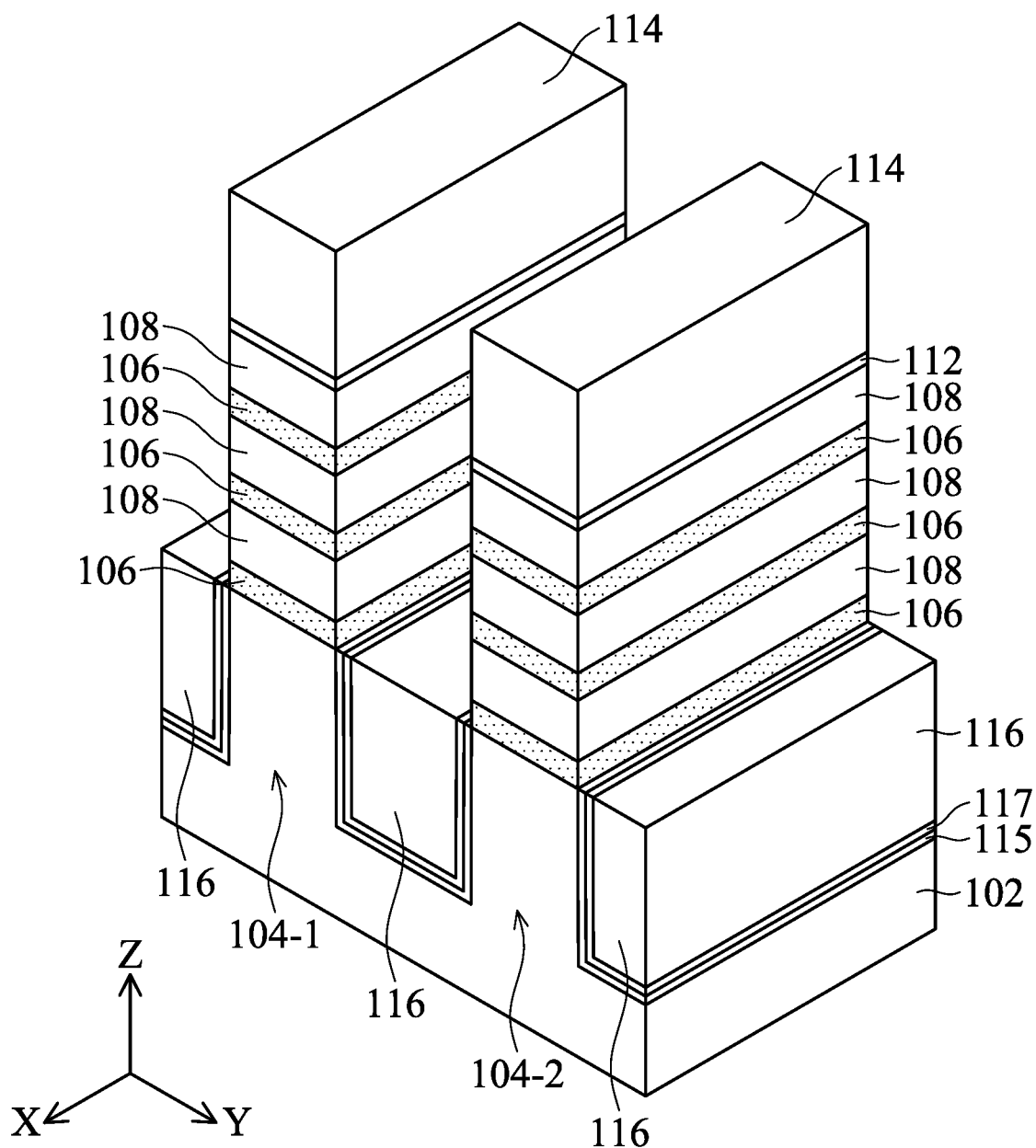
Figure 2F:
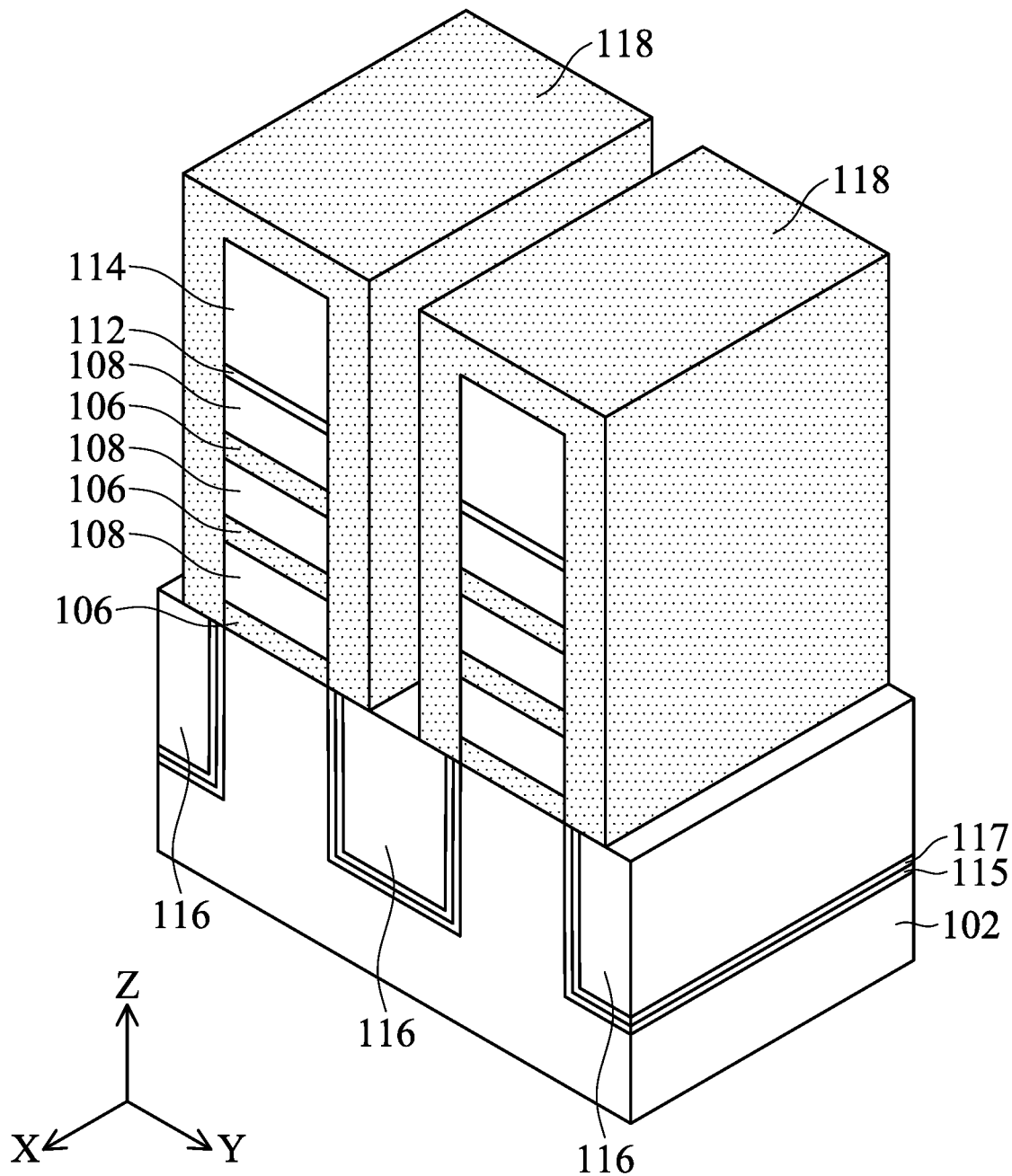
Figure 2G:
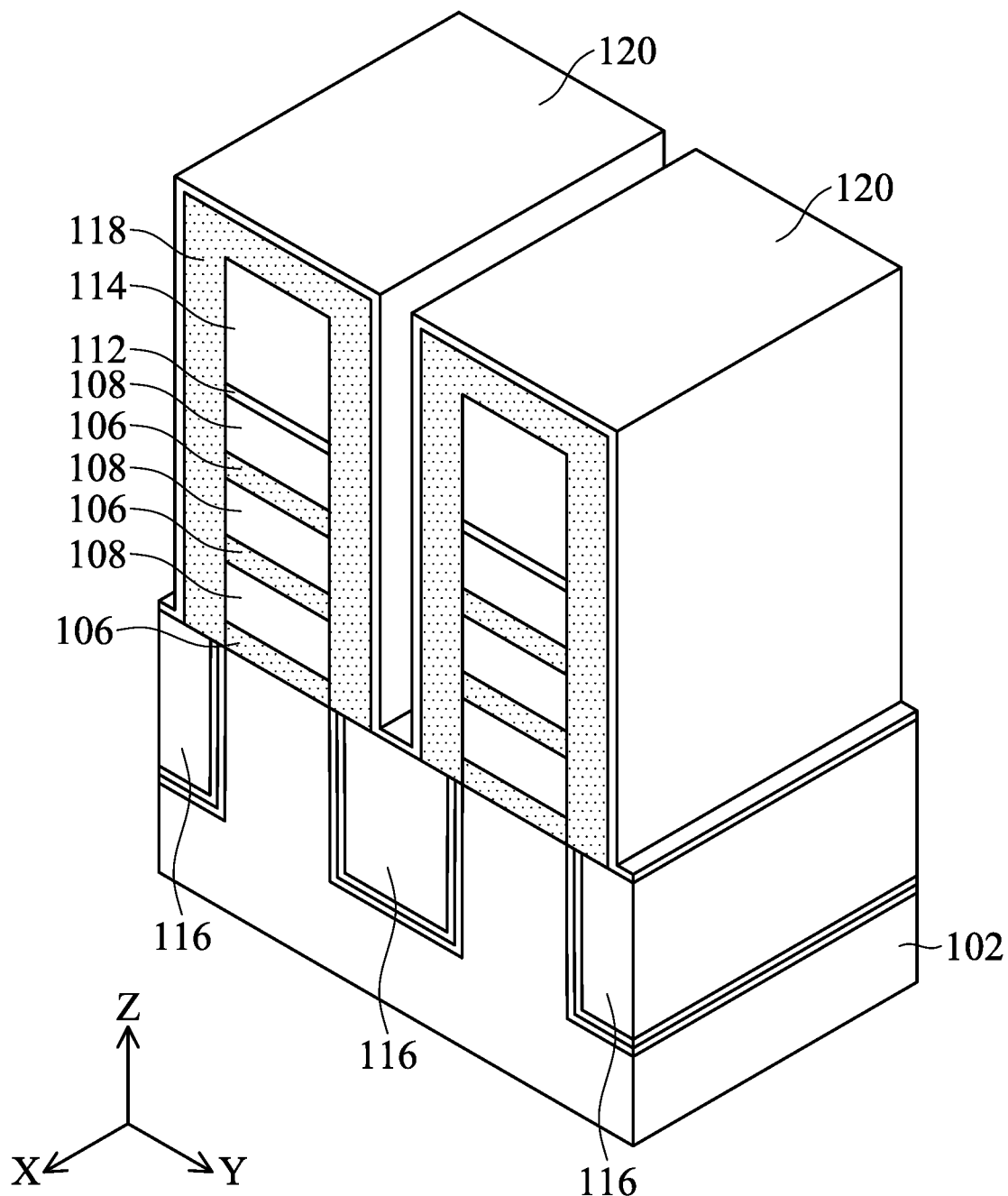
Figure 2H:
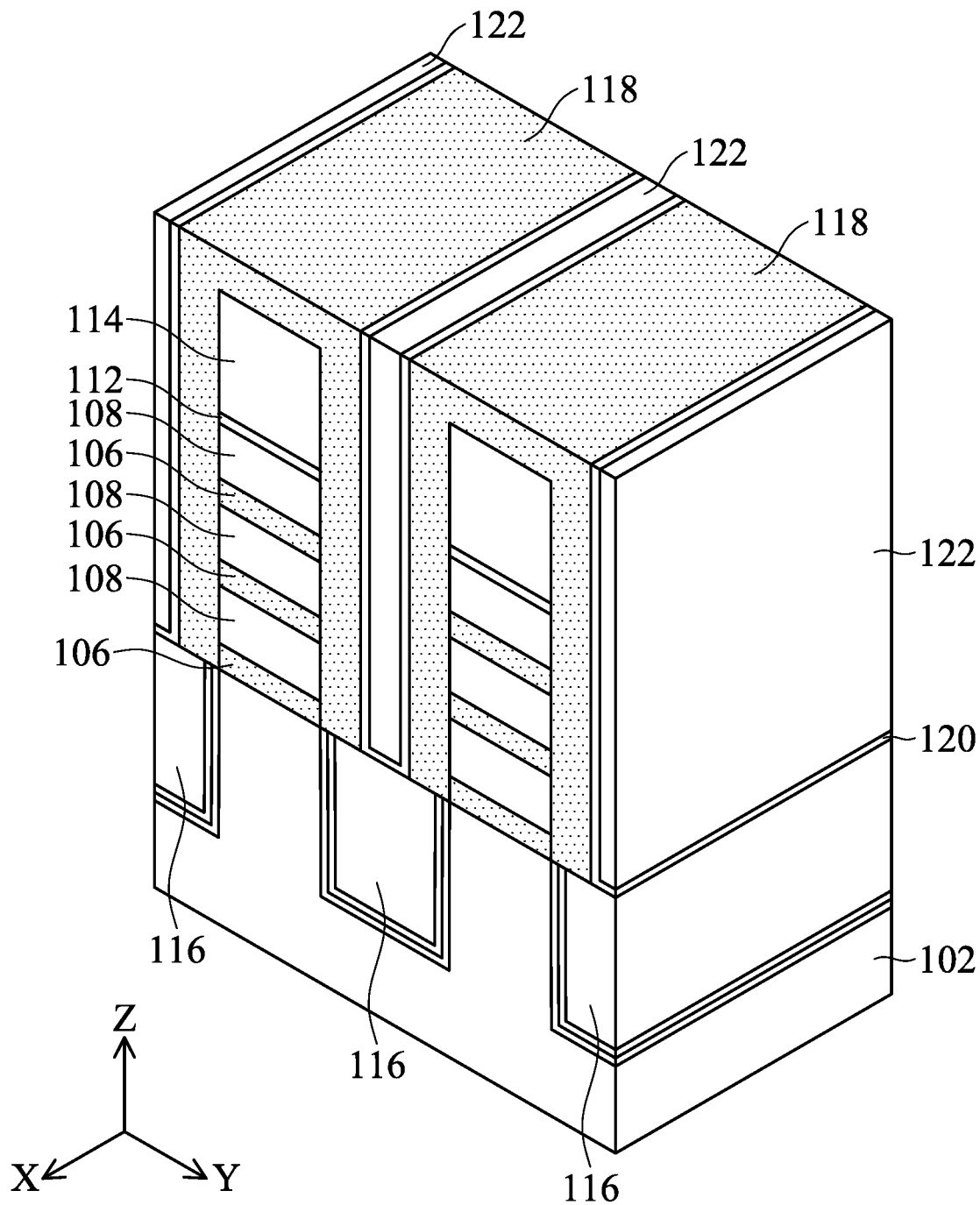
Figure 2I:
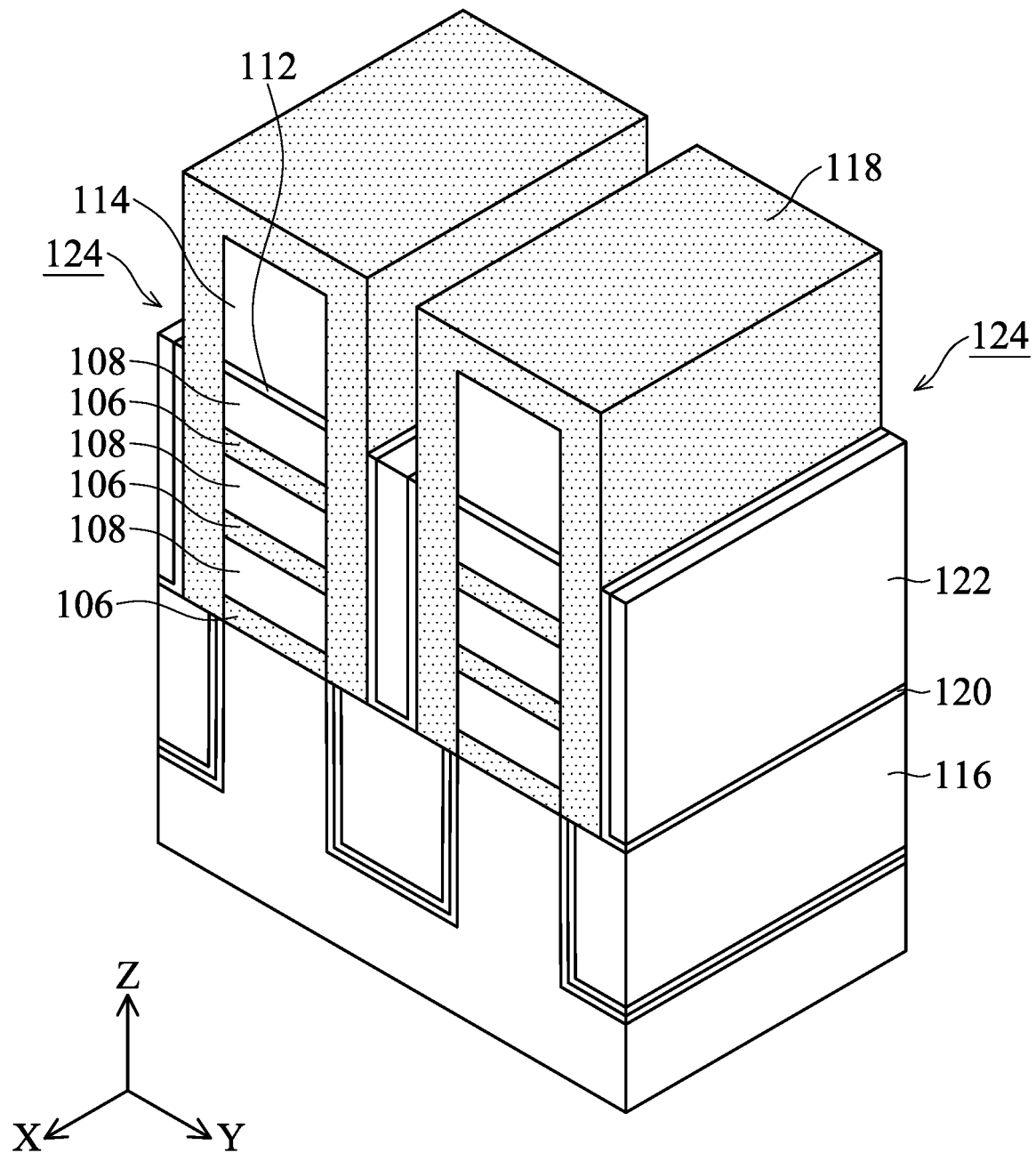
Figure 2J:
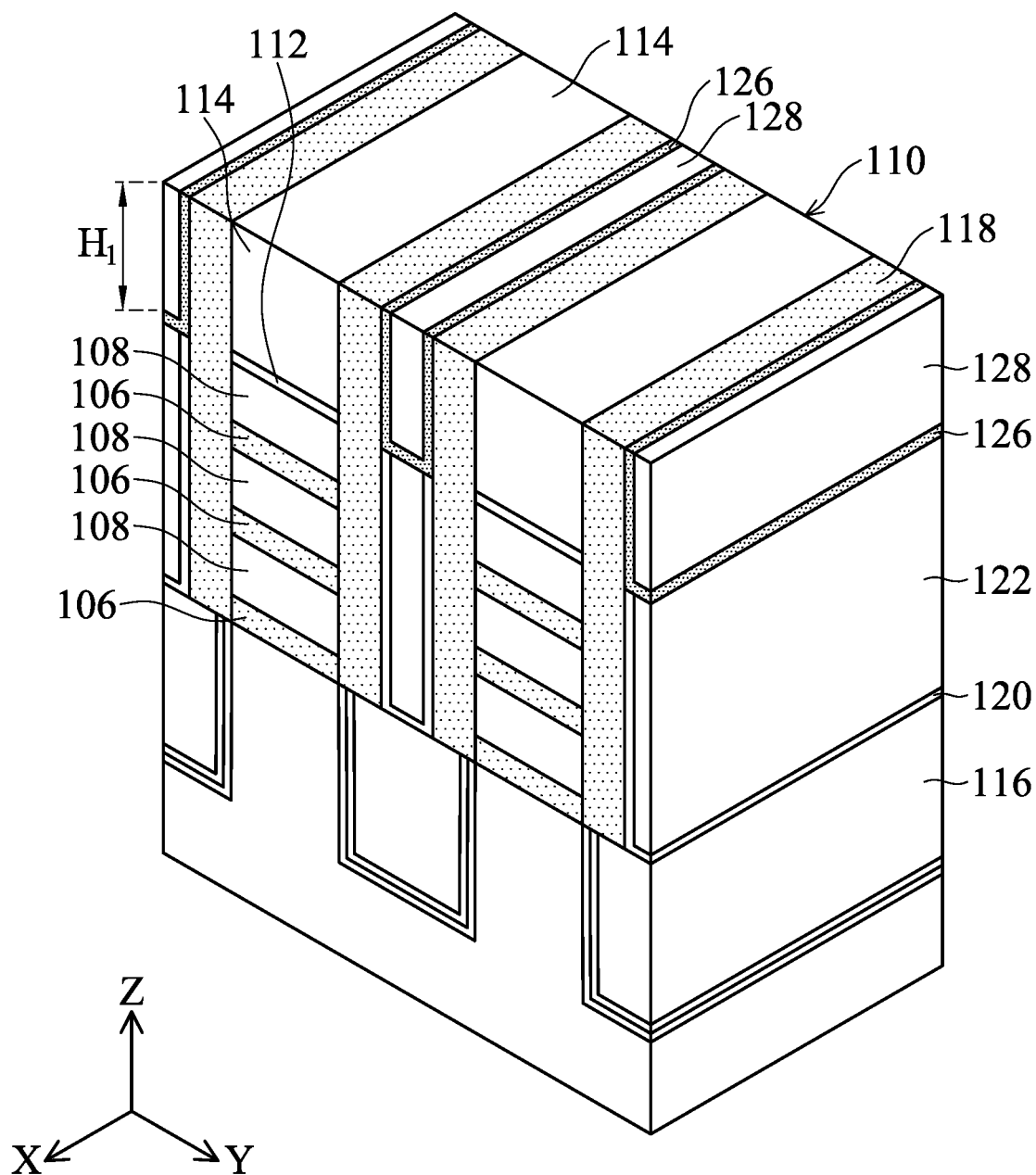
Figure 2K:
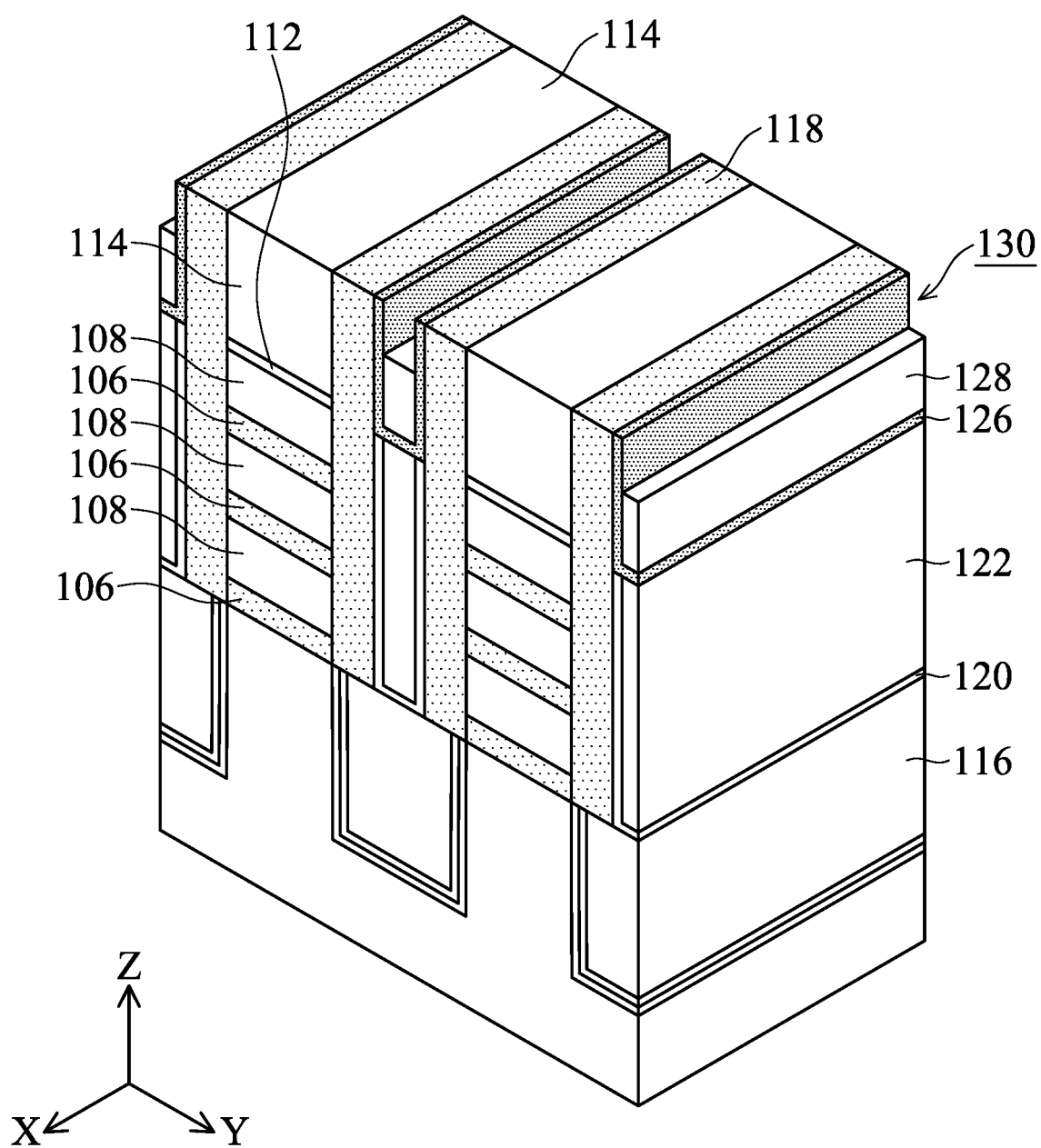
Figure 2L:
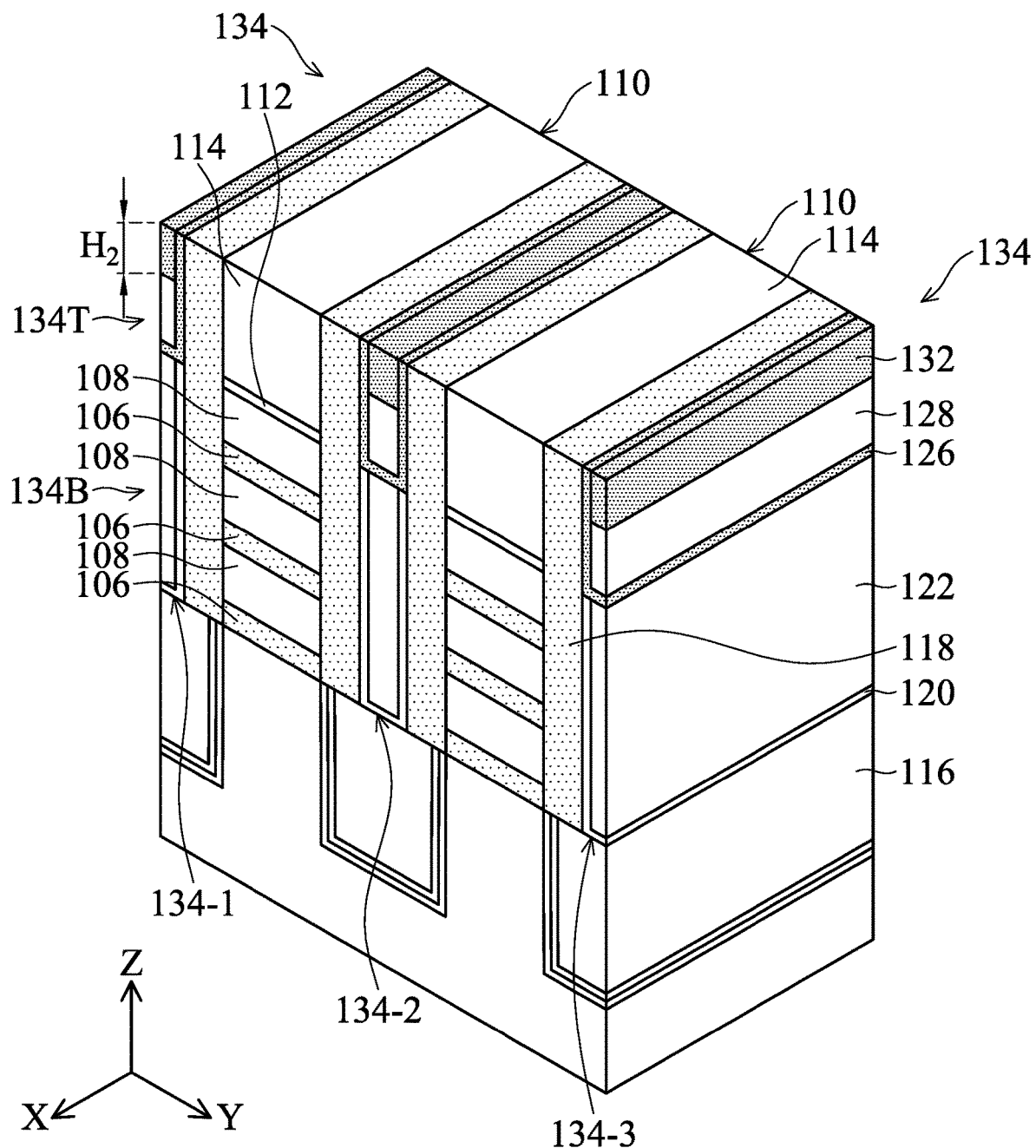
Figure 2M:
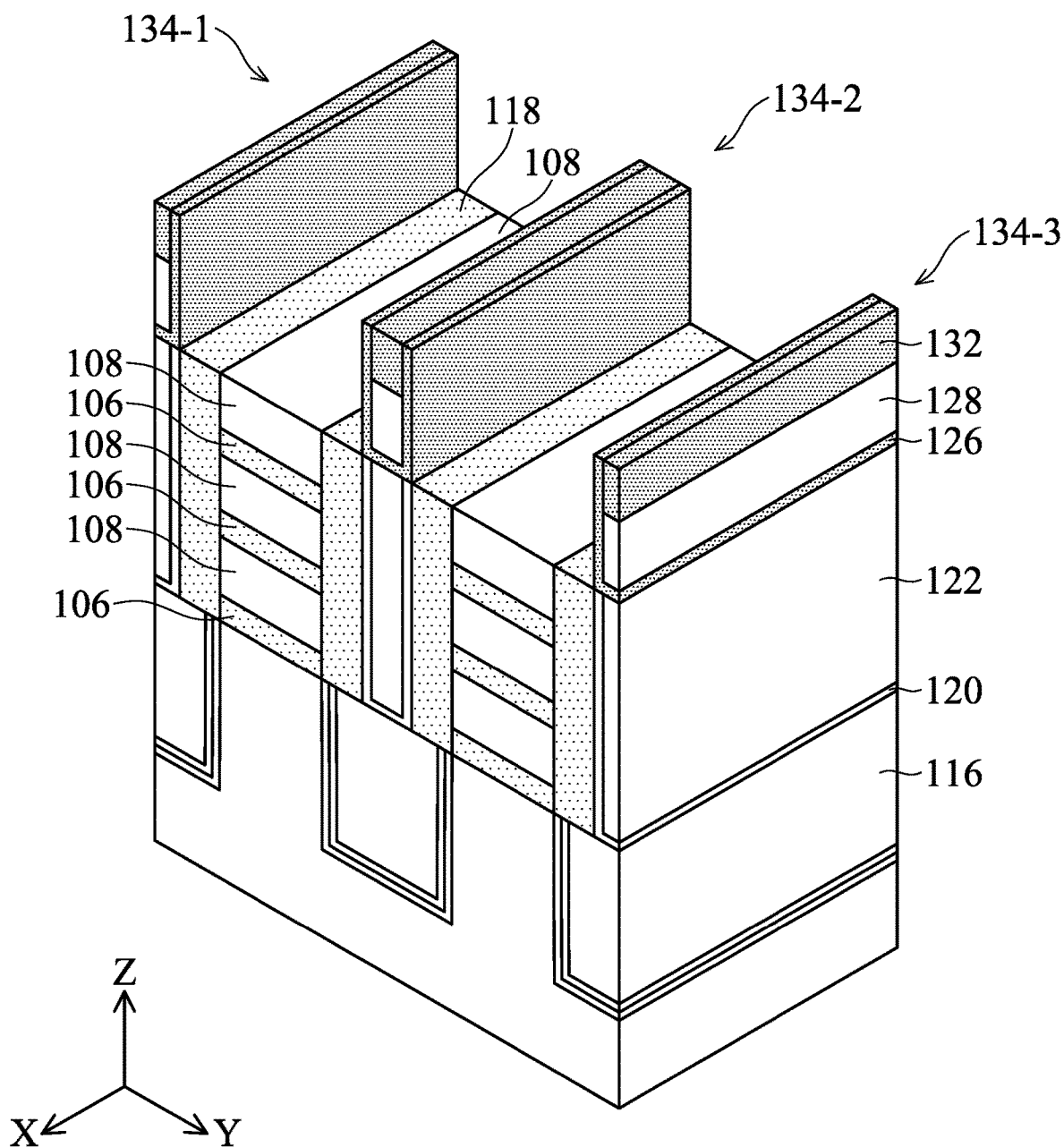
Figure 2N:
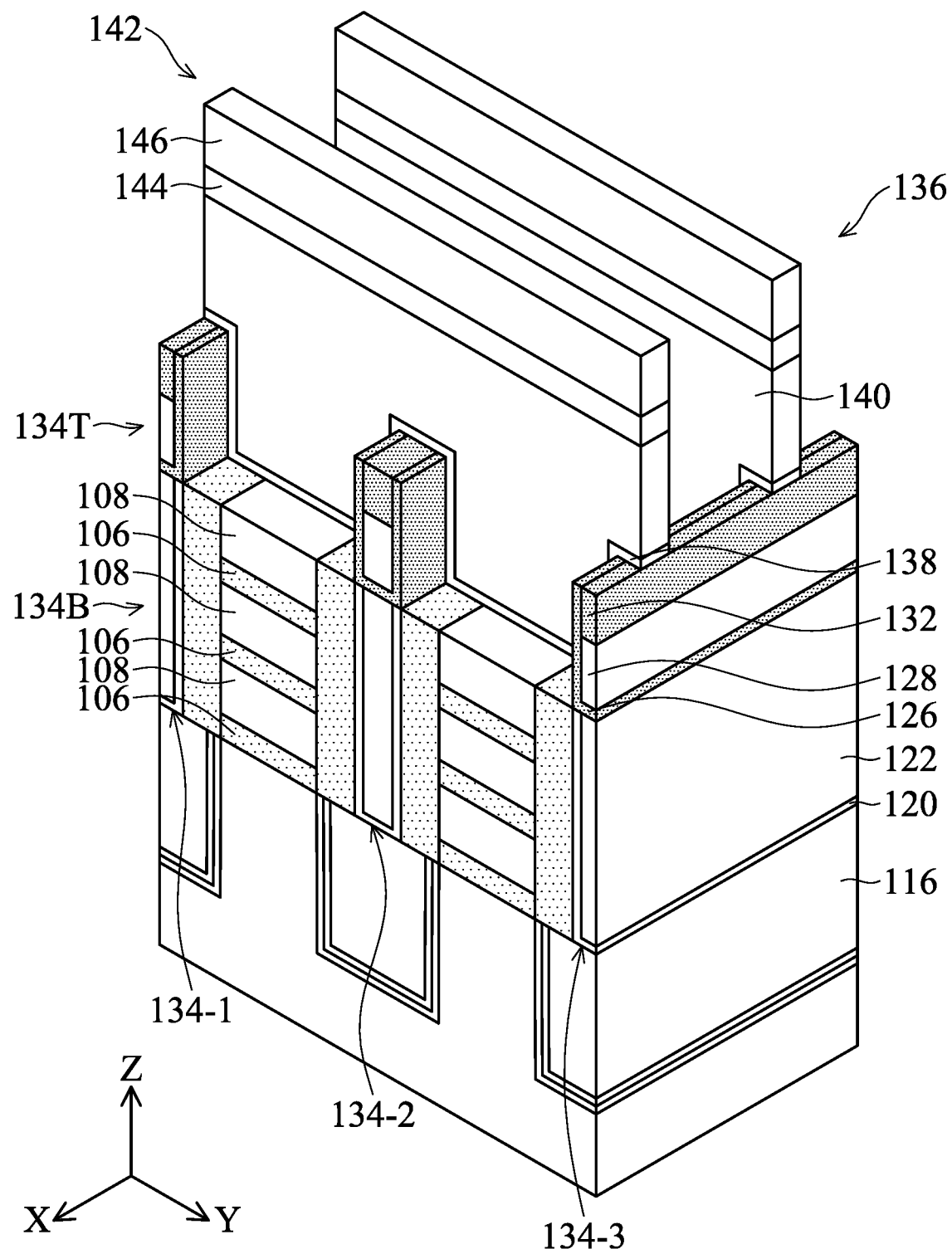
Figure 2O:
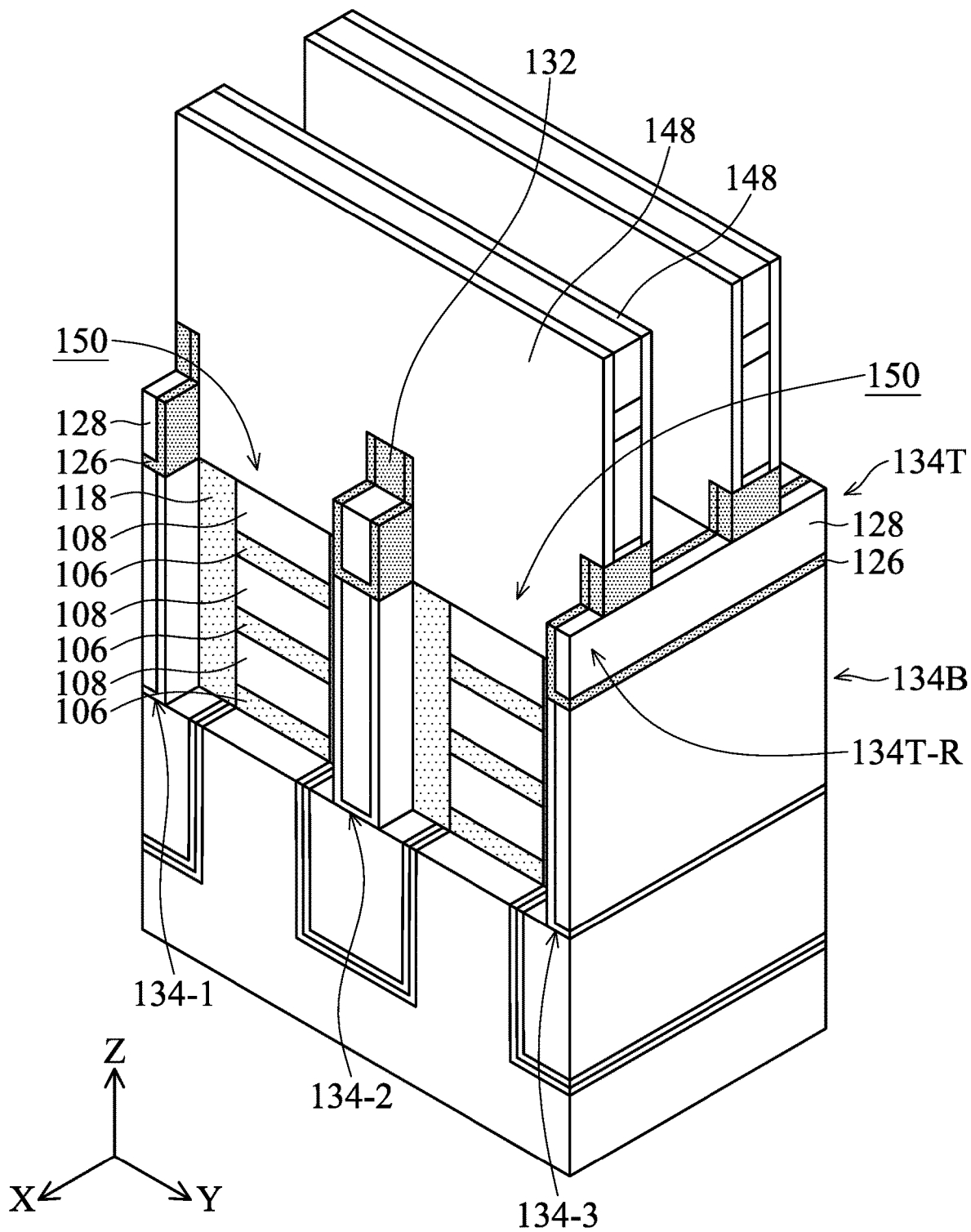
Figure 2P:
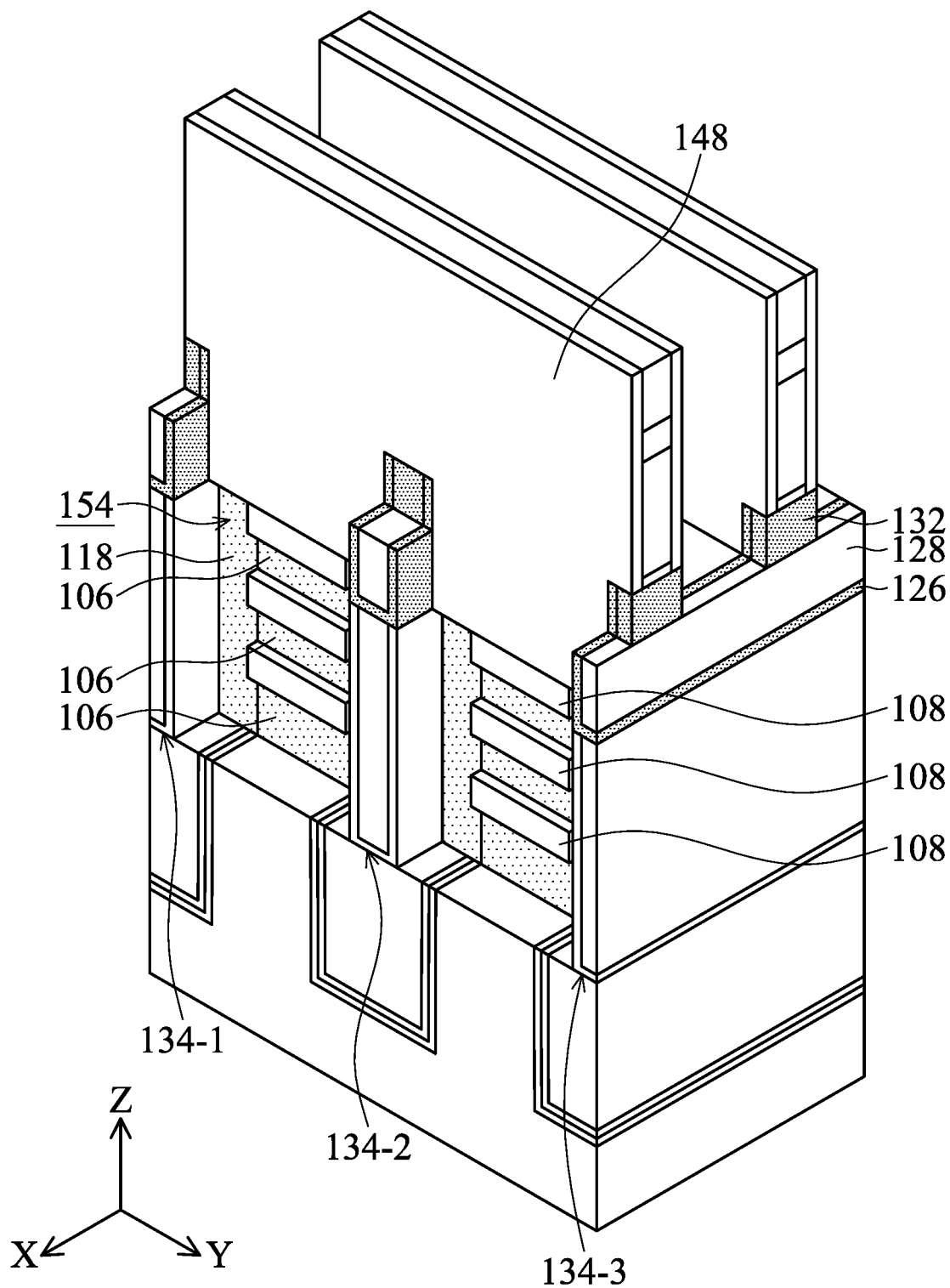
Figure 2Q:
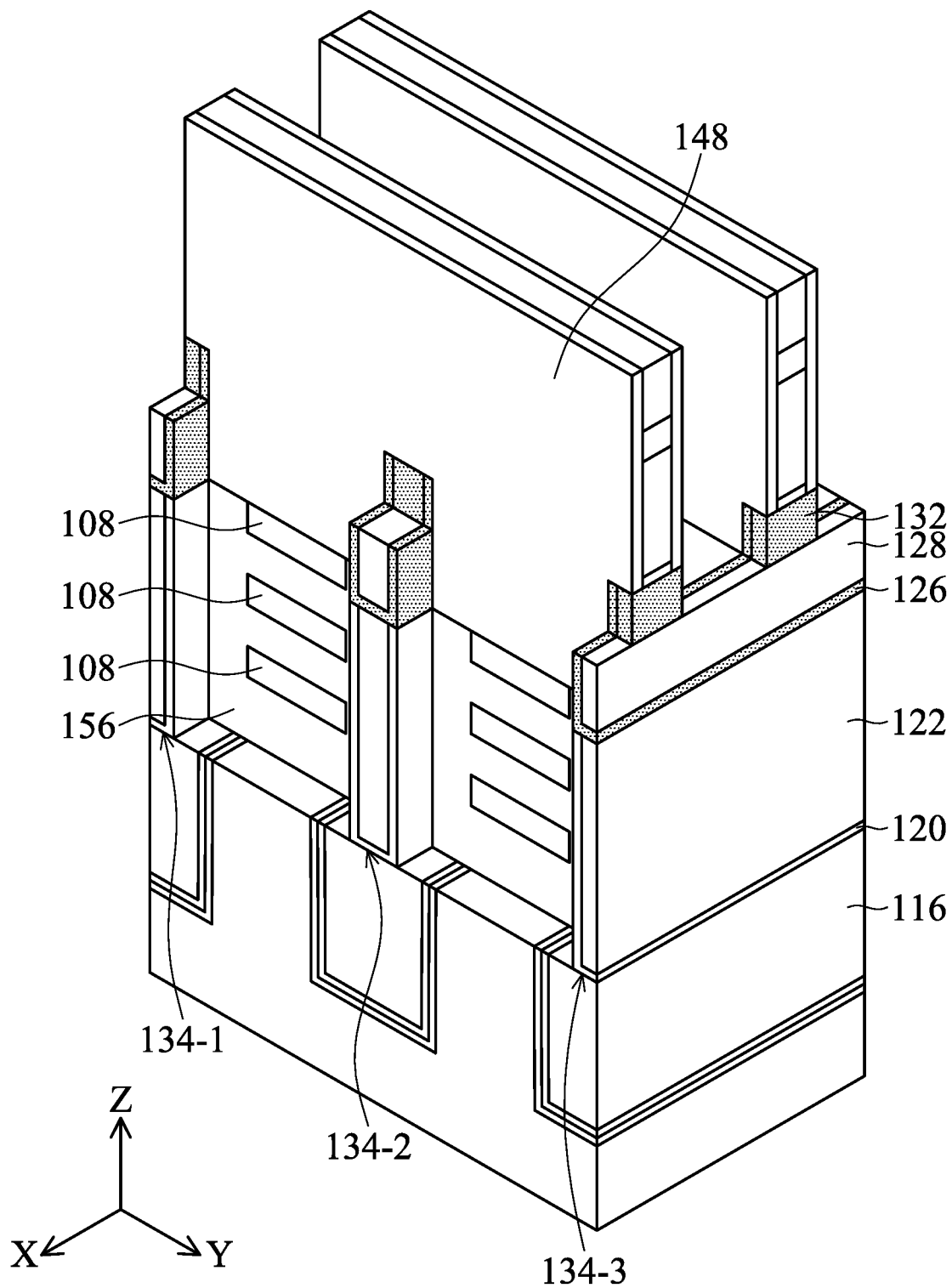
Figure 2R:
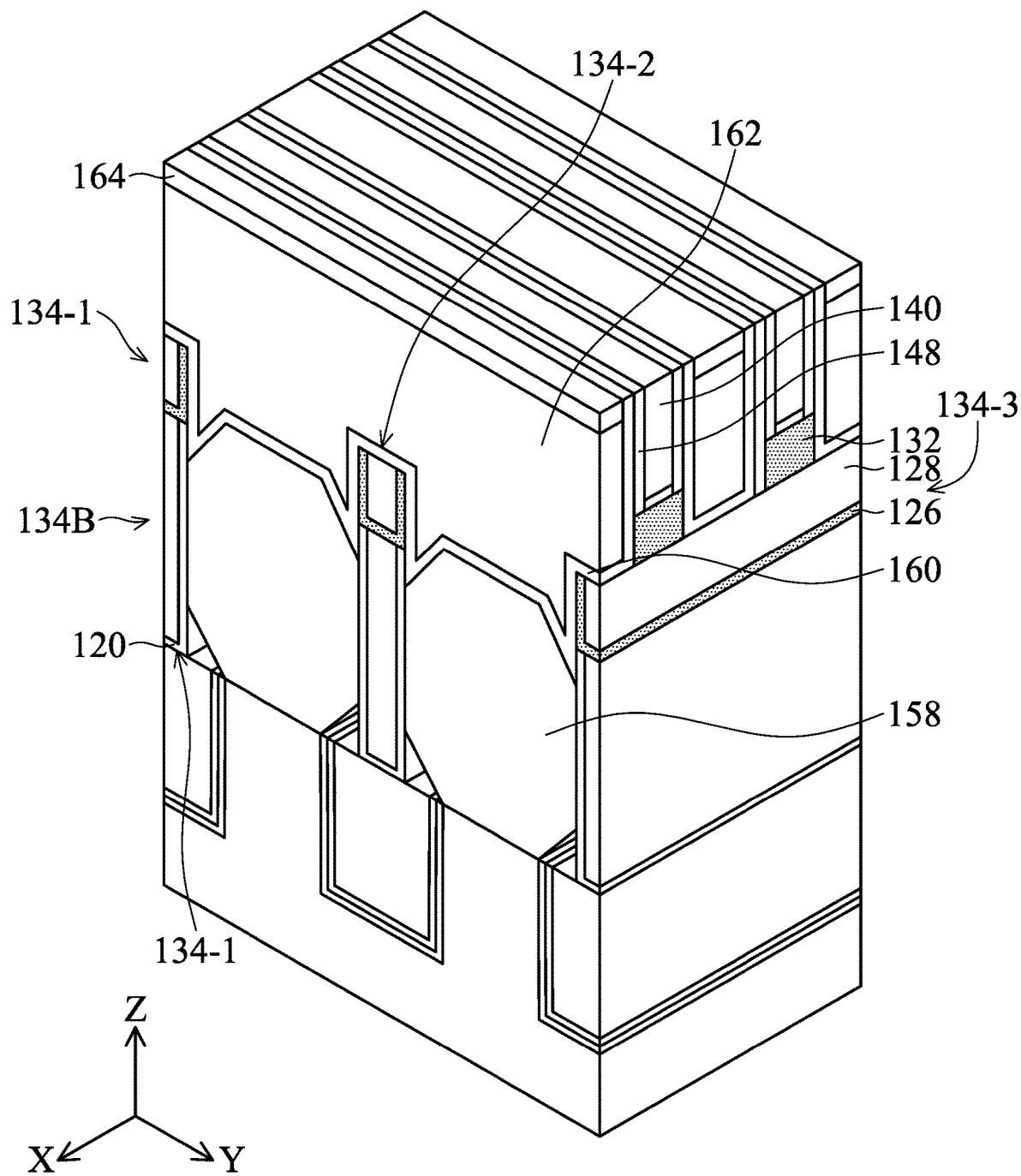
Figure 2S:
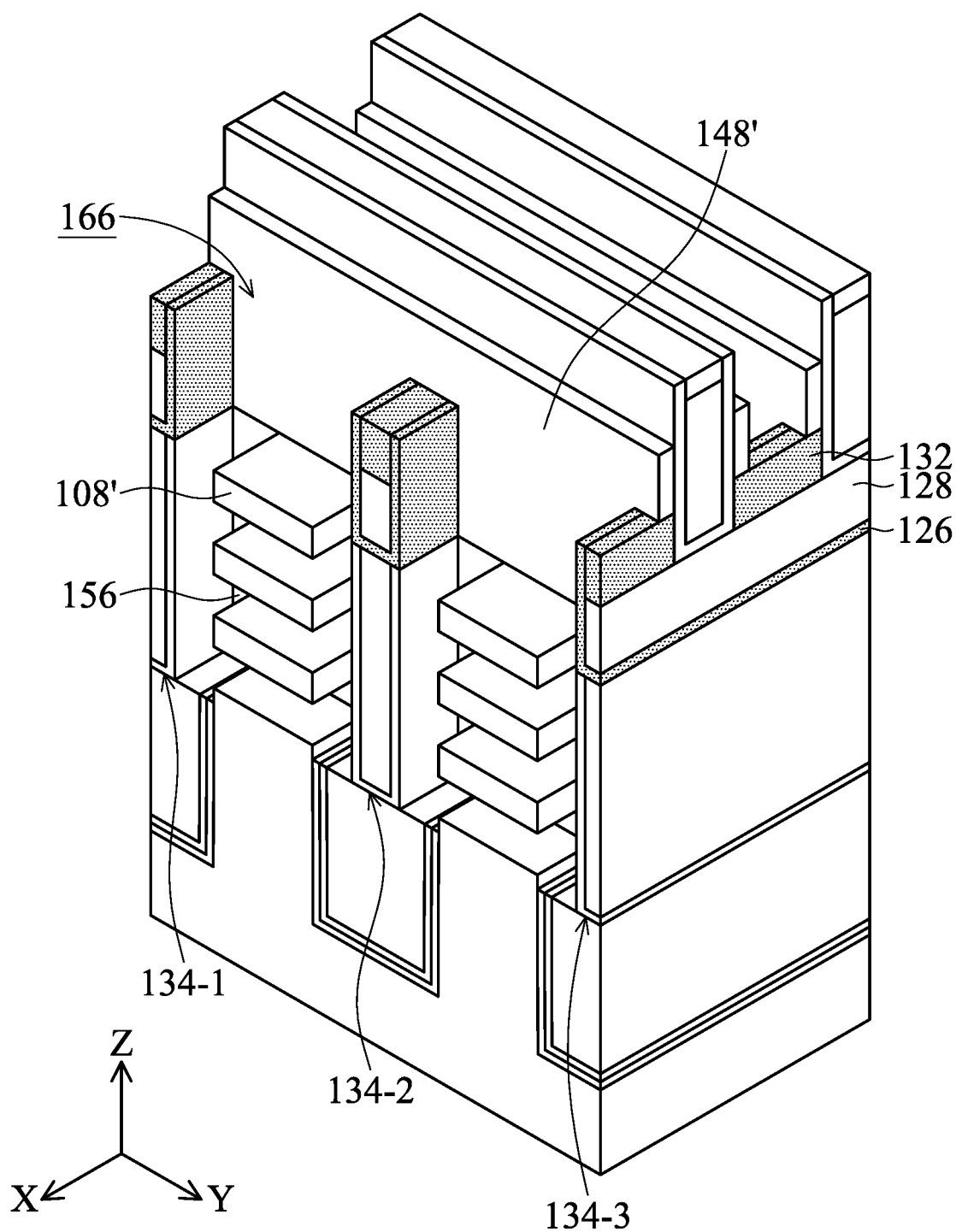
Figure 2T:
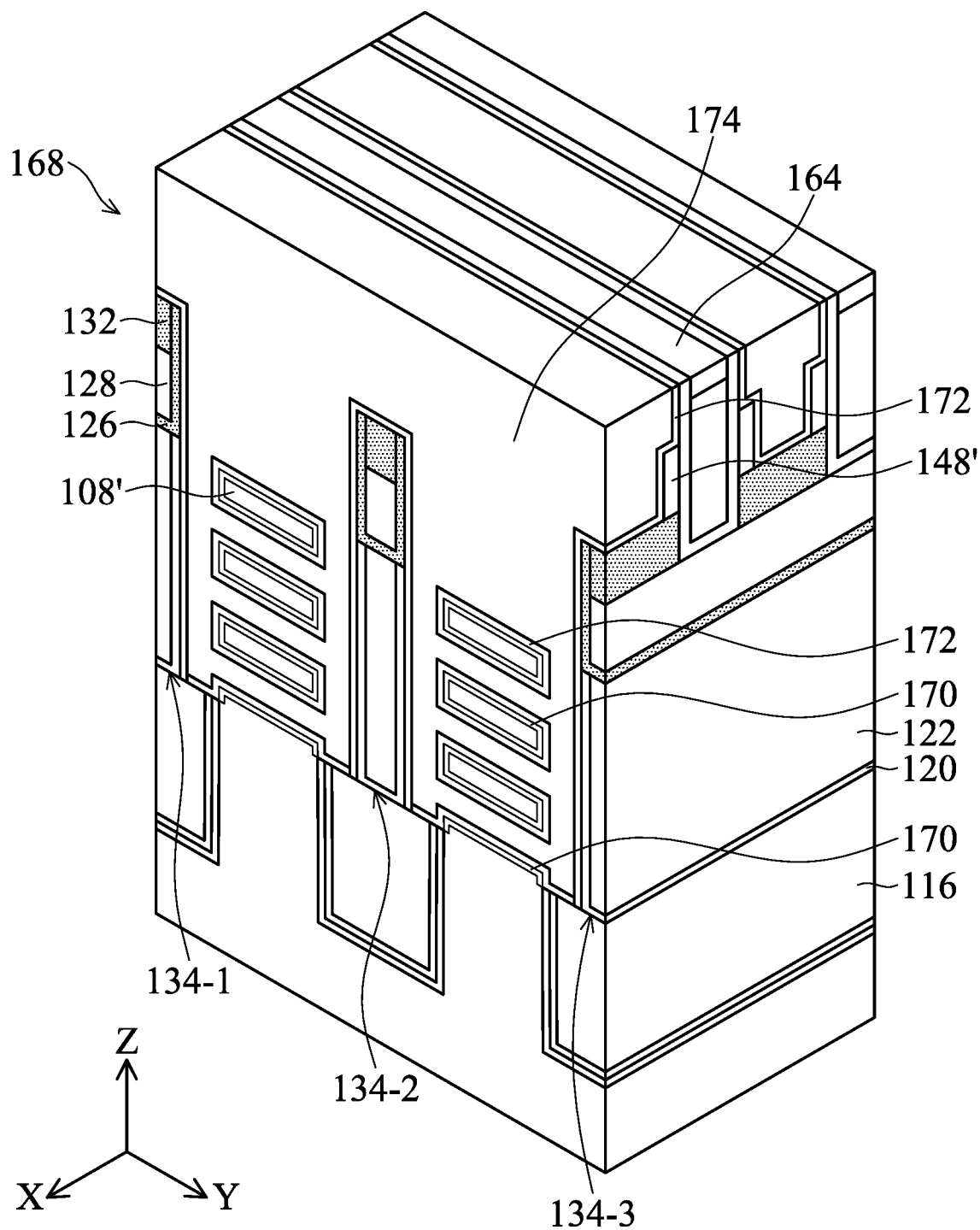
Figure 2U:
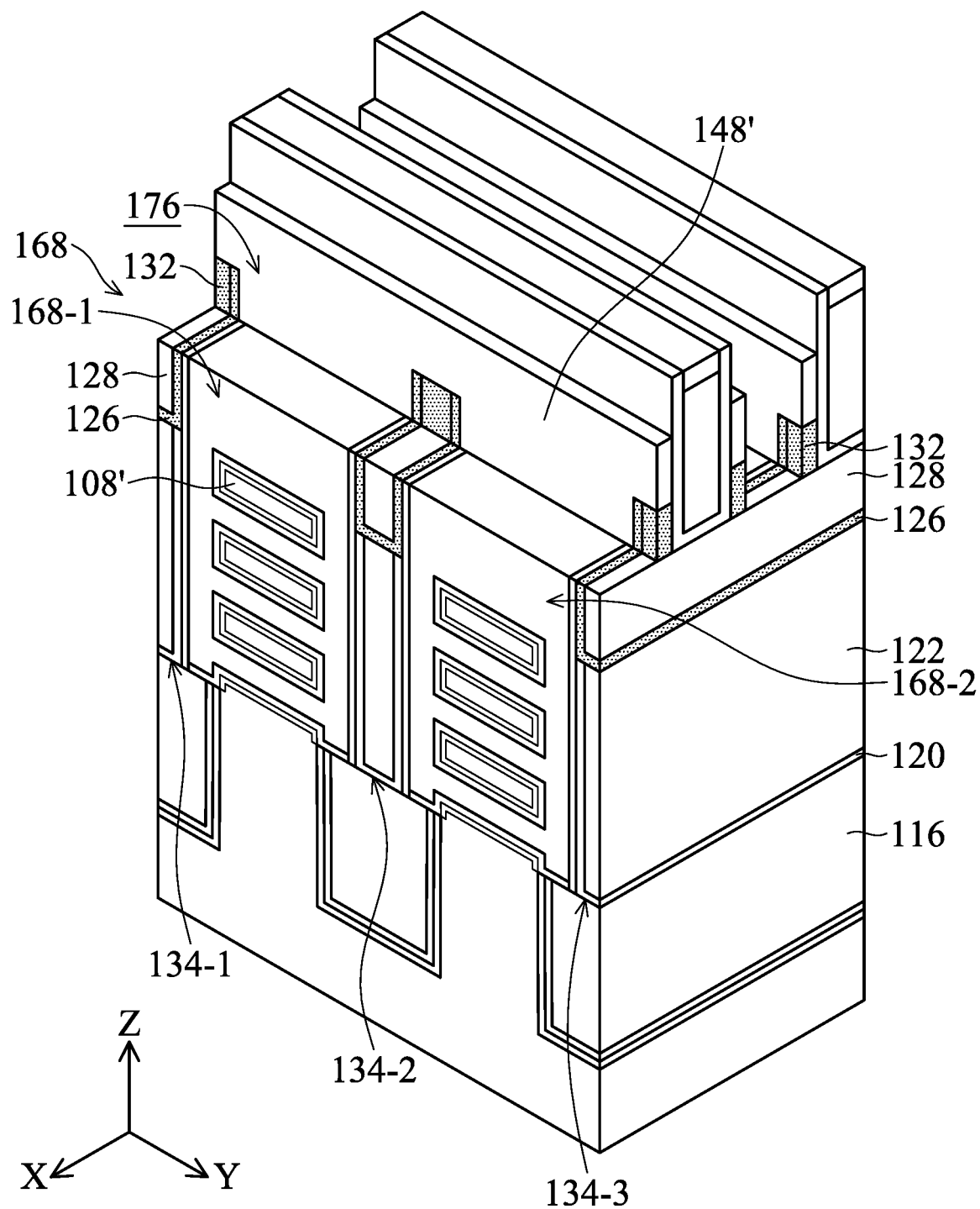
Figure 2V:
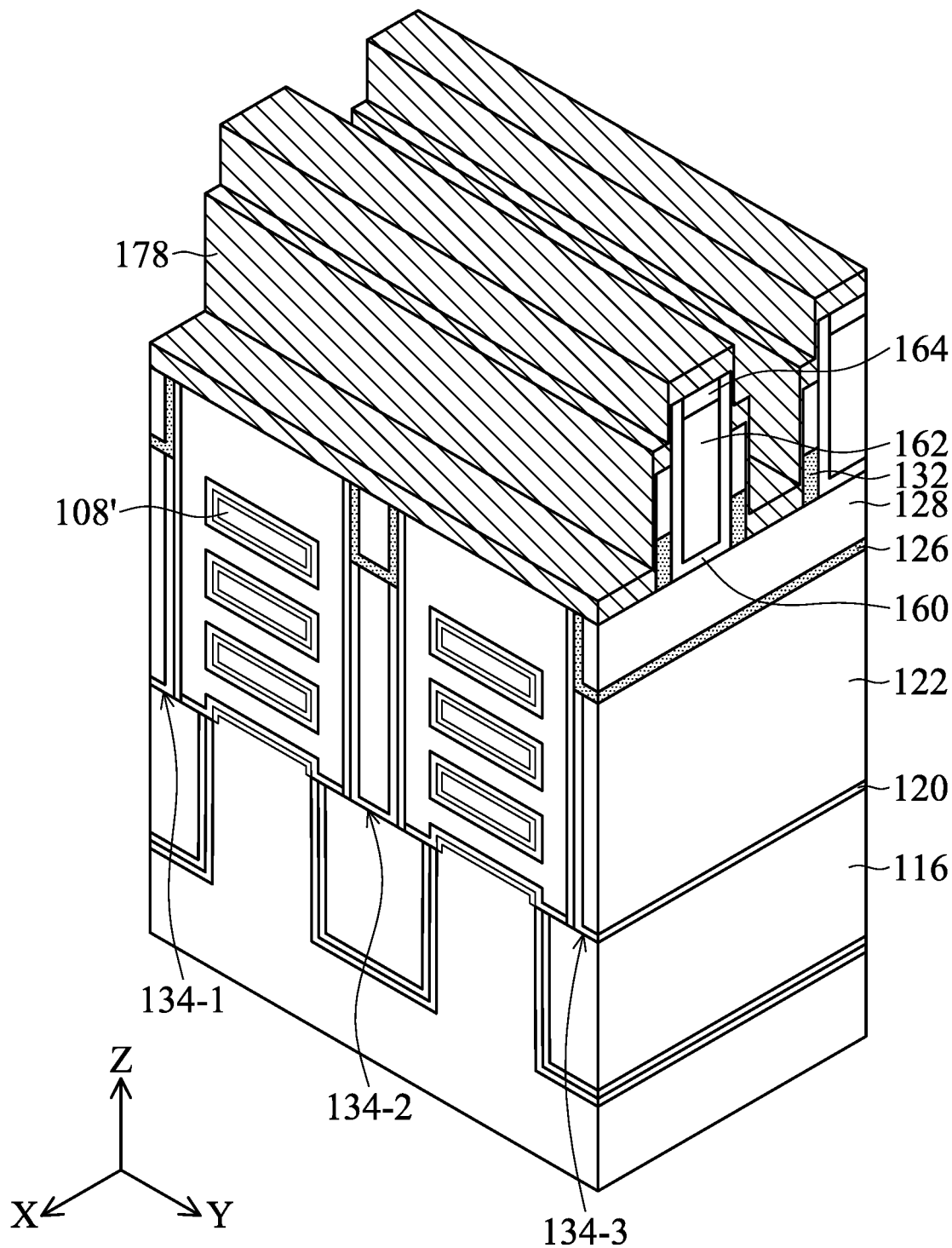
Figure 2W:
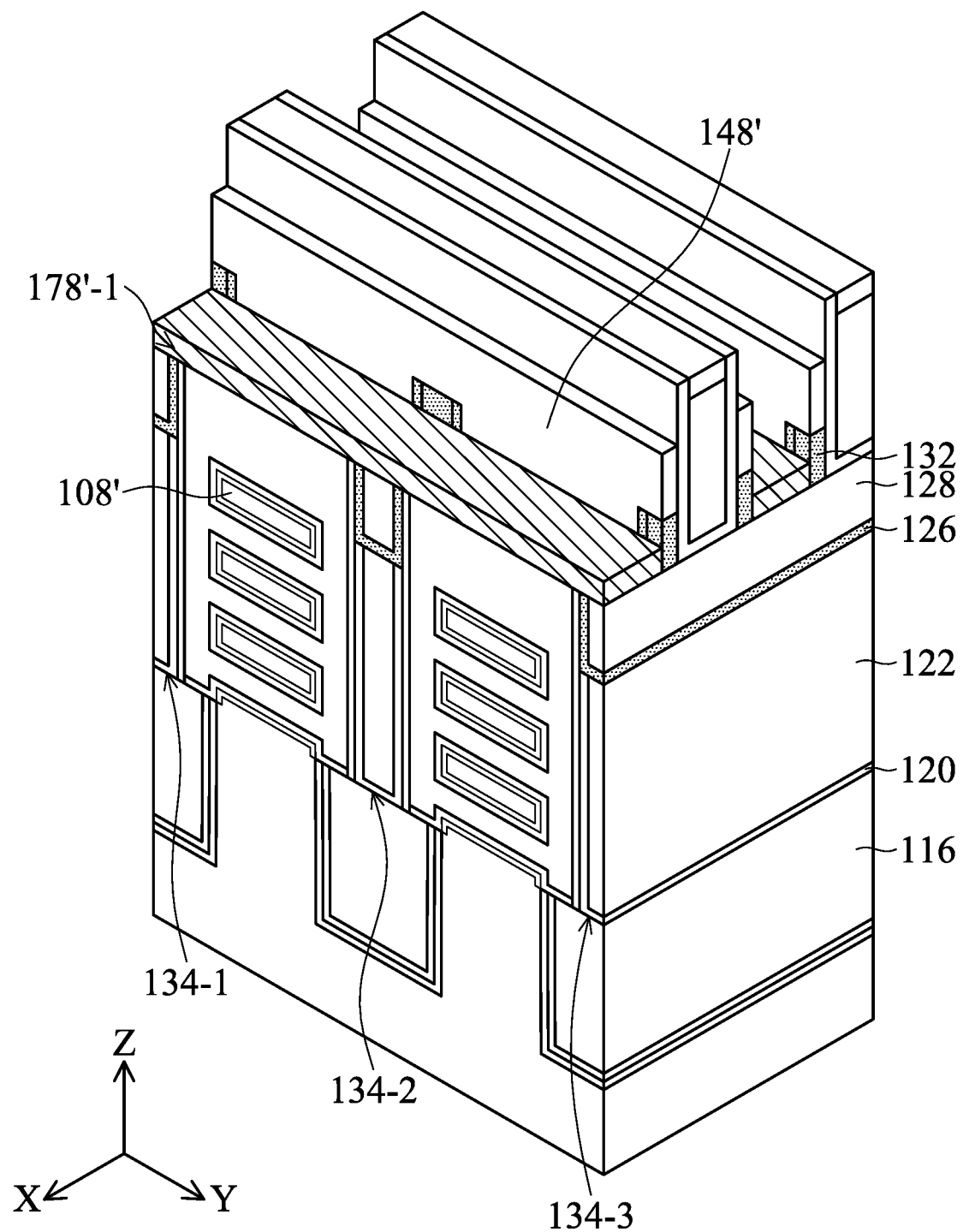
Figure 2X:
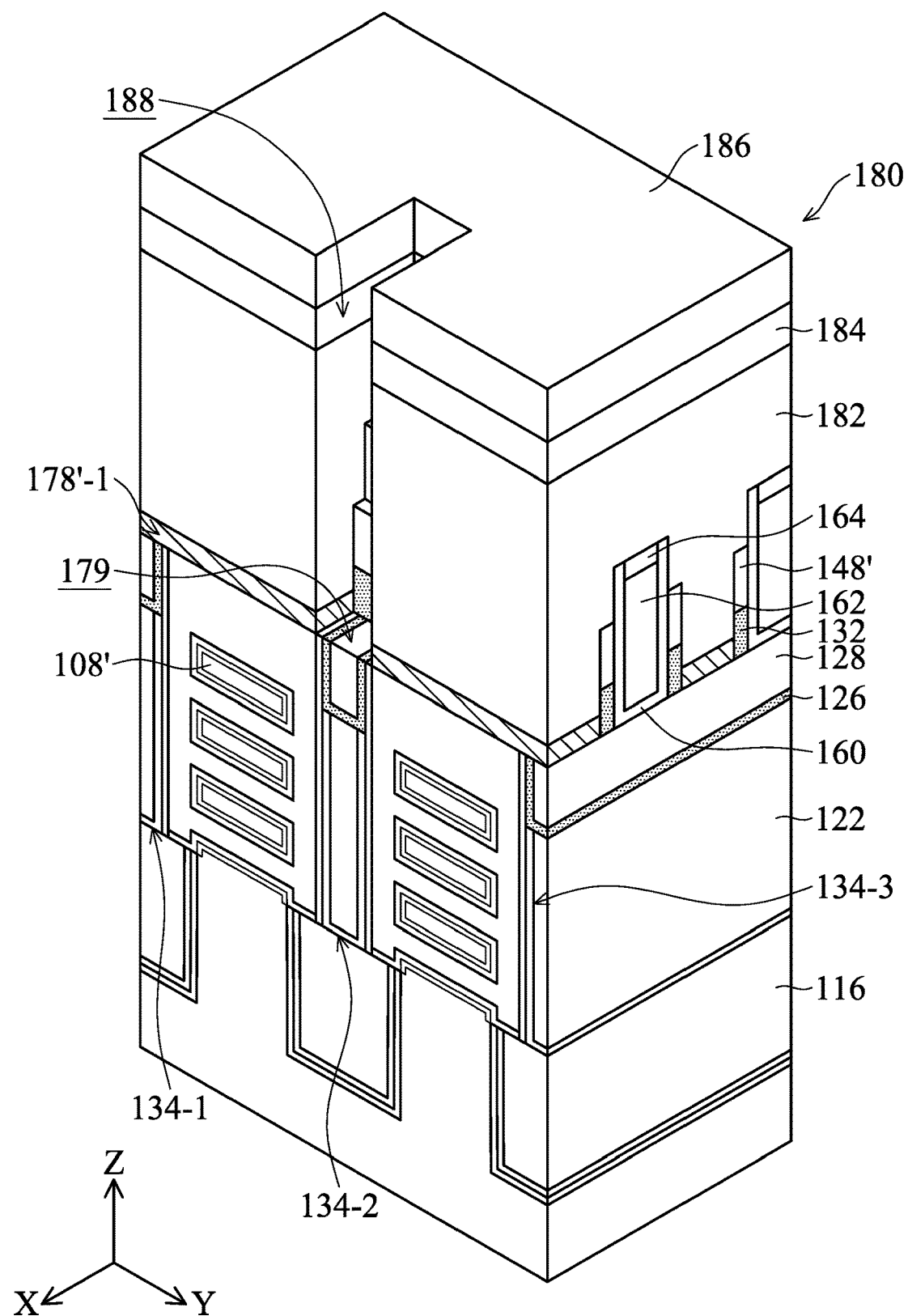
Figure 2Y:
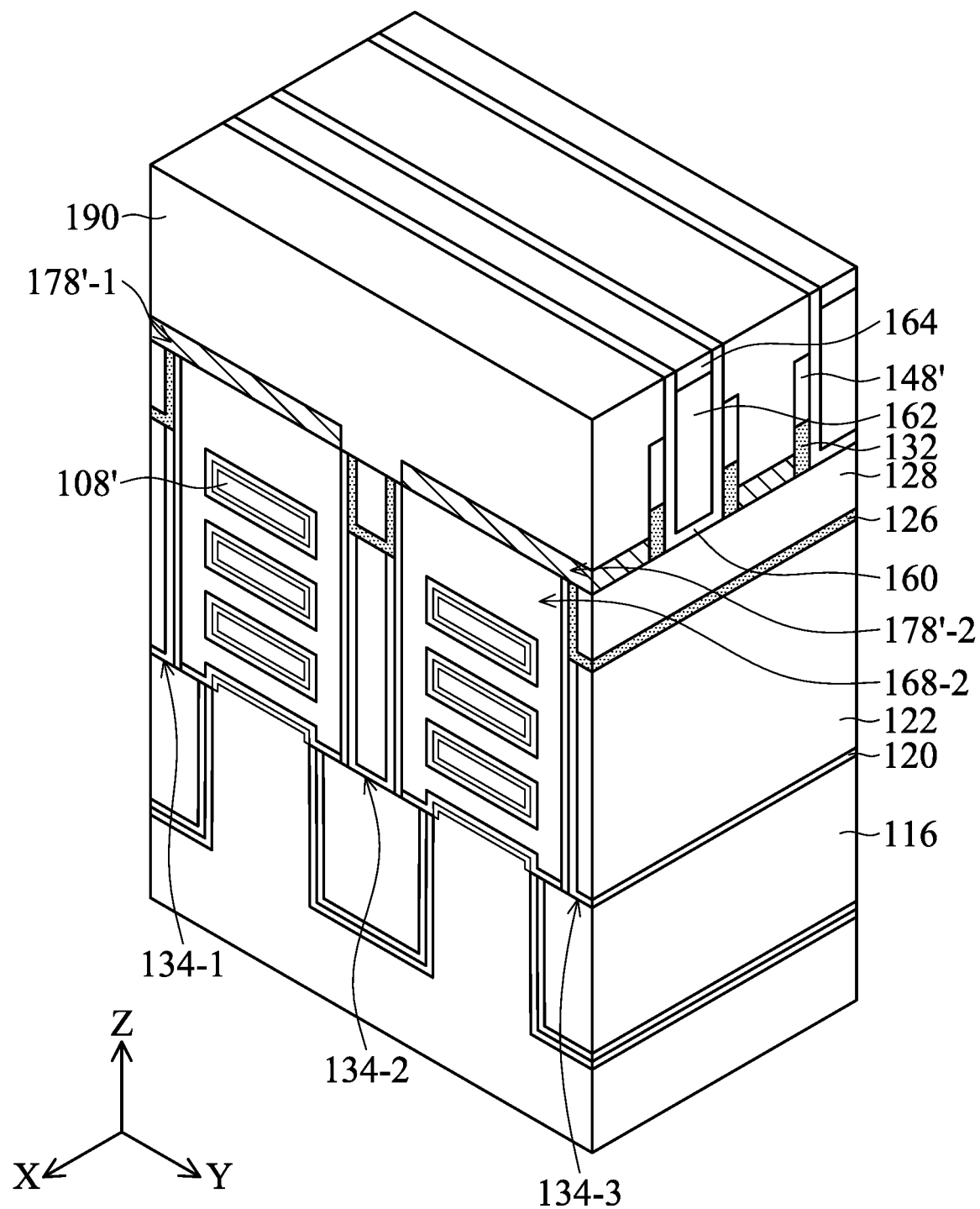
Figure 2Z:
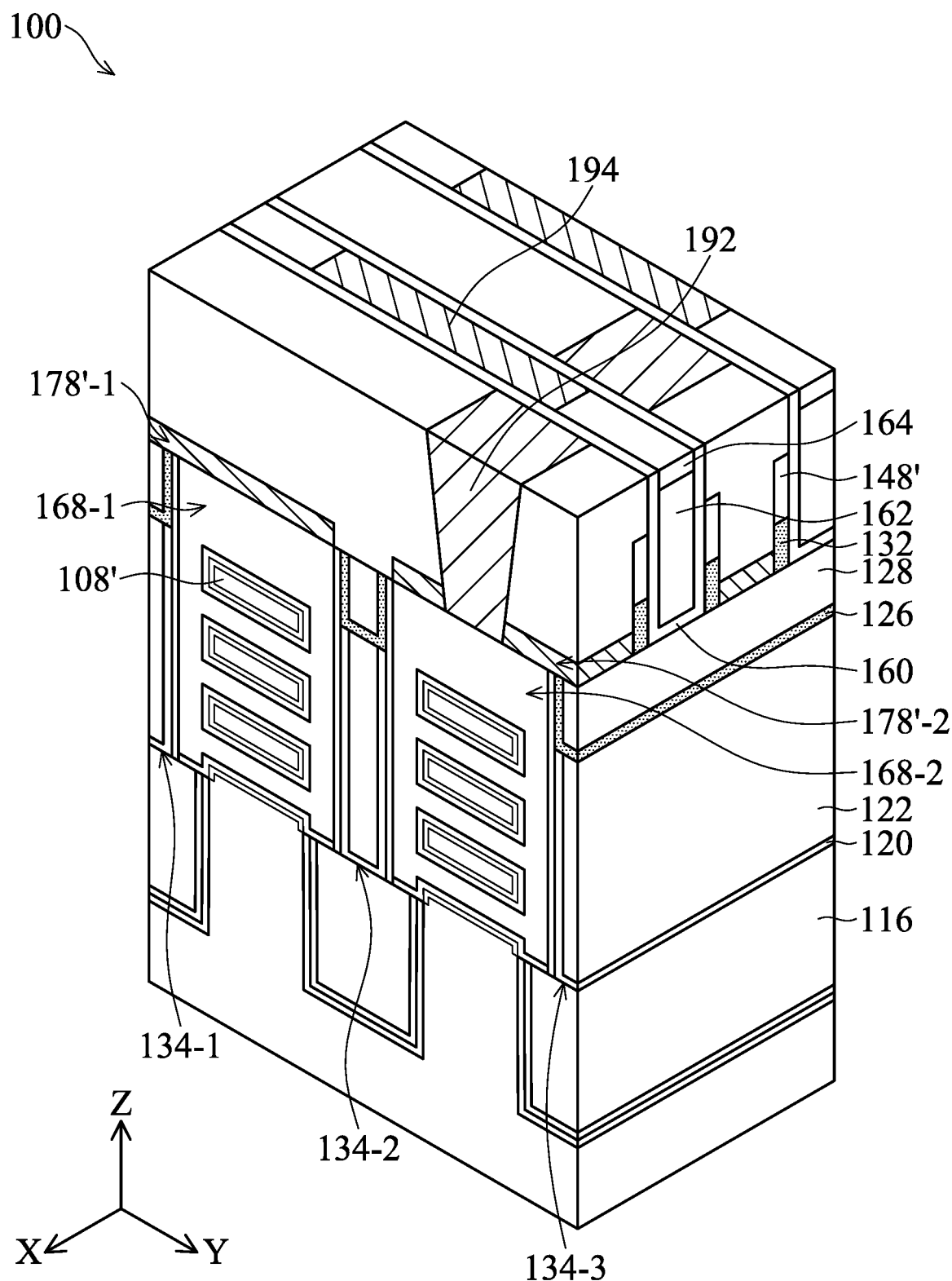

FIGS. 2A to 2Z illustrate diagrammatic perspective views of intermediate stages of manufacturing the semiconductor structure 100 in accordance with some embodiments. More specifically, FIGS. 2A to 2R illustrate diagrammatic perspective views of intermediate stages of manufacturing the semiconductor structure 100 shown in the dotted line block $C_1$ of FIG. 1, and FIGS. 2S to 2Z illustrate diagrammatic perspective views of intermediate stages of manufacturing the semiconductor structure 100 shown in the dotted line block $C_2$ of FIG. 1 in accordance with some embodiments.

First, a semiconductor stack including first semiconductor material layers 106 and second semiconductor material layers 108 are formed over a substrate 102, as shown in FIG. 2A in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102 to form the semiconductor stack. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although three first semiconductor material layers 106 and three second semiconductor material layers 108 are shown in FIG. 2A, the semiconductor structure may include more or fewer first semiconductor material layers 106 and second semiconductor material layers 108. For example, the semiconductor structure may include two to five of the first semiconductor material layers 106 and two to five of the second semiconductor material layers 108.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

After the first semiconductor material layers 106 and the second semiconductor material layers 108 are formed as the semiconductor material stack over the substrate 102, the semiconductor material stack is patterned to form fin structures 104-1 and 104-2, as shown in FIG. 2B in accordance with some embodiments. In addition, the fin structures 104-1 and 104-2 extend along the X-direction as shown in FIG. 2B in accordance with some embodiments. In some embodiments, the fin structures 104-1 and 104-2 include base fin structures 105 and the semiconductor material stacks, including the first semiconductor material layers 106 and the second semiconductor material layers 108, formed over the base fin structure 105.

In some embodiments, the patterning process includes forming mask structures 110 over the semiconductor material stack, and etching the semiconductor material stack and the underlying substrate 102 through the mask structure 110. In some embodiments, the mask structures 110 are a multilayer structure including a pad oxide layer 112 and a nitride layer 114 formed over the pad oxide layer 112. The pad oxide layer 112 may be made of silicon oxide, which may be formed by thermal oxidation or CVD, and the nitride layer 114 may be made of silicon nitride, which may be formed by CVD, such as LPCVD or plasma-enhanced CVD (PECVD).

After the fin structures 104-1 and 104-2 are formed, layers such as liner 115 and a liner 117 are formed to cover the fin structures 104-1 and 104-2, as shown in FIG. 2C in accordance with some embodiments. In some embodiments, the liners 115 and 117 are made of different dielectric materials. In some embodiments, the liner 115 is made of oxide and the liner 117 is made of nitride. In some embodiments, the liner 115 is omitted.

Next, an insulating layer 119 is formed around the fin structures 104-1 and 104-2 over the liner 117, as shown in FIG. 2D in accordance with some embodiments. In some embodiments, the insulating layer 119 is made of silicon oxide, silicon nitride, silicon oxynitride (SiON), another suitable insulating material, or a combination thereof.

Afterwards, the insulating layer 119 and the liners 115 and 117 are recessed to form the isolation structure 116, as shown in FIG. 2E in accordance with some embodiments. The isolation structure 116 is configured to electrically isolate active regions (e.g. the fin structures 104-1 and 104-2) of the semiconductor structure and is also referred to as shallow trench isolation (STI) feature in accordance with some embodiments.

After the isolation structure 116 is formed, cladding layers 118 are formed over the top surfaces and the sidewalls of the fin structures 104-1 and 104-2 over the isolation structure 116, as shown in FIG. 2F in accordance with some embodiments. In some embodiments, the cladding layers 118 are made of semiconductor materials. In some embodiments, the cladding layers 118 are made of silicon germanium (SiGe). In some embodiments, the cladding layers 118 and the first semiconductor material layers 106 are made of the same semiconductor material.

The cladding layer 118 may be formed by performing an epitaxy process, such as VPE and/or UHV CVD, molecular beam epitaxy, other applicable epitaxial growth processes, or combinations thereof. After the cladding layers 118 are deposited, an etching process may be performed to remove the portion of the cladding layer 118 not formed on the sidewalls of the fin structures 104-1 and 104-2, for example, using a plasma dry etching process. In some embodiments, the portions of the cladding layers 118 formed on the top surface of the fin structures 104-1 and 104-2 are partially or completely removed by the etching process, such that the thickness of the cladding layer 118 over the top surface of the fin structures 104-1 and 104-2 is thinner than the thickness of the cladding layer 118 on the sidewalls of the fin structures 104-1 and 104-2.

Before the cladding layers 118 are formed, a semiconductor liner (not shown) may be formed over the fin structures 104-1 and 104-2. The semiconductor liner may be a Si layer and may be incorporated into the cladding layers 118 during the epitaxial growth process for forming the cladding layers 118.

Next, a liner layer 120 is formed over the cladding layers 118 and the isolation structure 116, as shown in FIG. 2G in accordance with some embodiments. In some embodiments, the liner layer 120 is made of a low k dielectric material having a k value lower than 7. In some embodiments, the liner layer 120 is made of SiN, SiCN, SiOCN, SiON, or the like. The liner layer 120 may be deposited using CVD, PVD, ALD, HDPCVD, MOCVD, RPCVD, PECVD, LPCVD, ALCVD, APCVD, other applicable methods, or combinations thereof. In some embodiments, the liner layer 120 has a thickness in a range from about 2 nm to about 8 nm.

After the liner layer 120 is formed, a filling layer 122 is formed over the liner layer 120 to completely fill the spaces between the adjacent fin structures 104-1 and 104-2, and a polishing process is performed until the top surfaces of the cladding layers 118 are exposed, as shown in FIG. 2H in accordance with some embodiments.

In some embodiments, the filling layer 122 and the liner layer 120 are both made of oxide but are formed by different methods. In some embodiments, the filling layer 122 is made of SiN, SiCN, SiOCN, SiON, or the like. The filling layer 122 may be deposited using a flowable CVD (FCVD) process that includes, for example, depositing a flowable material (such as a liquid compound) and converting the flowable material to a solid material by a suitable technique, such as thermal annealing and/or ultraviolet radiation treating.

Next, recesses 124 are formed between the fin structures 104-1 and 104-2, as shown in FIG. 2I in accordance with some embodiments. In some embodiments, the filling layer 122 and the liner layer 120 are recessed by performing an etching process. In some embodiments, the filling layer 122 are formed using a flowable CVD process, so that the resulting filling layer 122 can have a relatively flat top surface after the etching process is performed.

Afterwards, a shell layer 126 and a core portion 128 are formed in the recesses 124, as shown in FIG. 2J in accordance with some embodiments. In some embodiments, the shell layer 126 is formed on the bottom surfaces and the sidewalls of the recesses 124, and the core portion 128 is formed over and surrounded by the shell layer 126. In some embodiments, the bottom surface and the sidewalls of the core portion 128 are covered by the shell layer 126. In some embodiments, the shell layer 126 has a height $H_1$ in a range from about 25 nm to about 50 nm. In some embodiments, the thickness of the shell layer 126 is in a range from about 1 nm to about 6 nm. The thickness of the shell layer 126 may be controlled to be thick enough to protect the core portion 128 and the bottom portions in subsequent etching processes, so the source/drain structures formed afterwards can be separated properly without merging. On the other hand, the shell layer 126 can not be too thick, or the capacitance of the resulting device may be increased.

In some embodiments, the shell layer 126 and the core portion 128 are made of different materials, and the material for forming the shell layer 126 has a higher dielectric constant than the material for forming the core portion 128. The core portion 128 may help to reduce the k value of the structure and may have a denser structure (fewer voids). In some embodiments, an annealing process is performed to remove the voids formed in the core portion 128.

In some embodiments, the shell layer 126 is made of a high k dielectric material, and the core portion 128 is made of a low k dielectric material. In some embodiments, the shell layer 126 is made of a dielectric material having a k value greater than 7, and the core portion 128 is made of a dielectric material having a k value less than 7. In some embodiments, the shell layer 126 is made of $HfO_2$, $ZrO_2$, $HfAlO_x$, $HfSiO_x$, $Al_2O_3$, or the like. In some embodiments, the core portion 128 is made of $SiO_2$, SiN, SiCN, SiOC, SiOCN, or the like. In some embodiments, the core portion 128 and the liner layer 120 are made of the same dielectric material. In some embodiments, the core portion 128 has a thickness in a range of about 8 nm to about 30 nm.

The dielectric materials for forming the shell layer 126 and the core portion 128 may be formed by performing ALD, CVD, PVD, oxidation-based deposition process, other suitable process, or combinations thereof. After the core portion 128 is formed, a CMP process is performed until the mask structures 110 are exposed in accordance with some embodiments.

After the CMP process is performed, the top portions of the core portion 128 are removed to form recesses 130, as shown in FIG. 2K in accordance with some embodiments. In some embodiments, the core portions 128 are etched to form the recesses 130, while the shell layers 126 are not etched or are only slightly etched.

Afterwards, a cap layer 132 is formed in the recesses 130, thereby forming dielectric features 134, as shown in FIG. 2L in accordance with some embodiments. In some embodiments, the dielectric features 134 include dielectric features 134-1, 134-2, and 134-3 at opposite sides of the fin structures 104-1 and 104-2. In some embodiments, the cap layer 132 and the shell layer 126 are made of the same dielectric material. In some embodiments, the cap layer 132 is made of a high k dielectric material, such as $HfO_2$, $ZrO_2$, $HfAlO_x$, $HfSiO_x$, $Al_2O_3$, or the like. The dielectric materials for forming the cap layer 132 may be formed by performing ALD, CVD, PVD, oxidation-based deposition process, other suitable process, or combinations thereof. After the cap layers 132 are formed, a CMP process is performed until the mask structures 110 are exposed in accordance with some embodiments.

In some embodiments, the dielectric feature 134 includes a bottom portion 134B and a top portion 134T over the bottom portion 134B. The bottom portion 134B includes the liner layer 120 and the filling layer 122, and the top portion 134T includes the shell layer 126, the core portion 128, and the cap layer 132 in accordance with some embodiments. The cap layers 132 may be configured to protect the dielectric features during the subsequent etching processes. In some embodiments, the cap layer 132 has a height $H_2$ in a range of about 5 nm to about 20 nm. The cap layers 132 should be thick enough to protect the dielectric features 134 during the subsequent etching processes, so that the dielectric features may be used to separate the adjacent source/drain structures formed afterwards.

Since the dielectric features 134 are self-aligned to the spaces between the fin structures 104-1 and 104-2, complicated alignment processes are not required when forming the dielectric features 134. In addition, the width of the dielectric features 134 may be determined by the widths of the spaces between the fin structures 104-1 and 104-2 and the thicknesses of the cladding layer 118. In some embodiments, the dielectric features 134 have substantially the same width. Meanwhile, in some embodiments, the spaces between the fin structures 104-1 and 104-2 have different widths, and the dielectric features 134 also have different widths. As shown in FIG. 1, the dielectric features 134 are formed between the fin structures 104-1 and 104-2 and are substantially parallel to the fin structures 104-1 and 104-2 in accordance with some embodiments.

Next, the mask structures 110 over the fin structures 104-1 and 104-2 and the top portions of the cladding layers 118 are removed to expose the top surfaces of the topmost second semiconductor material layers 108, as shown in FIG. 2M in accordance with some embodiments. In some embodiments, the top surfaces of the cladding layers 118 are substantially level with the top surfaces of the topmost second semiconductor material layers 108.

The mask structures 110 and the cladding layers 118 may be recessed by performing one or more etching processes that have higher etching rate to the mask structures 110 and the cladding layers 118 than the dielectric features 134, such that the dielectric features 134 are only slightly etched during the etching processes. The selective etching processes can be dry etching, wet etching, reactive ion etching, or other applicable etching methods.

Afterwards, dummy gate structures 136 are formed across the fin structure 104-1 and 104-2 and the dielectric features 134, as shown in FIG. 2N in accordance with some embodiments. The dummy gate structures 136 may be used to define the source/drain regions and the channel regions of the resulting semiconductor structure 100.

In some embodiments, the dummy gate structure 136 includes a dummy gate dielectric layer 138 and a dummy gate electrode layer 140. In some embodiments, the dummy gate dielectric layer 138 is made of one or more dielectric materials, such as silicon oxide, silicon nitride, silicon oxynitride (SiON), HfO$_2$, HfZrO, HfSiO, HfTiO, HfAlO, or a combination thereof. In some embodiments, the dummy gate dielectric layer 140 is formed using thermal oxidation, CVD, ALD, physical vapor deposition (PVD), another suitable method, or a combination thereof.

In some embodiments, the dummy gate electrode layer 140 is made of conductive material including polycrystalline-silicon (poly-Si), poly-crystalline silicon-germanium (poly-SiGe), or a combination thereof. In some embodiments, the dummy gate electrode layer 140 is formed using CVD, PVD, or a combination thereof.

In some embodiments, hard mask layers 142 are formed over the dummy gate structures 136. In some embodiments, the hard mask layers 142 include multiple layers, such as an oxide layer 144 and a nitride layer 146. In some embodiments, the oxide layer 144 is silicon oxide, and the nitride layer 146 is silicon nitride.

The formation of the dummy gate structures 136 may include conformally forming a dielectric material as the dummy gate dielectric layers 138. Afterwards, a conductive material may be formed over the dielectric material as the dummy gate electrode layers 140, and the hard mask layer 142 may be formed over the conductive material. Next, the dielectric material and the conductive material may be patterned through the hard mask layer 142 to form the dummy gate structures 136.

After the dummy gate structures 136 are formed, gate spacers 148 are formed along and covering opposite sidewalls of the dummy gate structure 136, as shown in FIG. 2O in accordance with some embodiments. In some embodiments, the gate spacers 148 also cover some portions of the top surfaces and the sidewalls of the dielectric features 134.

The gate spacers 148 may be configured to separate source/drain structures (formed afterwards) from the dummy gate structure 136. In some embodiments, the gate spacers 148 are made of a dielectric material, such as silicon oxide (SiO$_2$), silicon nitride (SiN), silicon carbide (SiC), silicon oxynitride (SiON), silicon carbon nitride (SiCN), silicon oxide carbonitride (SiOCN), and/or a combination thereof.

After the gate spacers 148 are formed, source/drain recesses 150 are formed adjacent to the gate spacers 148, as shown in FIG. 2O in accordance with some embodiments. More specifically, the fin structures 104-1 and 104-2 and the cladding layers 118 not covered by the dummy gate structures 136 and the gate spacers 148 are recessed in accordance with some embodiments. In addition, the top portions 134T of the dielectric features 134 are also recessed to have recessed portions 134T_R at the source/drain regions in accordance with some embodiments. In some embodiments, the cap layers 132 are completely removed. In some embodiments, the top portions of the shell layer 126 and the core portions 128 are also partially removed to form the recessed portions 134T_R at the source/drain regions.

In some embodiments, the fin structures 104-1 and 104-2 and the cladding layers 118 are recessed by performing an etching process. The etching process may be an anisotropic etching process, such as dry plasma etching, and the dummy gate structure 136 and the gate spacers 148 may be used as etching masks during the etching process.

After the source/drain recesses 150 are formed, the first semiconductor material layers 106 and the cladding layers 118 exposed by the source/drain recesses 150 are laterally recessed to form notches 154, as shown in FIG. 2P in accordance with some embodiments.

In some embodiments, an etching process is performed to laterally recess the first semiconductor material layers 106 of the fin structure 104-1 and 104-2 and the cladding layers 118 from the source/drain recesses 150. In some embodiments, during the etching process, the first semiconductor material layers 106 and the cladding layers 118 have a greater etching rate (or etching amount) than the second semiconductor material layers 108, thereby forming notches 154 between the adjacent second semiconductor material layers 108 and around the second semiconductor material layers 108. In some embodiments, the etching process is an isotropic etching such as dry chemical etching, remote plasma etching, wet chemical etching, another suitable technique, and/or a combination thereof.

Next, inner spacers 156 are formed in the notches 154 between and around the second semiconductor material layers 108, as shown in FIG. 2Q in accordance with some embodiments. The inner spacers 156 may be configured to separate the source/drain structures and the gate structures formed in subsequent manufacturing processes. In some embodiments, the inner spacers 156 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof.

After the inner spacers 156 are formed, source/drain structures 158 are formed in the source/drain recesses 150, as shown in FIG. 2R in accordance with some embodiments. In some embodiments, the source/drain structures 158 are separated by the dielectric features 134-1, 134-2, and 134-3. More specifically, the source/drain structures 158 are formed in the spaces the dielectric features 134-1, 134-2, and 134-3 at the source/drain region. In addition, the source/drain structures 158 are in direct contact with the liner layer 120 at the bottom portion 134B of the dielectric features 134-1, 134-2, and 134-3 in accordance with some embodiments. In some embodiments, air gaps are formed under the source/drain structures 158. In some embodiments, the air gaps are encircled by the source/drain structures 158, the dielectric features 134-1, 134-2, or 134-3, and the isolation structure 116. In some embodiments, the top surfaces of the recessed portions 134T_R of the top portions 134T of the dielectric features 134-1, 134-2, and 134-3 are higher than the top surfaces of the source/drain structures 158.

In some embodiments, the source/drain structures 158 are formed using an epitaxial growth process, such as MBE, MOCVD, VPE, other applicable epitaxial growth process, or a combination thereof. In some embodiments, the source/drain structures 158 are made of any applicable material, such as Ge, Si, GaAs, AlGaAs, SiGe, GaAsP, SiP, SiC, SiCP, or a combination thereof. In some embodiments, the source/drain structures 158 are in-situ doped during the epitaxial growth process. For example, the source/drain structures 158 may be the epitaxially grown SiGe doped with boron (B). For example, the source/drain structures 158 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the source/drain structures 158 are doped in one or more implantation processes after the epitaxial growth process.

After the source/drain structures 158 are formed, a contact etch stop layer (CESL) 160 is conformally formed to cover the source/drain structures 158 and an interlayer dielectric (ILD) layer 162 is formed over the contact etch stop layers 160, as shown in FIG. 2R in accordance with some embodiments.

In some embodiments, the contact etch stop layer 160 is made of a dielectric materials, such as silicon nitride, silicon oxide, silicon oxynitride, another suitable dielectric material, or a combination thereof. The dielectric material for the contact etch stop layers 160 may be conformally deposited over the semiconductor structure by performing CVD, ALD, other application methods, or a combination thereof.

The interlayer dielectric layer 162 may include multilayers made of multiple dielectric materials, such as silicon oxide, silicon nitride, silicon oxynitride, phosphosilicate glass (PSG), borophosphosilicate glass (BPSG), or other applicable low-k dielectric materials. The interlayer dielectric layer 162 may be formed by chemical vapor deposition (CVD), physical vapor deposition, (PVD), atomic layer deposition (ALD), or other applicable processes.

After the contact etch stop layer 160 and the interlayer dielectric layer 162 are deposited, a planarization process such as CMP or an etch-back process is performed until the dummy gate electrode layers 140 of the dummy gate structures 136 are exposed, and protection layers 164 are formed over the interlayer dielectric layer 162, as shown in FIG. 2R in accordance with some embodiments. More specifically, after the planarization process is performed, the interlayer dielectric layer 162 is recessed to a level below the top surface of the dummy gate electrode layer 140 and the protection layers 164 are deposited over the interlayer dielectric layer 162 to protect the interlayer dielectric layer 162 from subsequent etching processes. In some embodiments, the protection layers 164 are made of a material that is the same as, or similar to, that in the contact etch stop layer 160. In some embodiments, the protection layers 164 are made of $Si_3N_4$, SiCN, SiOCN, SiOC, a metal oxide such as $HfO_2$, $ZrO_2$, hafnium aluminum oxide, and hafnium silicate, or other applicable material. The protection layers 164 may be formed by CVD, PVD, ALD, or other applicable methods.

FIGS. 2S to 2Z illustrate diagrammatic perspective views of intermediate stages of manufacturing the semiconductor structure 100 shown in the dotted line block $C_2$ of FIG. 1 in accordance with some embodiments. After the interlayer dielectric layer 162 and the protection layers 164 are formed, the dummy gate structures 136, the cladding layers 118, and the first semiconductor material layers 106 are removed to form gate trenches 166, as shown in FIG. 2S in accordance with some embodiments. More specifically, the dummy gate structures 136, the cladding layers 118, and the first semiconductor material layers 106 are removed to form nanostructures 108' with the second semiconductor material layers 108 in accordance with some embodiments. The removal process may include one or more etching processes. For example, when the dummy gate electrode layers 140 are polysilicon, a wet etchant such as a tetramethylammonium hydroxide (TMAH) solution may be used to selectively remove the dummy gate electrode layers 140. Afterwards, the dummy gate dielectric layers 138 may be removed using a plasma dry etching, a dry chemical etching, and/or a wet etching. The first semiconductor material layers 106 and the cladding layers 118 may be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions.

In some embodiments, the top portions of the gate spacers 148 are also removed (e.g. etched) to form shortened gate spacers 148', so that the top portions of the gate trenches 166 may be enlarged and the gate structure can be formed in the gate trenches more easily afterwards.

Next, gate structures 168 are formed wrapping around the nanostructures 108', as shown in FIG. 2T in accordance with some embodiments. The gate structures 168 wrap around the nanostructures 108' to form gate-all-around transistor structures in accordance with some embodiments. In some embodiments, the gate structure 168 include an interfacial layer 170, a gate dielectric layer 172, and a gate electrode layer 174.

In some embodiments, the interfacial layer 170 is an oxide layer formed around the nanostructures 108' and on the exposed portions of the base fin structures 105. In some embodiments, the interfacial layer 170 is formed by performing a thermal process.

In some embodiments, the gate dielectric layer 172 is formed over the interfacial layer 170, so that the nanostructures 108' are surrounded (e.g. wrapped) by the gate dielectric layer 172. In addition, the gate dielectric layer 172 also covers the sidewalls of the gate spacers 148', the inner spacers 156, and the dielectric features 134-1, 134-2, and 134-3 in accordance with some embodiments. In some embodiments, the gate dielectric layers 172 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other applicable high-k dielectric materials, or a combination thereof. In some embodiments, the gate dielectric layers 172 are formed using CVD, ALD, other applicable methods, or a combination thereof.

In some embodiments, the gate electrode layers 174 are formed on the gate dielectric layers 172. In some embodiments, the gate electrode layers 174 are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layers 174 are formed using CVD, ALD, electroplating, another applicable method, or a combination thereof. Other conductive layers, such as work function metal layers, may also be formed in the gate structures 168, although they are not shown in the figures. After the interfacial layers 170, the gate dielectric layers 172, and the gate electrode layers 174 are formed, a planarization process such as CMP or an etch-back process may be performed until the protection layers 164 are exposed.

After the gate structures 168 are formed, an etch back process is performed to remove the top portions of the gate structures 168 and the cap layers 132 of the top portions 134T of the dielectric features 134 at the channel region, as shown in FIG. 2U in accordance with some embodiments. More specifically, the top portions of the gate structures 168 and the cap layers 132 of the dielectric features 134 are removed to form recesses 176 between the gate spacers 148' in accordance with some embodiments. In some embodiments, the top surfaces of the gate structures 168 are substantially level with the top surfaces of the dielectric features 134 at the channel regions. Accordingly, the gate structure 168 is divided into portions 168-1 and 168-2 by the dielectric features 134, as shown in FIG. 2U in accordance with some embodiments. In some embodiments, after the etching back process, the shell layer 126 at the channel region has a height in a range from about 6 nm to about 15 nm. In some embodiments, after the etching back process, the core portion 128 at the channel region has a height in a range from about 5 nm to about 15 nm.

Afterwards, a metal layer 178 is conformally formed over the bottom surfaces and the sidewalls of the recesses 176, as shown in FIG. 2V in accordance with some embodiments. More specifically, the metal layer 178 covers the top surface of the gate structures 168, the top surface of the dielectric features 134-1, 134-2, and 134-3 at the channel region and the sidewall of the dielectric features 134-1, 134-2, and 134-3 that are located under the gate spacers 148', the top surfaces of the protection layers 164, and the sidewalls of the CESL 160 in accordance with some embodiments. In some embodiments, the metal layer 178 is made of Ru, W, TiN, TaN, Co, Ti, TiAl, or the like. In some embodiments, the metal layer 178 includes two metal-containing material layers, such as the bottom layer (e.g. a TiN layer) and the main layer (e.g. a W layer) formed over the bottom layer. In some embodiments, the bottom layer is thinner than about 2 nm.

Next, the metal layer 178 formed on the sidewalls of the gate spacers 148', the sidewalls of the CESL 160, and the top surfaces of the protection layers 164 are removed to form a patterned metal layer 178' on the gate structure 168, as shown in FIG. 2W in accordance with some embodiments. In some embodiments, a wet etching process is performed to partially remove the metal layer 178'.

The metal layers 178' may be configured to electrically connect various portions of the gate structures 168 divided by the dielectric features 134-1, 134-2, and 134-3. In some embodiments, the metal layer 178' has a thickness in a range from about 2 nm to about 10 nm, such as about 2 nm to about 6 nm. The metal layers 178' should be thick enough or they may be broken in subsequent manufacturing processes and the connection between different portions of the gate structures 168 may be affected. On the other hand, the metal layers 178' should not be too thick or the capacitance of the resulting device may be increased and the speed of the resulting device may be reduced.

After the metal layers 178' are formed, a photoresist structure 180 is formed to pattern the metal layers 178', as shown in FIG. 2X in accordance with some embodiments. In some embodiments, the photoresist structure 180 includes a bottom layer 182, a middle layer 184, and a top photoresist layer 186. As the limits of photolithography processes may be reached by advanced semiconductor manufacturing processes, the need for thinner top photoresist layers has arisen to achieve smaller process windows. However, thin top photoresist layers may tend to be removed during the etching process. Therefore, the middle layer 184 and the bottom layer 182 are formed below the top photoresist layer 186 for more robust etching support, so that the patterning of the underneath metal layer 178' may be performed while still providing a relatively thin top photoresist layer 186.

In some embodiments, the middle layer 184 includes anti-reflective materials (e.g., a backside anti-reflective coating (BARC) layer) to aid in exposure and focus during the processing of the top photoresist layer 186. In some embodiments, the bottom layer 182 includes a hard mask material such as a nitride (e.g., silicon nitride, silicon oxynitride, or the like), a polymer, an amorphous material film (e.g., amorphous carbon film or amorphous silicon film), polysilicon, or any other material that may be patterned and selectively removed.

An opening 188 is formed in the photoresist structure 180, and the metal layer 178' is patterned through the opening 188, as shown in FIG. 2X in accordance with some embodiments. More specifically, an opening 179 is formed in the metal layer 178', and the top surface of the dielectric feature 134-2 is exposed by the opening 179 in accordance with some embodiments.

After the metal layer 178' is patterned to form the opening 179, the photoresist structure 180 is removed, as shown in FIG. 2Y in accordance with some embodiments. More specifically, the metal layer 178' now includes portions 178'-1 and 178'-2 separated from each other by the opening 179 in accordance with some embodiments. In some embodiments, the portion 178'-1 covers the portion 168-1 of the gate structure 168 and the portion 178'-2 covers the portions 168-2 of the gate structure 168.

Next, a dielectric layer 190 is formed over the metal layer 178' and extends into the opening 179, as shown in FIG. 2Y in accordance with some embodiments. Since the opening 179 is filled with the dielectric layer 190, the portion 178'-1 and the portion 178'-2 of the metal layer 178' are separated by the dielectric layer 190 in accordance with some embodiments.

The dielectric layer 190 may include multilayers made of multiple dielectric materials, such as $Al_2O_3$, $ZrO_2$, silicon oxide, silicon nitride, silicon oxynitride, phosphosilicate glass (PSG), borophosphosilicate glass (BPSG), or other applicable dielectric materials. The dielectric layer 190 may be formed by chemical vapor deposition (CVD), physical vapor deposition, (PVD), atomic layer deposition (ALD), or other applicable processes.

After the dielectric layer 190 is formed, a conductive structure 192 is formed through the dielectric layer 190 and the portion 178'-2 of the metal layer 178' and lands on the portion 168-2 of the gate structure 168, and a source/drain contact 194 is formed through the interlayer dielectric layer 162 and the protection layer 164 and lands on the source/drain structure 158, as shown in FIG. 2Z in accordance with some embodiments. In some embodiments, a silicide layer 196 (not shown in FIG. 2Z, see FIG. 3B) is formed over the source/drain structure 158 before the source/drain contact 194 is formed.

More specifically, the conductive structure 192 and the source/drain contact 194 may be formed in separated processed. For example, a trench may be formed through the interlayer dielectric layer 162 and the protection layer 164 to expose the source/drain structure 158 by performing an etching process. In some embodiments, the source/drain structure 158 exposed by the trench is partially etched, so that the source/drain contact 194 formed afterwards can have a greater contact surface with the source/drain structure 158. In some embodiments, the dielectric feature 134-2 exposed by the trench is also partially etched.

Next, the silicide layer 196 may be formed by forming a metal layer over the top surface of the source/drain structure 158 and annealing the metal layer so the metal layer reacts with the source/drain structure 158 to form the silicide layer 196. The unreacted metal layer may be removed after the silicide layer 196 is formed. Afterwards, a conductive material may be formed in the trench to form the source/drain contact 194. The conductive material may include aluminum (Al), copper (Cu), tungsten (W), titanium (Ti), tantalum (Ta), titanium nitride (TiN), cobalt, tantalum nitride (TaN), nickel silicide (NiSi), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof. The conductive material may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

Similarly, the conductive structure 192 may be formed by forming a trench exposing the metal layer 178' and forming a conductive material. In some embodiments, the conductive structure 192 and the source/drain contact 194 are made of the same conductive material. In some embodiments, the conductive structure 192 and the source/drain contact 194 are formed by the same deposition process.

Liners and/or barrier layers (not shown) may be formed before forming the conductive materials of the conductive structure 192 and the source/drain contact 194. The liners may be made of silicon nitride, although any other applicable dielectric may be used as an alternative. The barrier layer may be made of tantalum nitride, although other materials, such as tantalum, titanium, titanium nitride, or the like, may also be used.

Figure 3A:
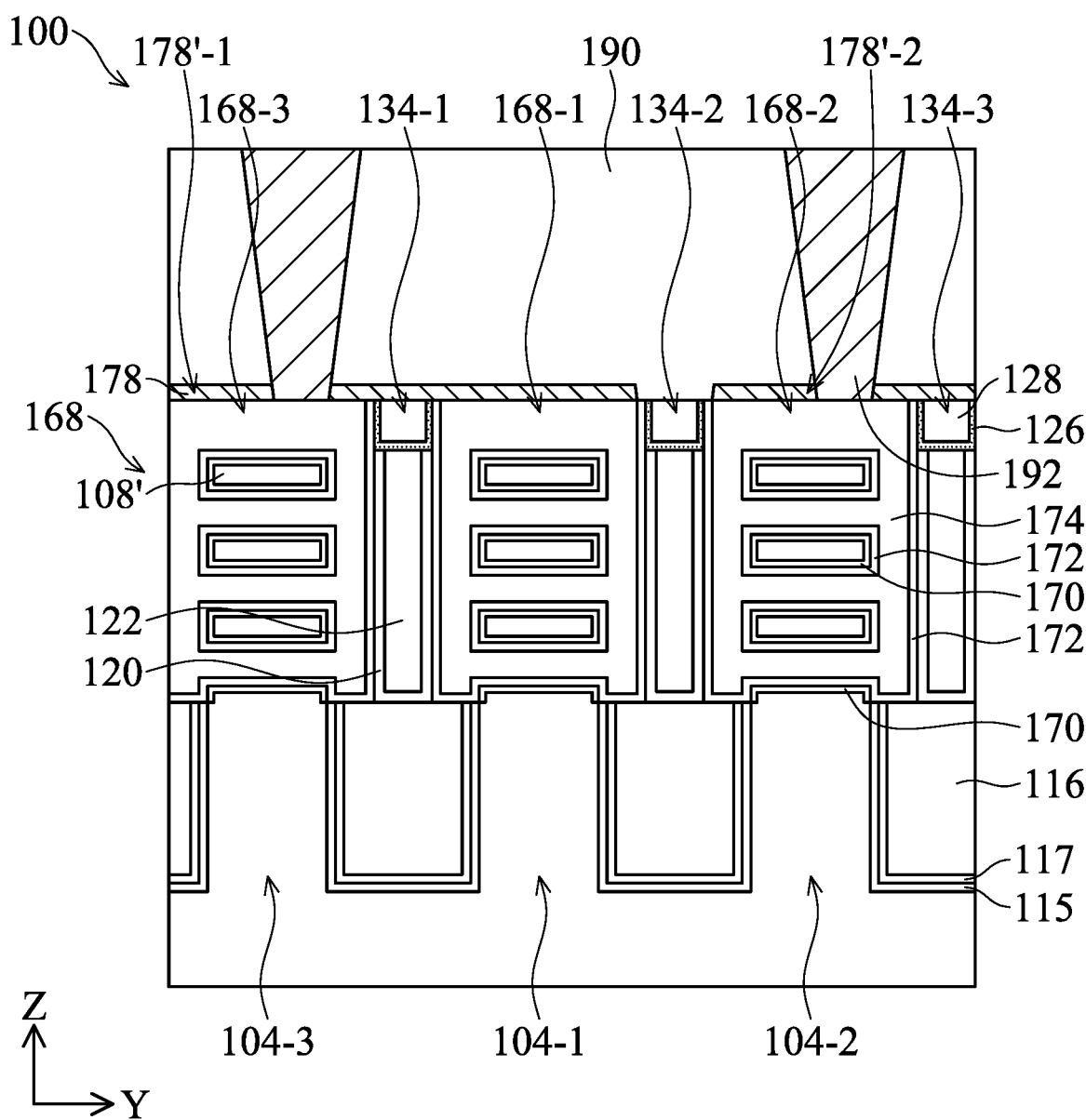
FIG. 3A illustrates a cross-sectional view of the semiconductor structure shown along line A-A' in FIG. 1 in accordance with some embodiments.
Figure 3B:
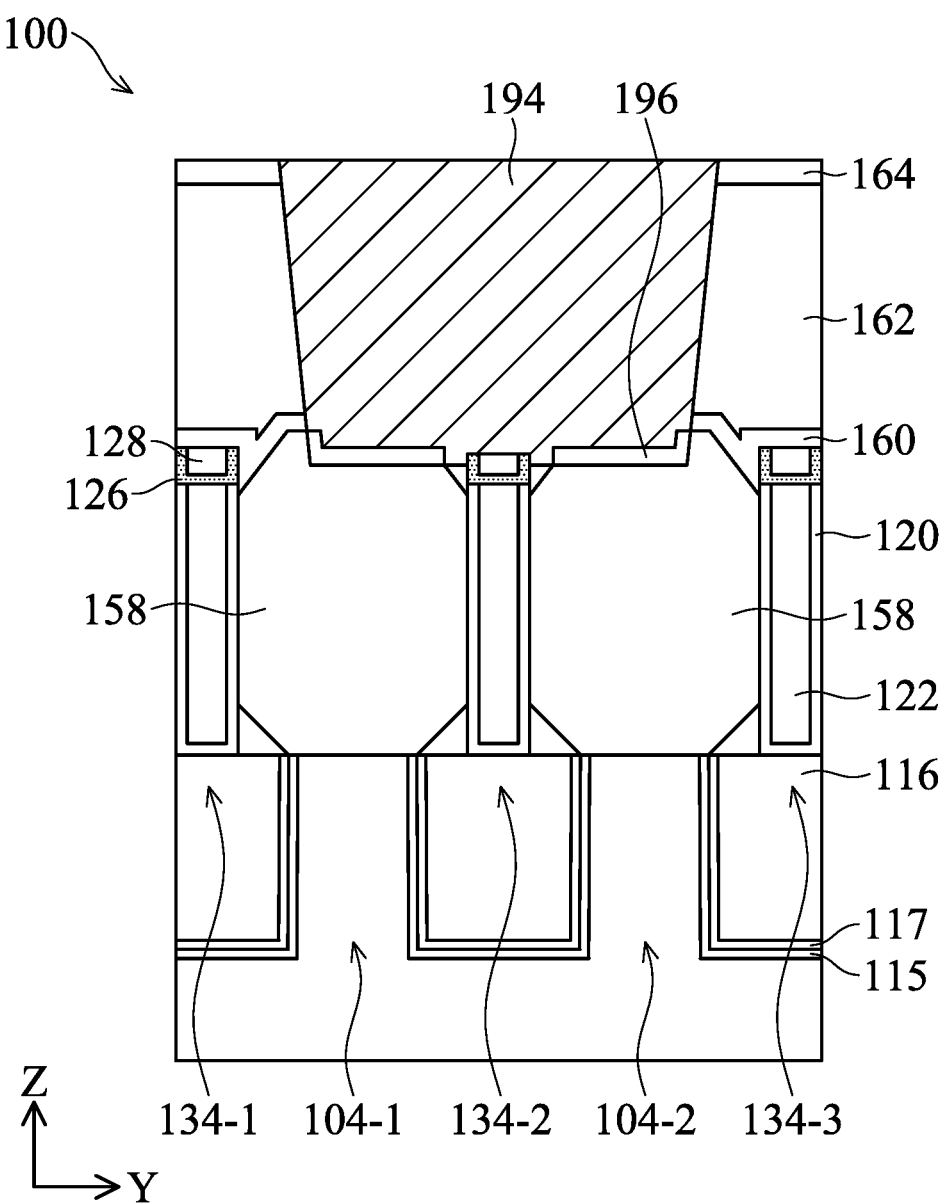
FIG. 3B illustrates a cross-sectional view of the semiconductor structure shown along line B-B' in FIG. 1 in accordance with some embodiments.
Figure 3C:
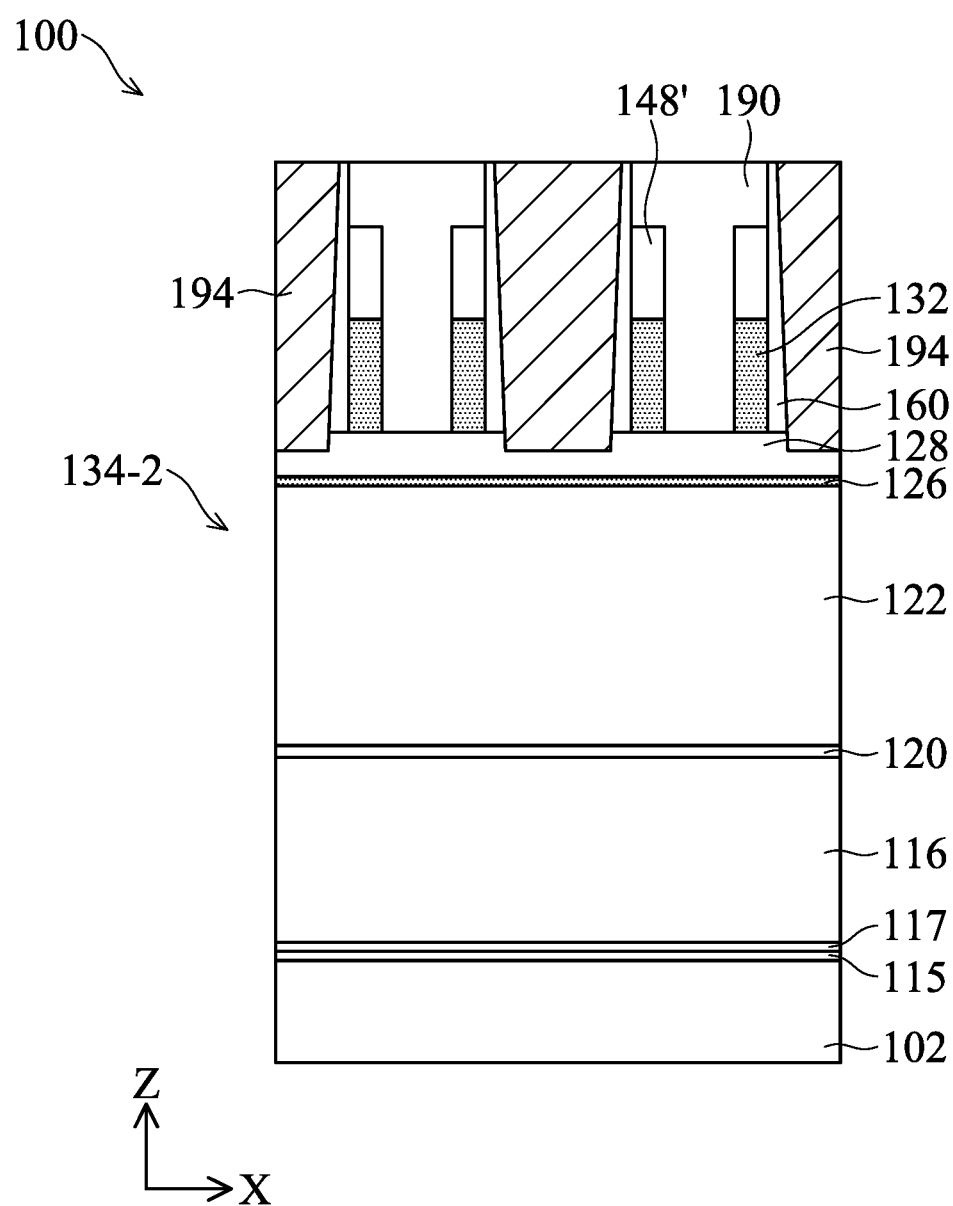
FIG. 3C illustrates a cross-sectional view of the semiconductor structure shown along line C-C' in FIG. 1 in accordance with some embodiments.
Figure 3D:
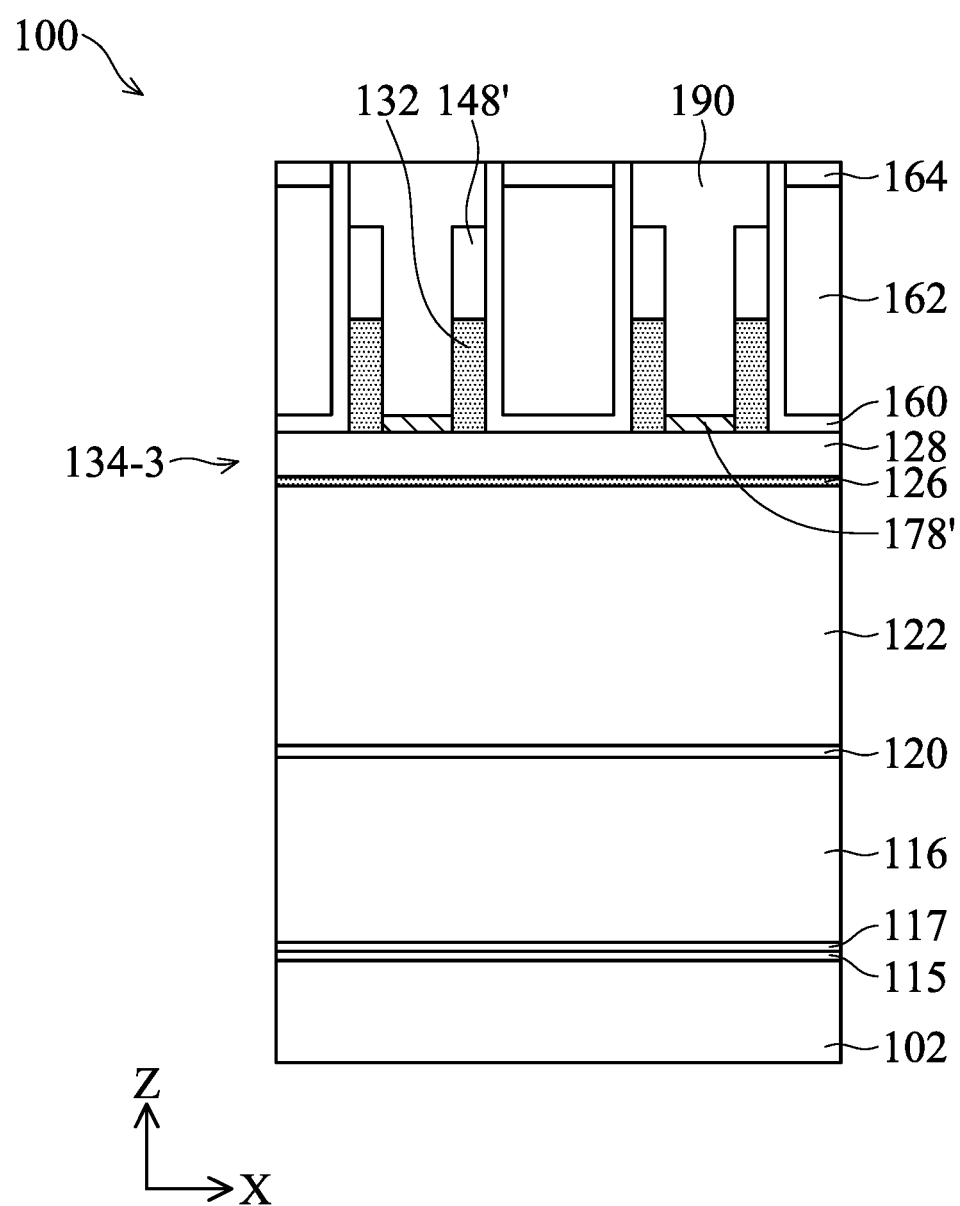
FIG. 3D illustrates a cross-sectional view of the semiconductor structure shown along line D-D' in FIG. 1 in accordance with some embodiments.

FIG. 3A illustrates a cross-sectional view of the semiconductor structure 100 shown along line A-A' (i.e. along the Y direction over the channel region) in FIG. 1 in accordance with some embodiments. FIG. 3B illustrates a cross-sectional view of the semiconductor structure 100 shown along line B-B' (i.e. along the Y direction over the source/drain region) in FIG. 1 in accordance with some embodiments. FIG. 3C illustrates a cross-sectional view of the semiconductor structure 100 shown along line C-C' (i.e. along the X direction over the dielectric feature 134-2) in FIG. 1 in accordance with some embodiments. FIG. 3D illustrates a cross-sectional view of the semiconductor structure 100 shown along line D-D' (i.e. along the X direction over the dielectric feature 134-3) in FIG. 1 in accordance with some embodiments.

As shown in FIG. 3A, the gate structure 168 includes the portion 168-1 wrapped around the nanostructures 108' of the fin structure 104-1, the portion 168-2 wrapped around the nanostructures 108' of the fin structure 104-2, and the portion 168-3 wrapped around the nanostructures 108' of the fin structure 104-3 in accordance with some embodiments. The portions 168-1, 168-2, and 168-3 of the gate structure 168 are separated by the dielectric features 134-1 and 134-2 in accordance with some embodiments. In addition, the portion 178'-1 of the metal layer 178' covers the portions 168-1 and 168-3 of the gate structure 168 and the dielectric feature 134-1, so that the portions 168-1 and 168-3 of the gate structure 168 are electrically connected by the portion 178'-1 of the metal layer 178' in accordance with some embodiments.

Meanwhile, the portion 178'-2 of the metal layer 178' covers the portion 168-2 of the gate structure 168 and the dielectric feature 134-3 but is separated from the portion 178'-1 of the metal layer 178' by the dielectric layer 190, so that the portion 178'-2 of the gate structure 178' is electrically isolated from the portions 178'-1 and 178'-3 of the gate structure-metal layer 178' in accordance with some embodiments. In some embodiments, the dielectric layer 190 is in direct contact with the metal layer 178' and the top surface of the dielectric feature 134-2. In some embodiments, the dielectric features 134-1, 134-2, and 134-3 all pass through the gate structure 168, and the dielectric feature 134-2 is in direct contact with the dielectric layer 190 while the dielectric features 134-1 and 134-3 are separated from the dielectric layer 190 by the metal layer 178'.

As described above, the dielectric features 134-1, 134-2, and 134-3 interpose into the gate structure 168 and separate the gate structure 168 into different portions, and the separated portions of the gate structure 168 are connected by the metal layer 178' formed afterwards. Therefore, the spaces between the nanostructures 108' and the dielectric features 134 can be reduced without increasing the risk of a short-circuit resulting from misalignment during the manufacturing processes.

In some embodiments, the top surfaces of dielectric features 134, including the dielectric features 134-1, 134-2, and 134-3, at the channel region are substantially level with the top surface of the gate structure 168, as shown in FIG. 3A in accordance with some embodiments. In some embodiments, the dielectric features 134-1, 134-2, and 134-3 at the channel region are substantially level with each other.

On the other hand, the dielectric features 134-1, 134-2, and 134-3 at the source/drain region are not level with each other in accordance with some embodiments.

As described previously, before the conductive structure 194 and the silicide layer 196 are formed, a trench may be formed through the interlayer dielectric layer 162 and the contact etch stop layer 160, and the dielectric feature 134-2 exposed by the trench may also be partially removed.

Accordingly, the dielectric feature 134-2 under the conductive structure 194 is lower than the dielectric features 134-1 and 134-3 at the source/drain region, as shown in FIG. 3B in accordance with some embodiments. In some embodiments, the bottommost surface of the silicide layer 196 is higher than the bottom surface of the top portion 134T of the dielectric feature 134-2, as shown in FIG. 3B. In addition, the topmost surface of the silicide layer 196 is higher than the top surface of the top portion 134T of the dielectric feature 134-2 in accordance with some embodiments.

Furthermore, the dielectric features 134-2 at the source/drain region are shorter than the dielectric features 134-2 at the channel region, as shown in FIG. 3C in accordance with some embodiments. In some embodiments, the height difference of the dielectric feature 134-2 between the channel region and the source/drain region is smaller than about 35 nm, such as smaller than 10 nm. If the height difference of the dielectric feature 134-2 between the channel region and the source/drain region is too high, the capacitance may be increased. Meanwhile, since the conductive structure 194 is not formed over the dielectric feature 134-3, the dielectric feature 134-3 has substantially the same height at the channel region and the source/drain region, as shown in FIG. 3D in accordance with some embodiments.

Figure 4:
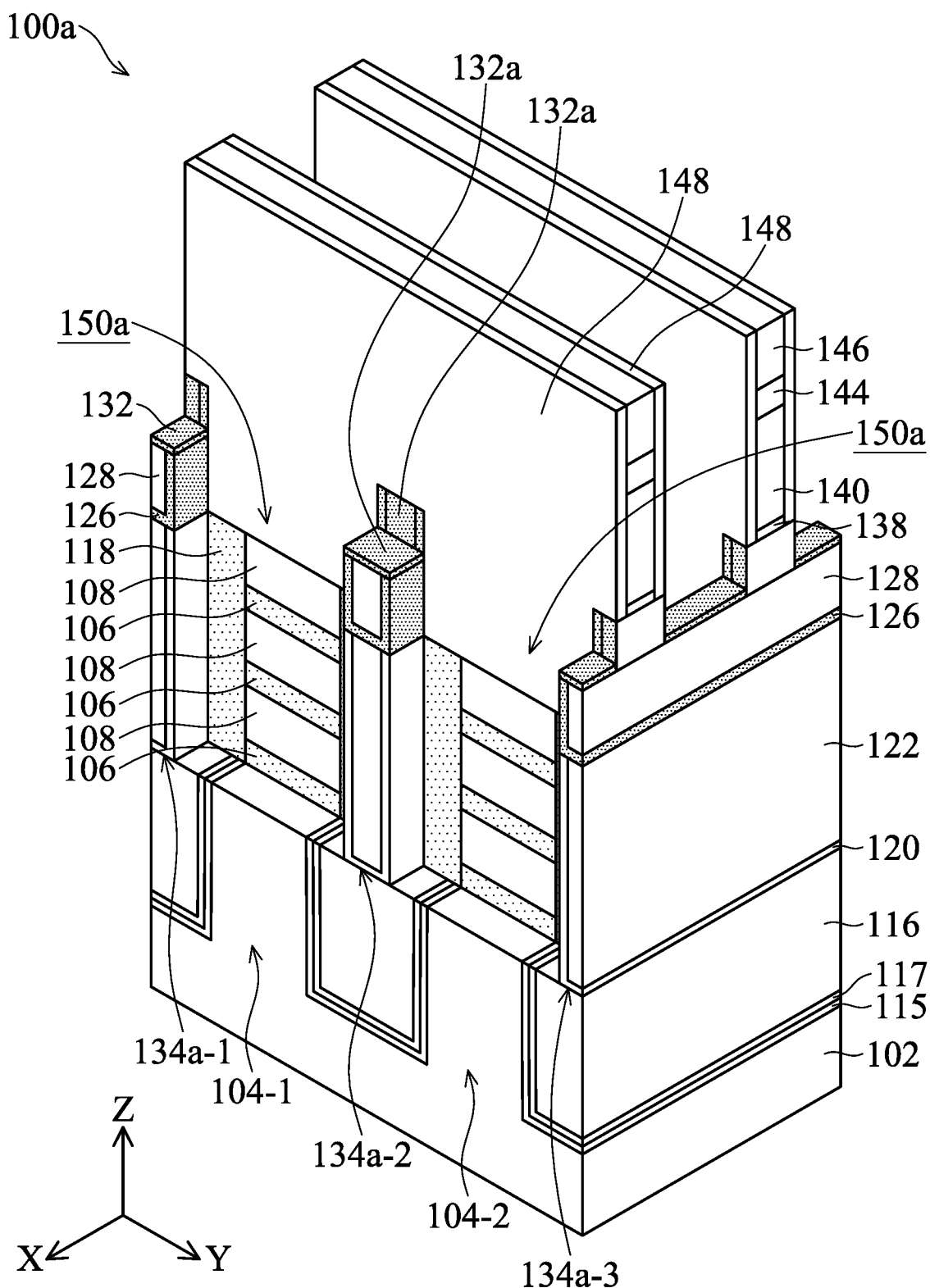
FIG. 4 illustrates a diagrammatic perspective view of an intermediate stage of manufacturing a semiconductor structure in accordance with some embodiments.

FIG. 4 illustrates a diagrammatic perspective view of an intermediate stage of manufacturing a semiconductor structure 100a in accordance with some embodiments. Materials and processes for manufacturing the semiconductor structure 100a may be similar to, or the same as, those for manufacturing the semiconductor structure 100 described above, except an additional etching process is performed when forming source/drain recesses of the semiconductor structure 100a in accordance with some embodiments.

More specifically, the processes shown in FIGS. 2A to 2N are performed, and source/drain recesses 150a are formed adjacent to the gate spacers 148, as shown in FIG. 4 in accordance with some embodiments. Similar to those shown in FIG. 2O, the fin structures 104-1 and 104-2, the cladding layers 118, and the cap layer 132 of the dielectric features 134-1, 134-2, and 134-3 not covered by the dummy gate structures 136 and the gate spacers 148 are recessed in accordance with some embodiments. In addition, cap layers 132a of dielectric features 134-1, 134-2, and 134-3 are not completely removed, as shown in FIG. 4 in accordance with some embodiments.

Accordingly, an additional etching process is performed to completely remove the cap layers 132a to form a structure similar to, or the same as, that shown in FIG. 2N in accordance with some embodiments. Afterwards, the processes shown in FIGS. 2O to 2Z are performed to form the semiconductor structure, which is substantially the similar to, or the same as, the semiconductor structure 100 shown in FIGS. 2Z and 3A to 3D.

Figure 5A:
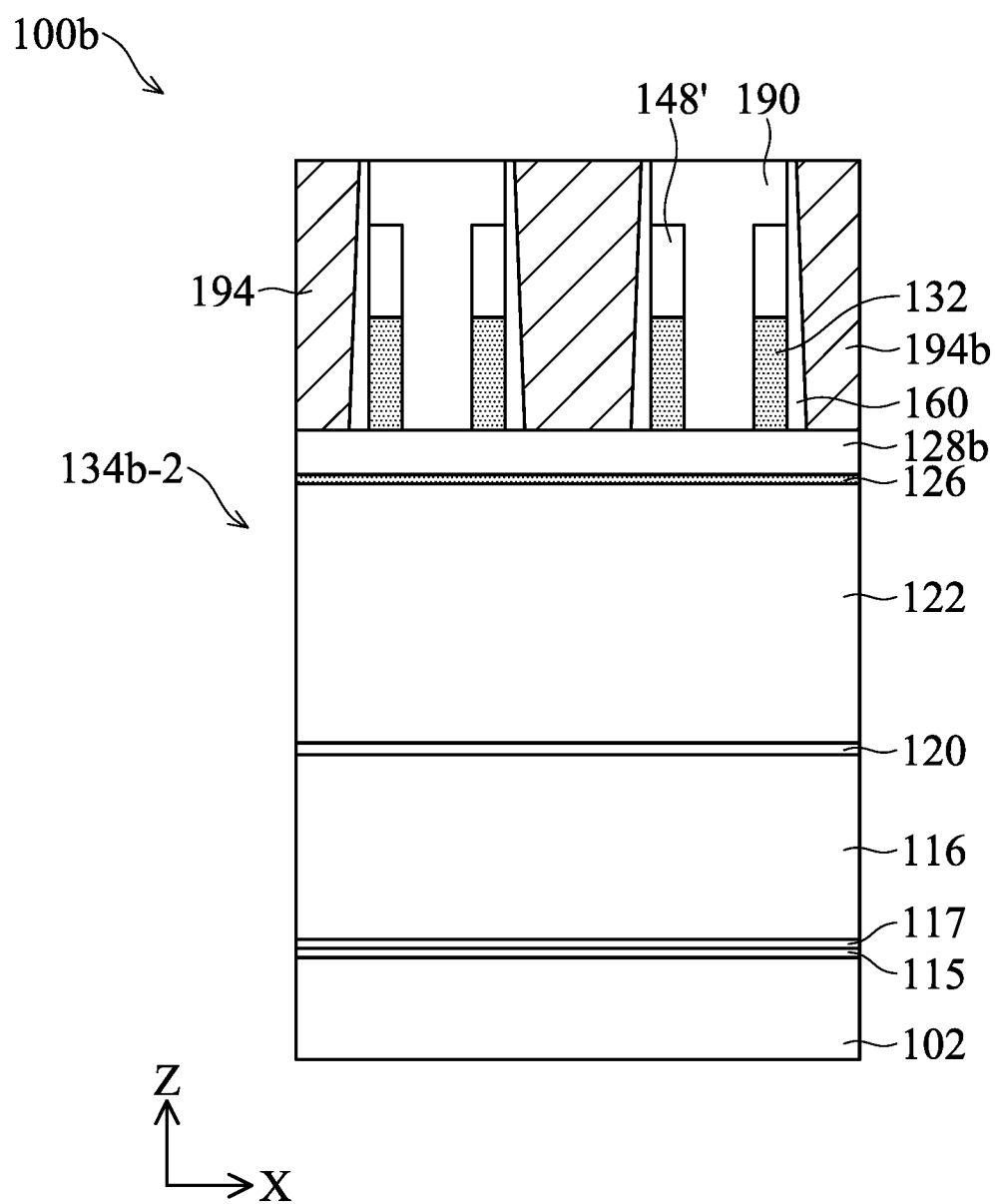
FIGS. 5A and 5B illustrate cross-sectional views of a semiconductor structure in accordance with some embodiments
Figure 5B:
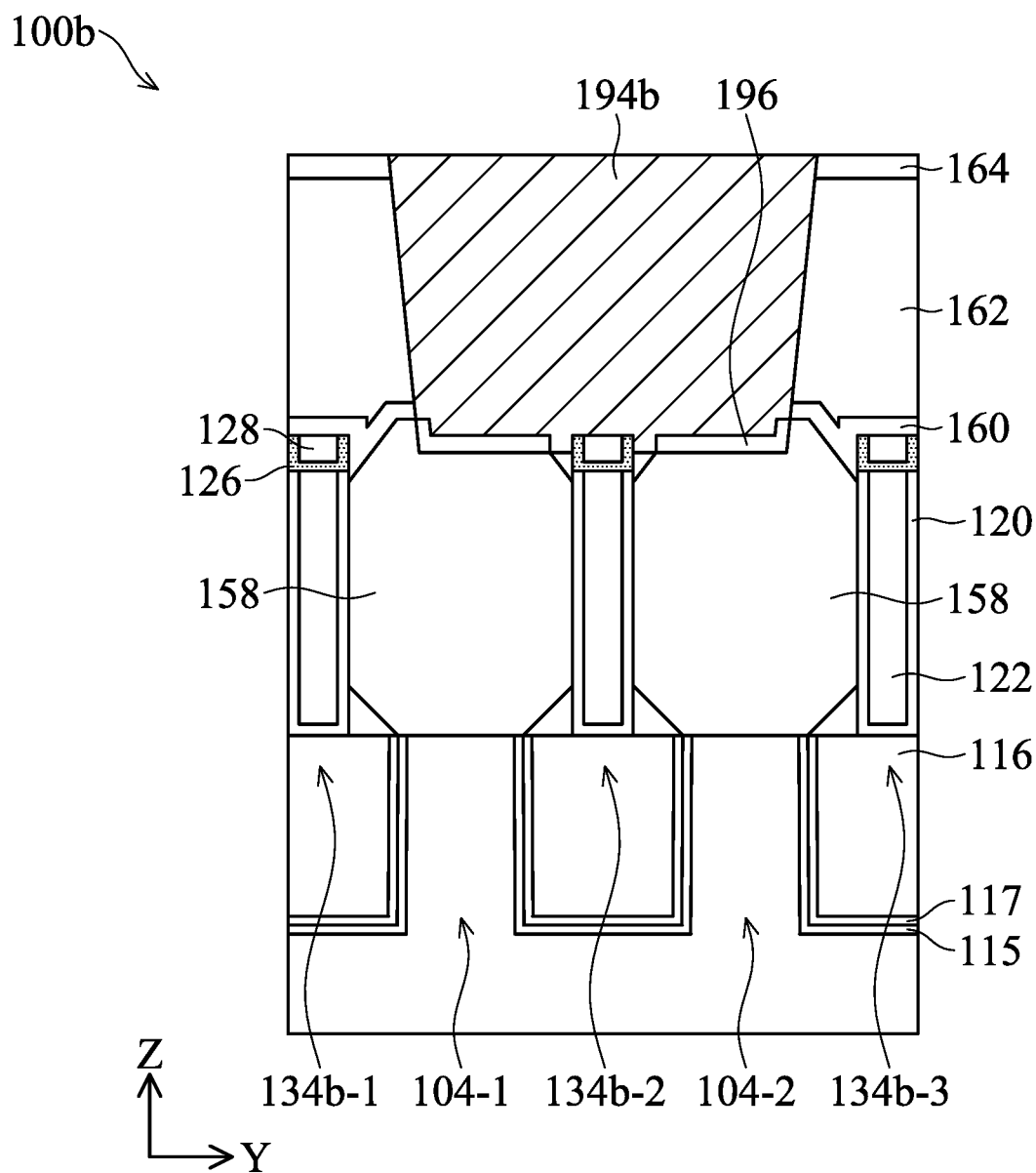

FIGS. 5A and 5B illustrate cross-sectional views of a semiconductor structure 100b in accordance with some embodiments. The semiconductor structure 100b may be similar to the semiconductor structure 100 described previously, except the dielectric feature under the source/drain contacts is not recessed in accordance with some embodiments. More specifically, FIG. 5A is a cross-sectional view shown along the X direction over the dielectric feature 134b-2 (e.g. along line C-C' shown in FIG. 1, similar to that shown in FIG. 3C), and FIG. 5B is a cross-sectional view shown along the Y direction at source/drain region (e.g. along line B-B' shown in FIG. 1, similar to that shown in FIG. 3B) in accordance with some embodiments. Materials and processes for manufacturing the semiconductor structure 100b may be similar to, or the same as, those for manufacturing the semiconductor structure 100 described above and are not repeated herein.

More specifically, the processes shown in FIGS. 2A to 2Y are performed, and conductive structures (e.g. the same as the conductive structures 194) are formed through the dielectric layer (e.g. the same as the dielectric layer 190) and the metal layer (e.g. the same as the metal layer 178') and lands the gate structure (e.g. the same as the gate structure 168), and source/drain contacts 194b are formed through the interlayer dielectric layer (e.g. the same as the interlayer dielectric layer 162) and the protection layer (e.g. the same as the protection layer 164) and lands on the source/drain structures 158, as shown in FIGS. 5A and 5B in accordance with some embodiments.

In addition, during the formation of the source/drain contacts 194b, trenches are formed through the interlayer dielectric layer and the protection layer to expose the source/drain structures 158 and a dielectric feature 134b-2, but the dielectric feature 134b-2 exposed by the trenches are not etched. Accordingly, the dielectric feature 134b-2 has a substantially flat top surface, as shown in FIG. 5A in accordance with some embodiments. In addition, the dielectric features 134b-1, 134b-2, and 134b-3 have substantially the same height, as shown in FIG. 5B in accordance with some embodiments.

The processes and materials for forming the dielectric features 134b-1, 134b-2, and 134b-3 and the conductive structure 194b may be the same as those for forming the dielectric features 134-1, 134-2, and 134-3 and the conductive structure 194 and therefore are not repeated herein.

Figure 6A:
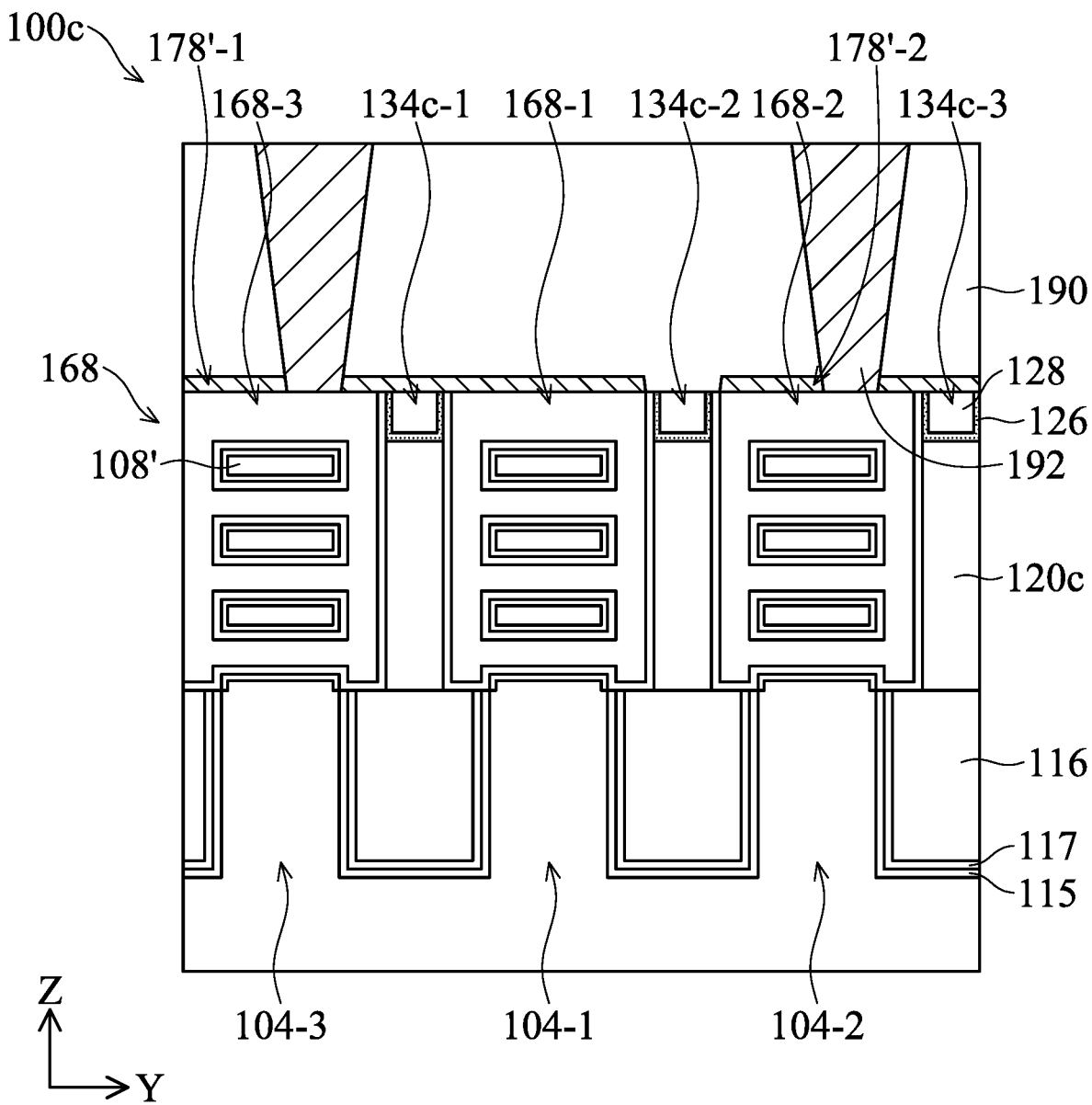
FIGS. 6A to 6D illustrate cross-sectional views of a semiconductor structure in accordance with some embodiments.
Figure 6B:
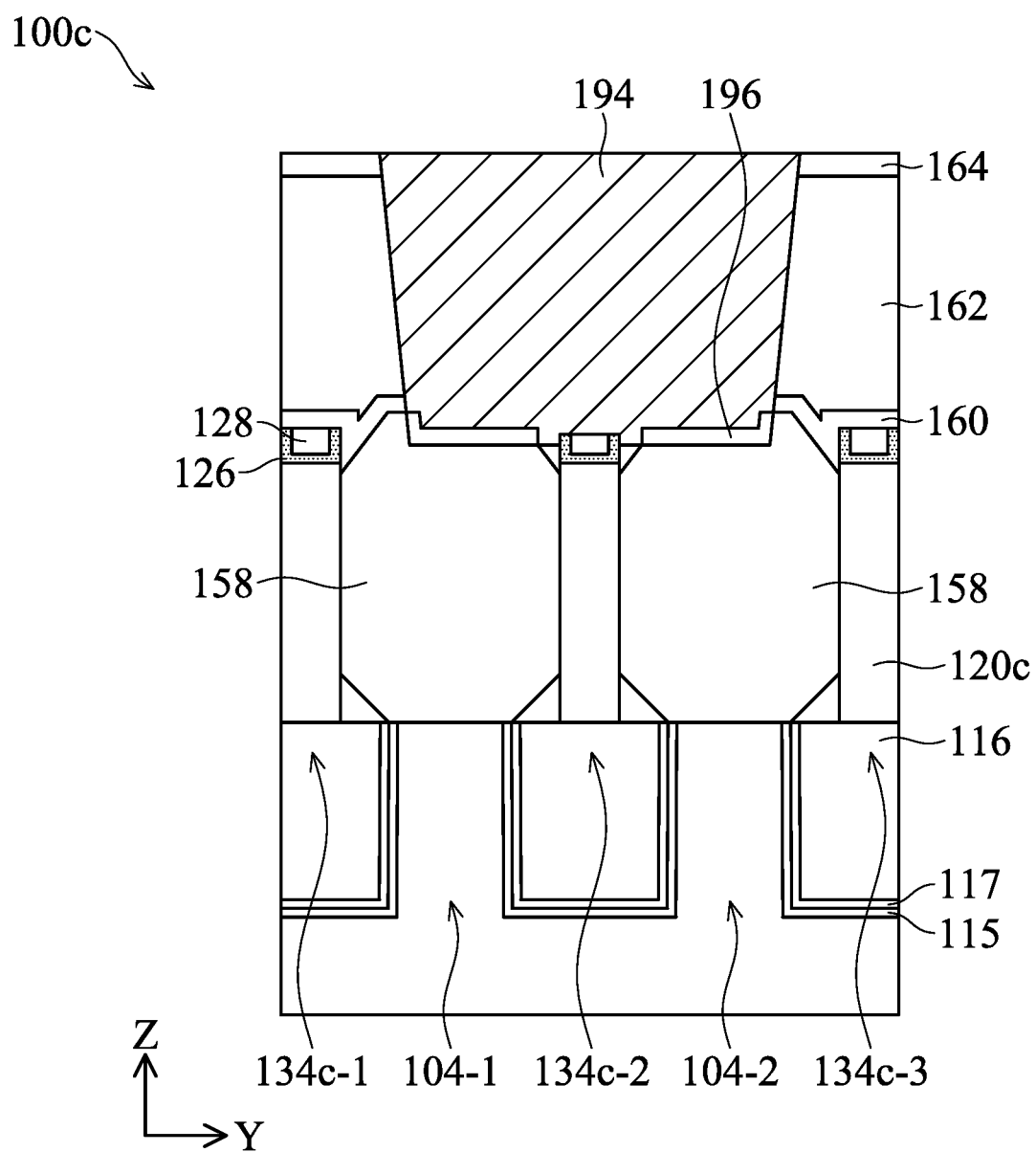
Figure 6C:
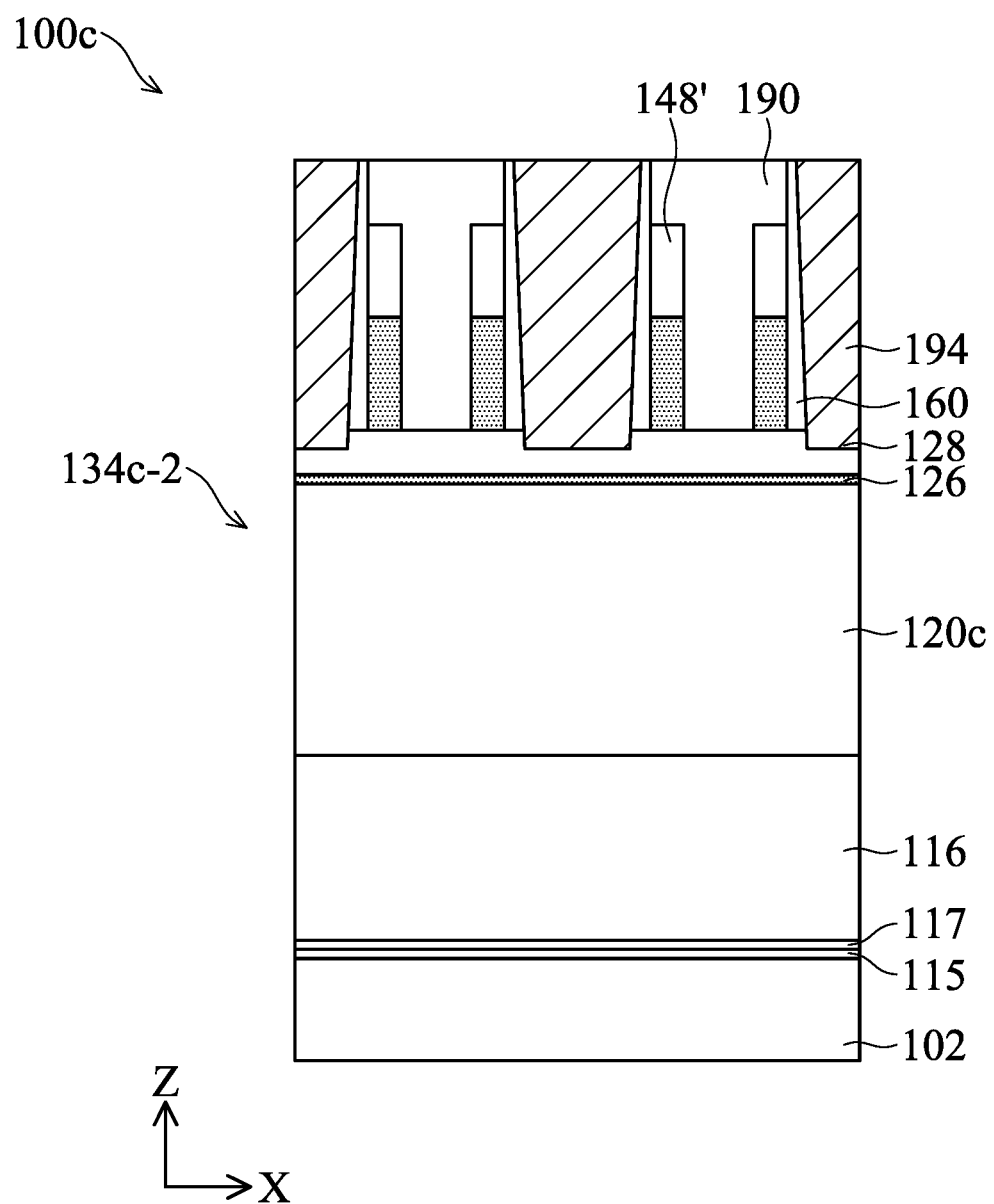
Figure 6D:
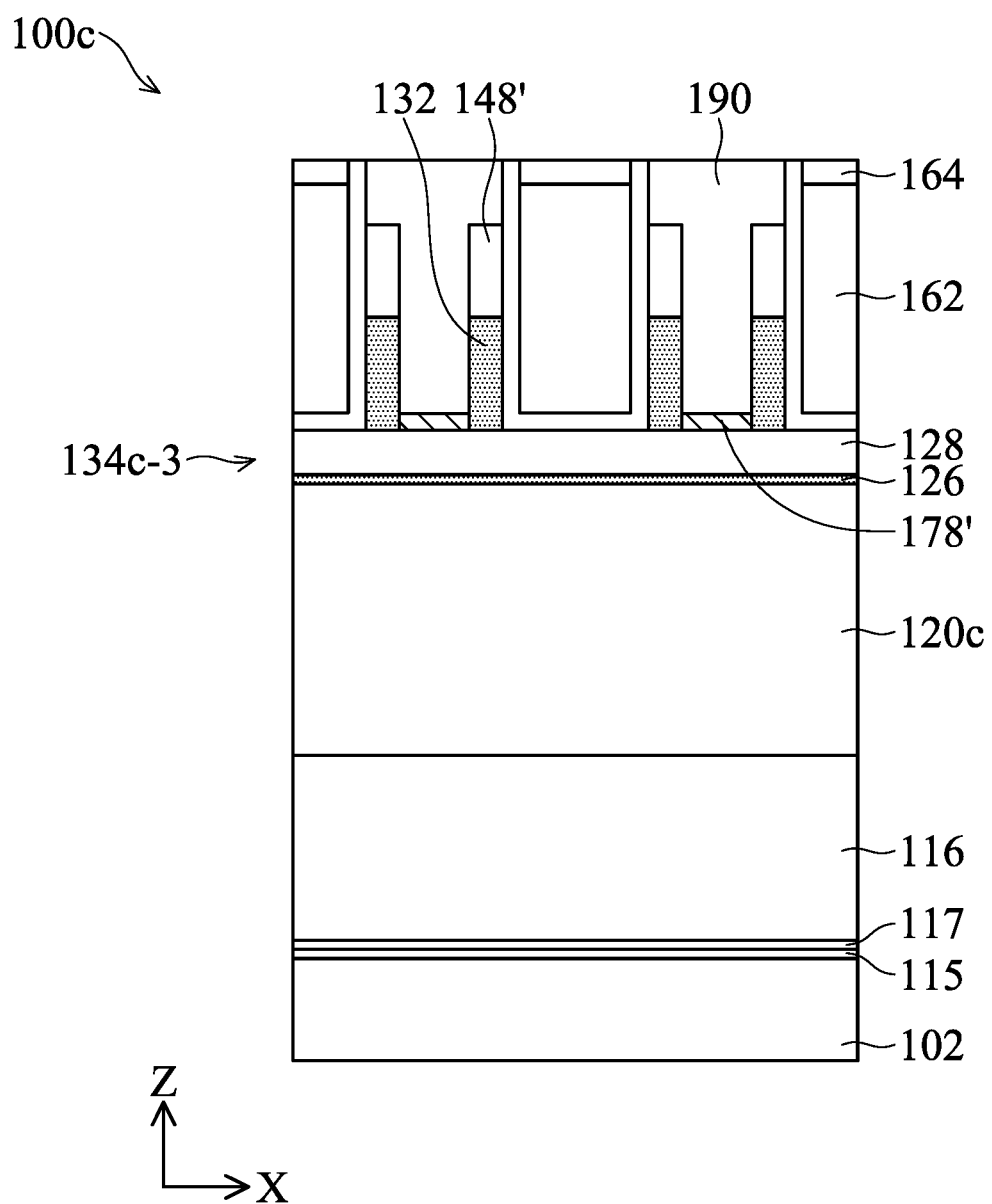

FIGS. 6A to 6D illustrate cross-sectional views of a semiconductor structure 100c in accordance with some embodiments. The semiconductor structure 100c may be similar to the semiconductor structure 100 described previously, except the bottom portions of the dielectric features are made of a single material in accordance with some embodiments. More specifically, FIG. 6A is a cross-sectional view shown along the Y direction at the channel region, FIG. 6B is a cross-sectional view shown along the Y direction at the source/drain region, FIG. 6C is a cross-sectional view shown along the X direction at the dielectric feature 134c-2, and FIG. 6D is a cross-sectional view shown along the X direction at the dielectric feature 134c-3 (similar to that shown in FIGS. 3A, 3B, 3C, and 3D respectively). Materials and processes for manufacturing the semiconductor structure 100c may be similar to, or the same as, those for manufacturing the semiconductor structure 100 described above and are not repeated herein.

More specifically, the processes shown in FIGS. 2A to 2F are performed, and the spaces between the fin structures 104-1 and 104-2 are completely filled with a dielectric layer 120c in accordance with some embodiments. In some embodiments, the dielectric layer 120c is made of a low k dielectric material, such as SiN, SiCN, SiOCN, SiON, or the like. The dielectric layer 120c may be deposited using CVD, PVD, ALD, HDPCVD, MOCVD, RPCVD, PECVD, LPCVD, ALCVD, APCVD, other applicable methods, or combinations thereof.

After the dielectric layer 120c is polished until the top surfaces of the cladding layers (e.g. the cladding layer 118 shown in FIG. 2F) are exposed and processes shown in FIGS. 2I to 2Z are performed to form the semiconductor structure 100c, as shown in FIGS. 6A to 6D in accordance with some embodiments. As shown in FIG. 6A to 6D, the bottom portions of the dielectric features 134c-1, 134c-2, and 134c-3 are formed of the dielectric layer 120c, and the top portions including the shell layer 126, the core portion 128, and the cap layer 132 are formed over the dielectric layer 120c in accordance with some embodiments.

Figure 7:
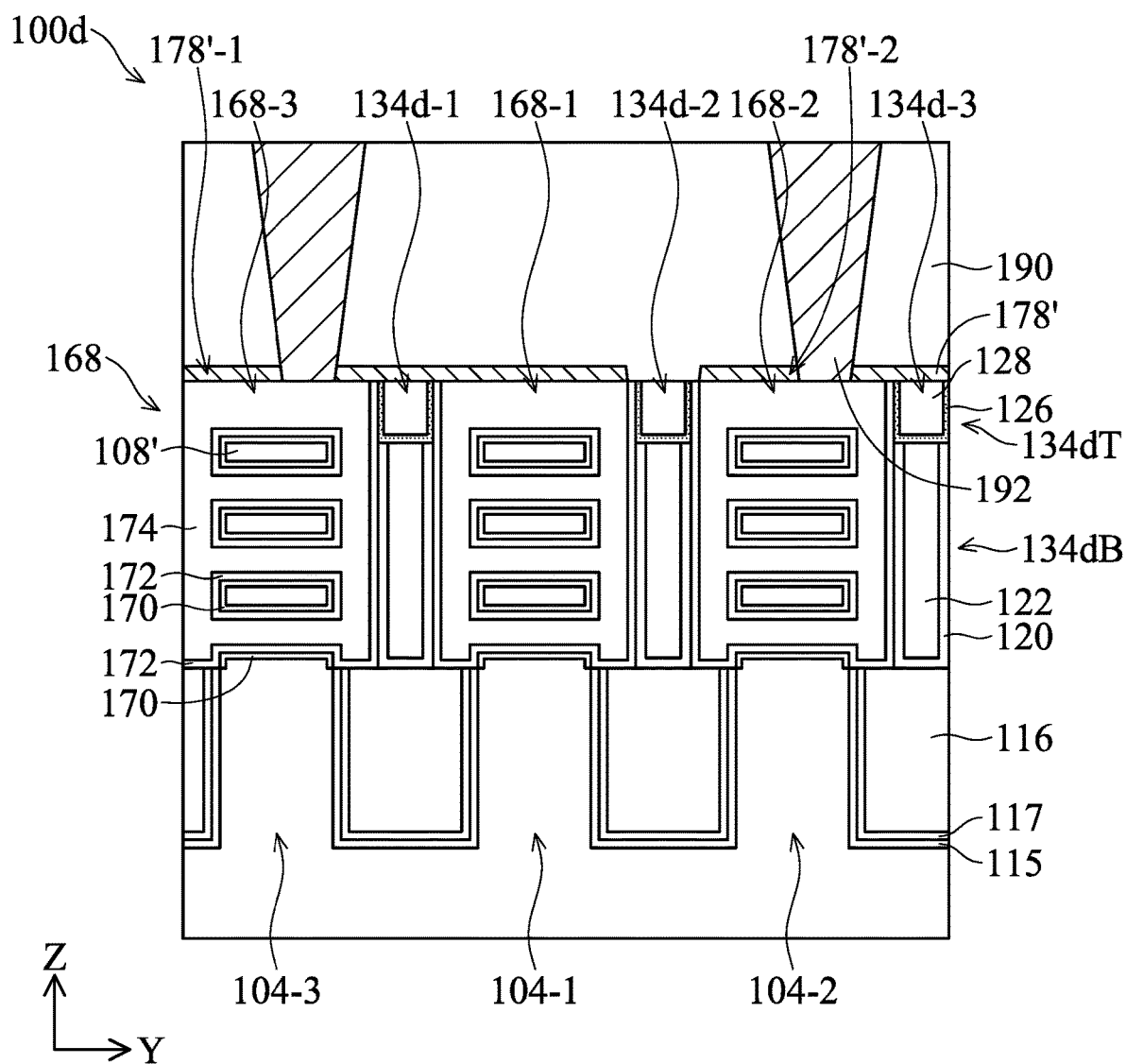
FIG. 7 illustrates a cross-sectional view of a semiconductor structure in accordance with some embodiments.

FIG. 7 illustrates a cross-sectional view of a semiconductor structure 100d shown along the Y direction at the channel region in accordance with some embodiments. The semiconductor structure 100d may be similar to the semiconductor structure 100, except the interfaces between the top portions and the bottom portions of the dielectric features are substantially level with the nanostructures in accordance with some embodiments. Materials and processes for manufacturing the semiconductor structure 100d may be similar to, or the same as, those for manufacturing the semiconductor structure 100 described above and are not repeated herein.

More specifically, the processes shown in FIGS. 2A to 2H are performed, and the dielectric liner 120 and the dielectric fill layer 122 are recessed to form the bottom portions 134dB of dielectric features 134d-1, 134d-2, and 134d-3 afterwards in accordance with some embodiments. After the dielectric liner 120 and the dielectric fill layer 122 are recessed, the top surfaces of the bottom portions 134dB of the dielectric features 134d-1, 134d-2, and 134d-3 are substantially level with the top surfaces of the topmost second semiconductor material layers (e.g. the second semiconductor material layers 108) in accordance with some embodiments. Next, processes shown in FIGS. 2J to 2Z are performed to form the semiconductor structure 100d in accordance with some embodiments.

As shown in FIG. 7, the interfaces between the top portions 134dT and the bottom portions 134dB are substantially level with the top surface of the topmost nanostructures 108' at the channel region in accordance with some embodiments. The processes and materials for forming the dielectric features 134d-1, 134d-2, and 134d-3 may be the same as those for forming the dielectric features 134-1, 134-2, and 134-3 and therefore are not repeated herein.

Figure 8:
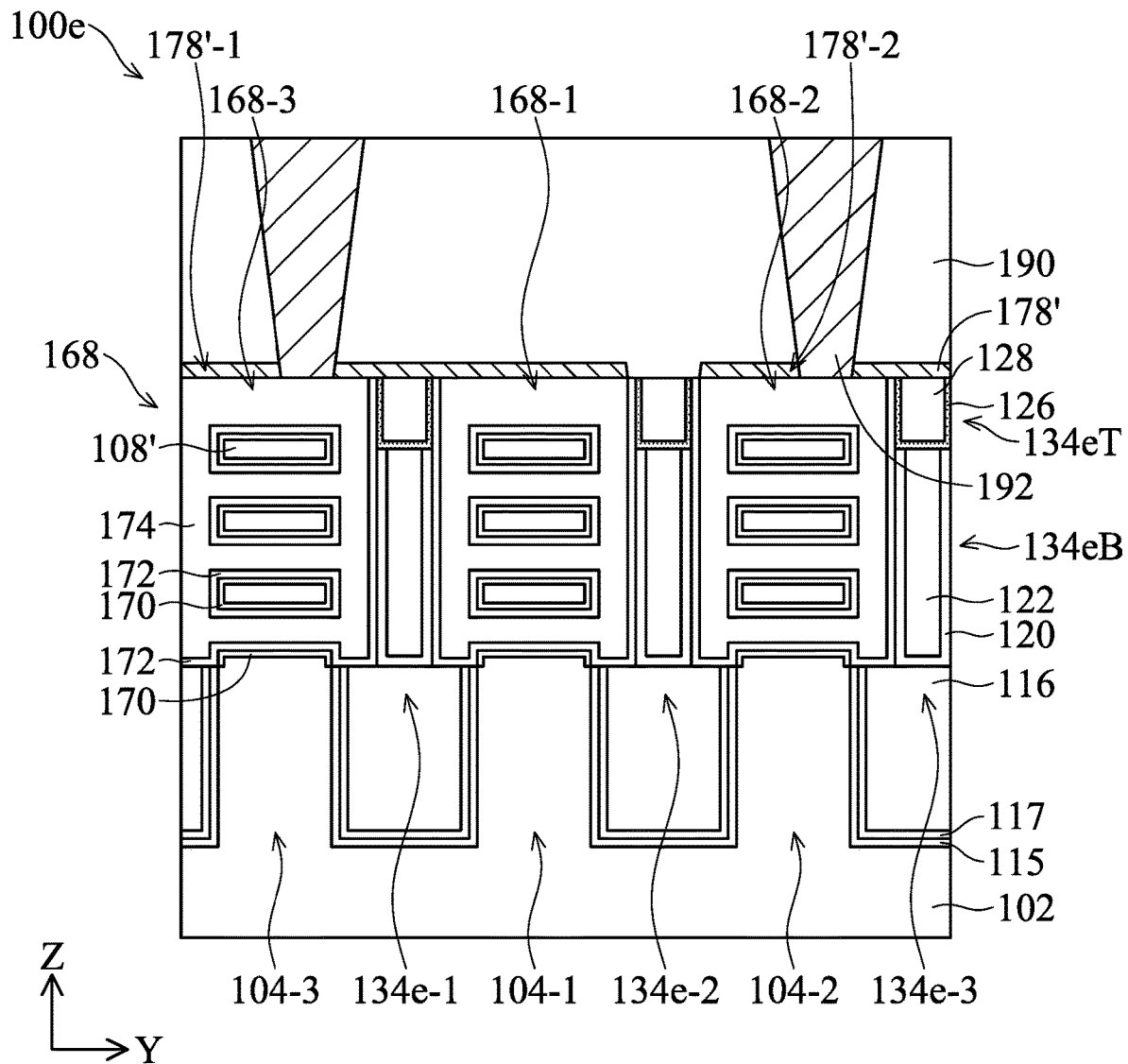
FIG. 8 illustrates a cross-sectional view of a semiconductor structure in accordance with some embodiments.

FIG. 8 illustrates a cross-sectional view of a semiconductor structure 100e shown along the Y direction at the channel region in accordance with some embodiments. The semiconductor structure 100e may be similar to the semiconductor structure 100, except the interfaces between the top portions and the bottom portions of the dielectric features are relatively low in accordance with some embodiments. Materials and processes for manufacturing the semiconductor structure 100e may be similar to, or the same as, those for manufacturing the semiconductor structure 100 described above and are not repeated herein.

More specifically, the processes shown in FIGS. 2A to 2H are performed, and the dielectric liner 120 and the dielectric fill layers 122 are recessed to form the bottom portions 134eB of dielectric features 134e-1, 134e-2, and 134e-3 in accordance with some embodiments. After the dielectric liner 120 and the dielectric fill layers 122 are recessed, the top surfaces of the bottom portions 134eB of the dielectric features 134e-1, 134e-2, and 134e-3 are slightly lower than the top surfaces of the topmost second semiconductor material layers (e.g. the second semiconductor material layers 108) in accordance with some embodiments. Next, processes shown in FIGS. 2J to 2Z are performed to form the semiconductor structure 100e in accordance with some embodiments.

As shown in FIG. 8, the interfaces between the top portions 134eT and the bottom portions 134eB are lower than the top surfaces of the topmost nanostructures 108' at the channel region in accordance with some embodiments. In some embodiments, the interfaces between the top portions 134eT and the bottom portions 134eB are higher than the bottom surfaces of the topmost nanostructures 108' at the channel region. The processes and materials for forming the dielectric features 134e-1, 134e-2, and 134e-3 may be the same as those for forming the dielectric features 134-1, 134-2, and 134-3 and therefore are not repeated herein.

Figure 9A:
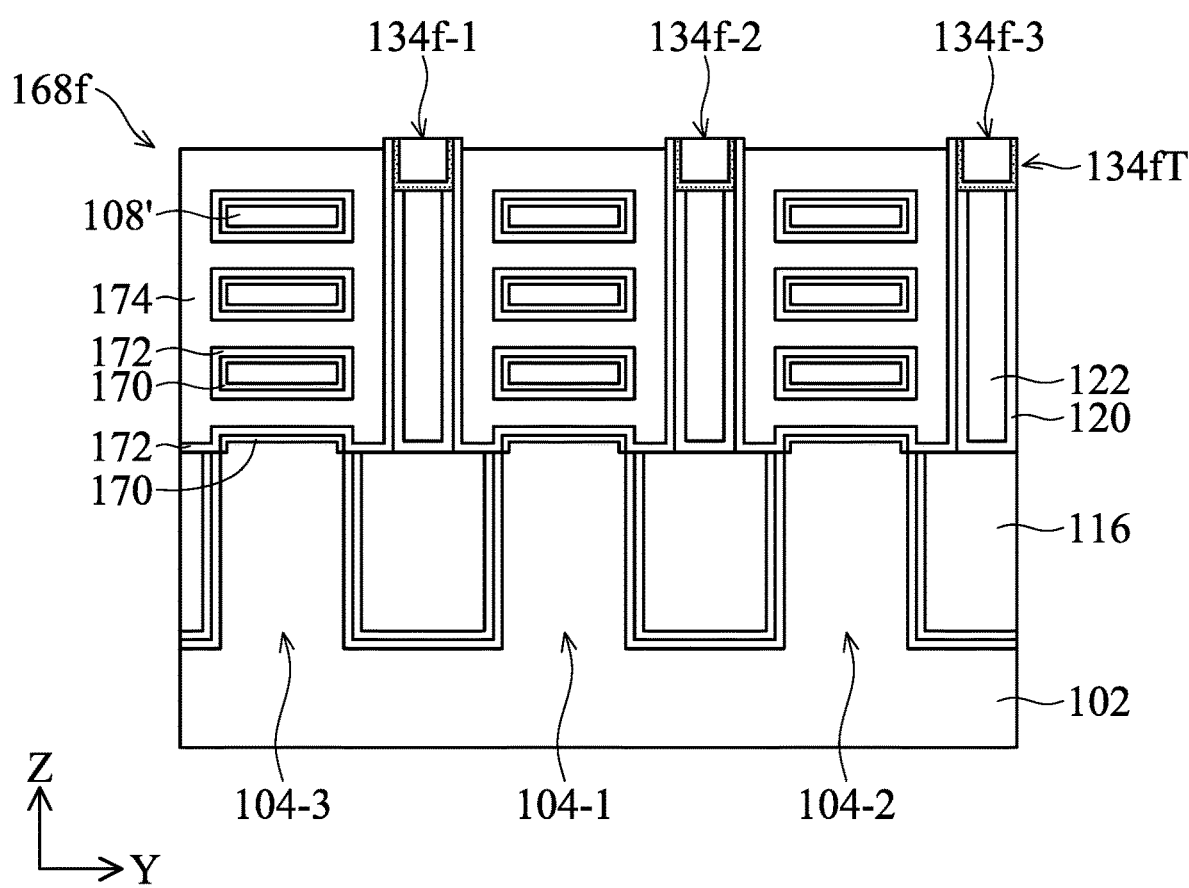
FIGS. 9A and 9B illustrate cross-sectional views of intermediate stages of manufacturing a semiconductor structure in accordance with some embodiments.
Figure 9B:
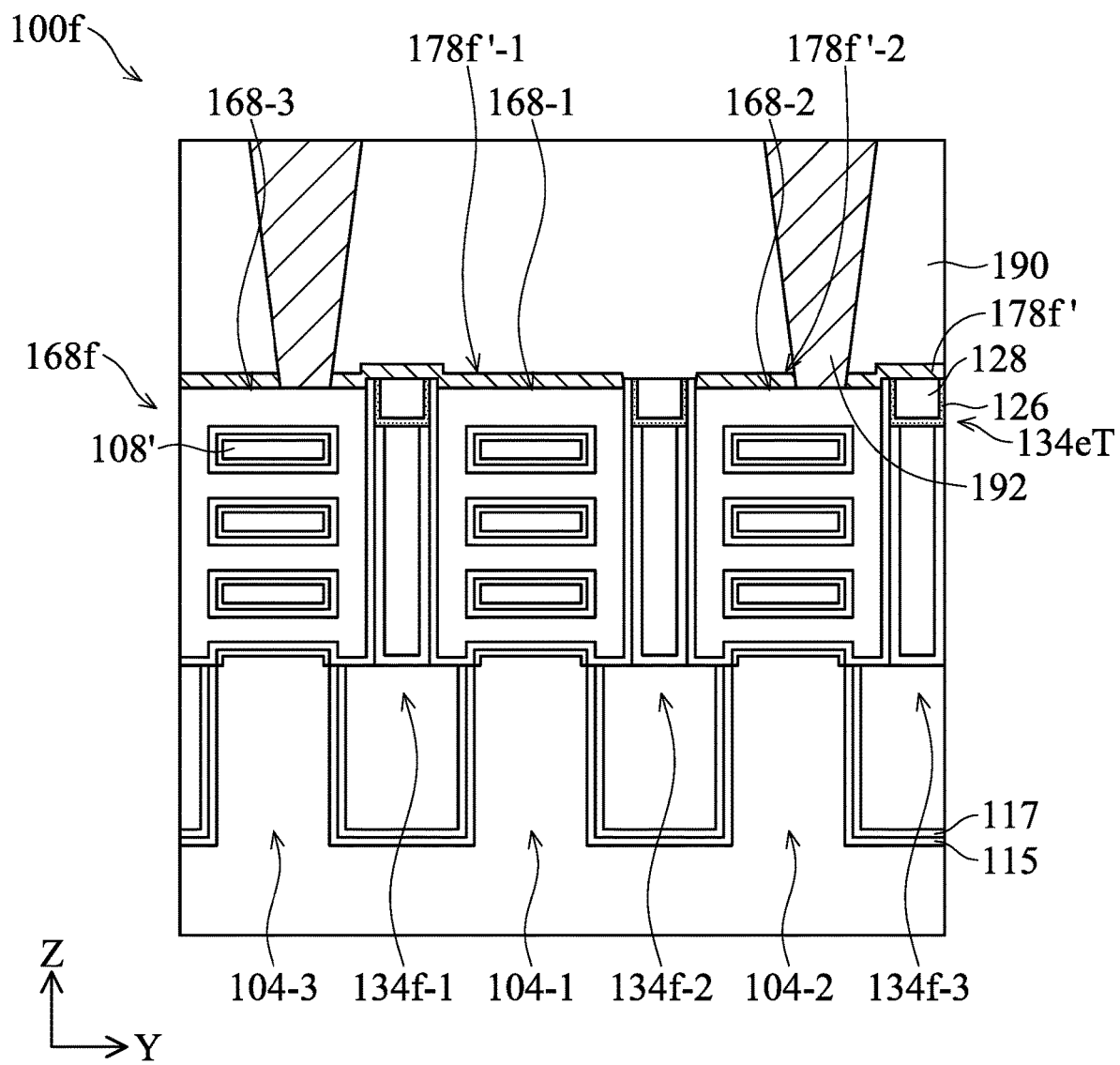

FIGS. 9A and 9B illustrate cross-sectional views of intermediate stages of manufacturing a semiconductor structure 100f shown along the Y direction at the channel region in accordance with some embodiments. The semiconductor structure 100f may be similar to the semiconductor structures 100, except the dielectric features in the semiconductor structure 100f at the channel region are higher than the gate structure in accordance with some embodiments. Materials and processes for manufacturing the semiconductor structure 100f may be similar to, or the same as, those for manufacturing the semiconductor structure 100 described above and are not repeated herein.

More specifically, the processes shown in FIGS. 2A to 2T are performed, and an etch back process is performed afterwards to remove the top portion of a gate structure 168f and the top portions of dielectric features 134f-1, 134f-2, and 134f-3 at the channel region, as shown in FIG. 9A in accordance with some embodiments. In some embodiments, the etching rate of the gate structure 168f and the dielectric features 134f-1, 134f-2, and 134f-3 during the etching back process are different, and therefore the top surfaces of the gate structure 168f and the dielectric features 134f-1, 134f-2, and 134f-3 are not level. In some embodiments, the top surface of the gate structure 168f is lower than the top surfaces of the top portion 134 fT of the dielectric features 134f-1, 134f-2, and 134f-3. In some embodiments, the height difference between the top surface of the gate structure 168f and the top surfaces of the top portions 134 fT of the dielectric features 134f-1, 134f-2, and 134f-3 at the channel region is smaller than about 3nm, so that the metal layer formed afterwards can still connect the portions of the gate structure 168f separated by the dielectric features 134f-1, 134f-2, and 134f-3.

Afterwards, the processes shown in FIGS. 2V to 2Z are performed to form the semiconductor structure 100f, as shown in FIG. 9B in accordance with some embodiments. Since the top surface of the gate structure 168f and the dielectric features 134f-1, 134f-2, and 134f-3 are not level, a metal layer 178f' formed over them is not flat in accordance with some embodiments. In some embodiments, the metal layer 178f' has a portion 178f'-1 and a portion 178f'-2 having protruding portions over the dielectric features 134f-1 and 134f-3. The processes and materials for forming the gate structure 168f, the dielectric features 134f-1, 134f-2, and 134f-3, and the metal layer 178f' may be the same as those for forming the gate structure 168, the dielectric features 134-1, 134-2, and 134-3, and the metal layer 178' and therefore are not repeated herein.

Figure 10A:
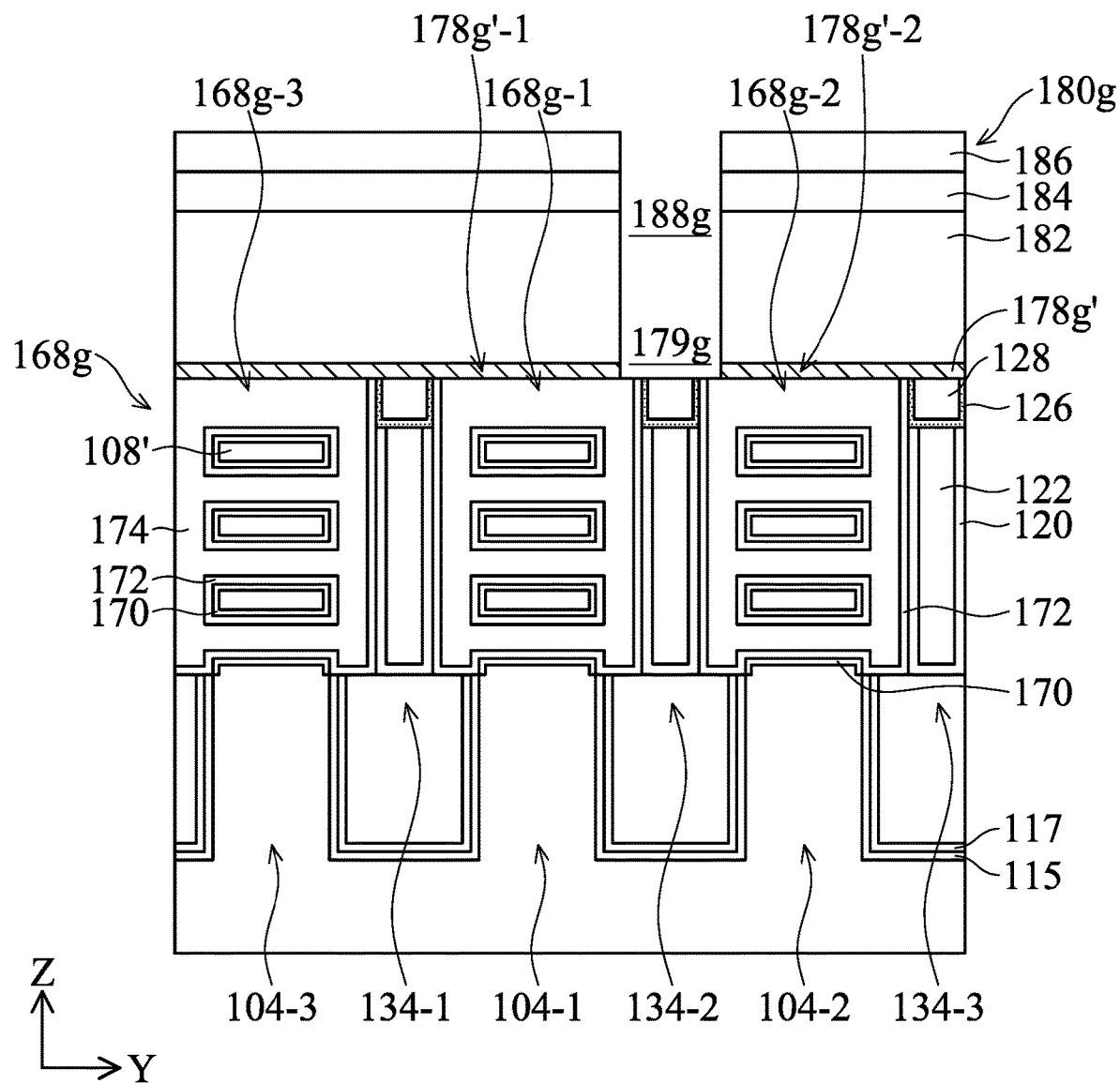
FIGS. 10A and 10B illustrate cross-sectional views of intermediate stages of manufacturing a semiconductor structure in accordance with some embodiments.
Figure 10B:
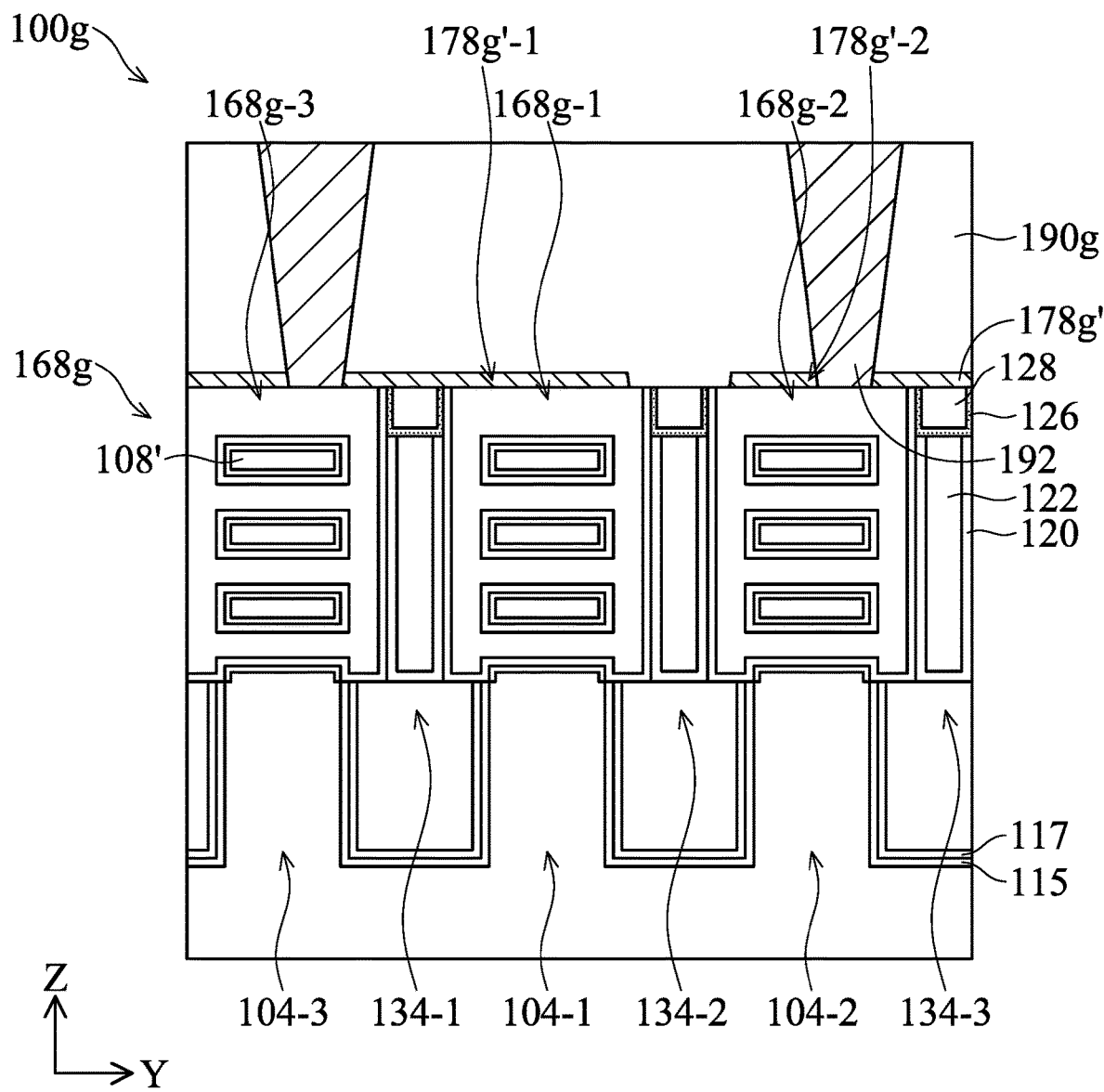

FIGS. 10A and 10B illustrate cross-sectional views of intermediate stages of manufacturing a semiconductor structure 100*g* shown along the Y direction at the channel region in accordance with some embodiments. The semiconductor structure 100*g* may be similar to the semiconductor structure 100, except the opening in the metal layer is wider than the dielectric feature exposed by the opening in accordance with some embodiments. Materials and processes for manufacturing the semiconductor structure 100*g* may be similar to, or the same as, those for manufacturing the semiconductor structure 100 described above and are not repeated herein.

More specifically, the processes shown in FIGS. 2A to 2W are performed, and then a metal layer is patterned through the opening 188*g* of the photoresist structure 180*g* to form a patterned metal layer 178*g*', as shown in FIG. 10A in accordance with some embodiments. In some embodiments, the opening 188*g* of the photoresist structure 180*g* is wider than the dielectric feature 134-2. Accordingly, an opening 179*g* of the metal layer 178*g*' is also wider than the dielectric feature 134-2, such that the portions 168*g*-1 and 168*g*-2 of the gate structure 168*g* are also partially exposed by the opening 179*g* of the metal layer 178*g*' in accordance with some embodiments. In some embodiments, the edge of the opening 179*g* of the metal layer 178*g*' is not aligned with the edge of the dielectric feature 134-2.

Afterwards, the processes shown in FIGS. 2Y and 2Z are performed to form the semiconductor structure 100*g*, as shown in FIG. 10B in accordance with some embodiments. Since the portions 168*g*-1 and 168*g*-2 are exposed by the opening 179*g*, a dielectric layer 190*g* formed afterwards is in direct contact with the top surfaces of the portions 168*g*-1 and 168*g*-2 of the gate structure 168*g*. Although some portions of the gate structure 168*g* are not covered by the metal layer 179*g*, the nanostructures 108' are all vertically covered by (e.g. vertically overlapped) the metal layer 178*g*' in accordance with some embodiments. The processes and materials for forming the gate structure 168*g*, the metal layer 178*g*', the photoresist structure 180*g*, and the dielectric layer 190*g* may be the same as those for forming the gate structure 168, the metal layer 178', the photoresist structure 180, and the dielectric layer 190 and therefore are not repeated herein.

Figure 11:
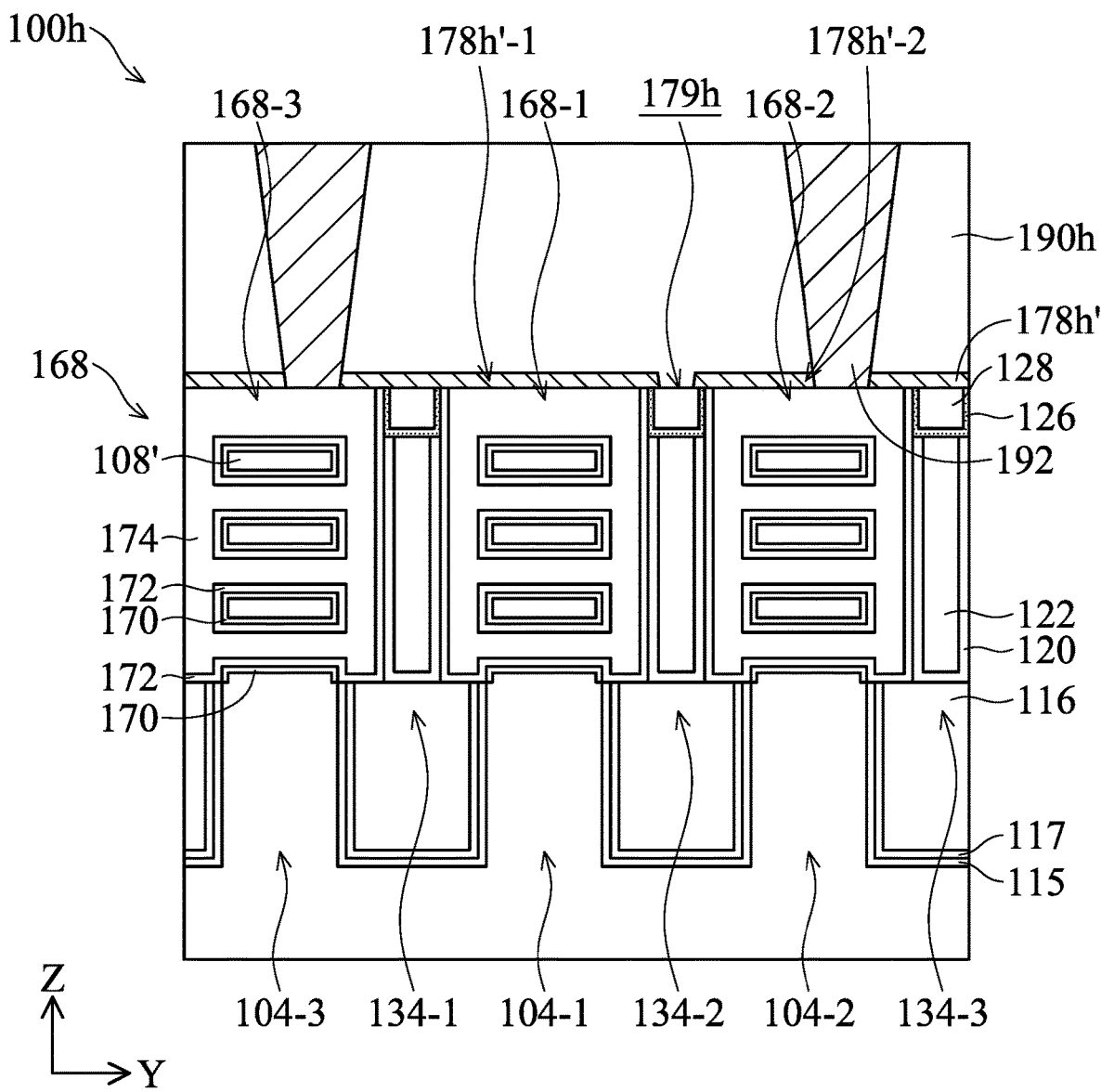
FIG. 11 illustrates a cross-sectional view of a semiconductor structure in accordance with some embodiments.

FIG. 11 illustrates a cross-sectional view of a semiconductor structure 100*h* shown along the Y direction at the channel region in accordance with some embodiments. The semiconductor structure 100*h* may be similar to the semiconductor structure 100, except the opening in the metal layer is narrower than the dielectric feature exposed by the opening in accordance with some embodiments. Materials and processes for manufacturing the semiconductor structure 100*h* may be similar to, or the same as, those for manufacturing the semiconductor structure 100 described above and are not repeated herein.

Similar to the semiconductor structure 100*g*, although the dielectric feature 134-2 is exposed by an opening 179*h* of a metal layer 178*h*', the edges of the dielectric feature 134-2 and the opening 179*h* of the metal layer 178*h*' are not aligned with each other in accordance with some embodiments. More specifically, the opening 179*h* of the metal layer 178*h*' is narrower than the dielectric feature 134-2, such that the dielectric feature 134-2 is partially exposed by the opening 179*h* and is partially covered by the metal layer 178*h*' in accordance with some embodiments.

In some embodiments, the dielectric feature 134-2 is partially covered by a dielectric layer 190*h* and is partially covered by the metal layer 178*h*'. In some embodiments, both the portions 178*h*'-1 and 178*h*'-2 of the metal layer 178*h*' extend onto the top surface of the dielectric feature 134-2. The processes and materials for forming the metal layer 178*h*' and the dielectric layer 190*h* may be the same as those for forming the metal layer 178' and the dielectric layer 190 and therefore are not repeated herein.

Figure 12:
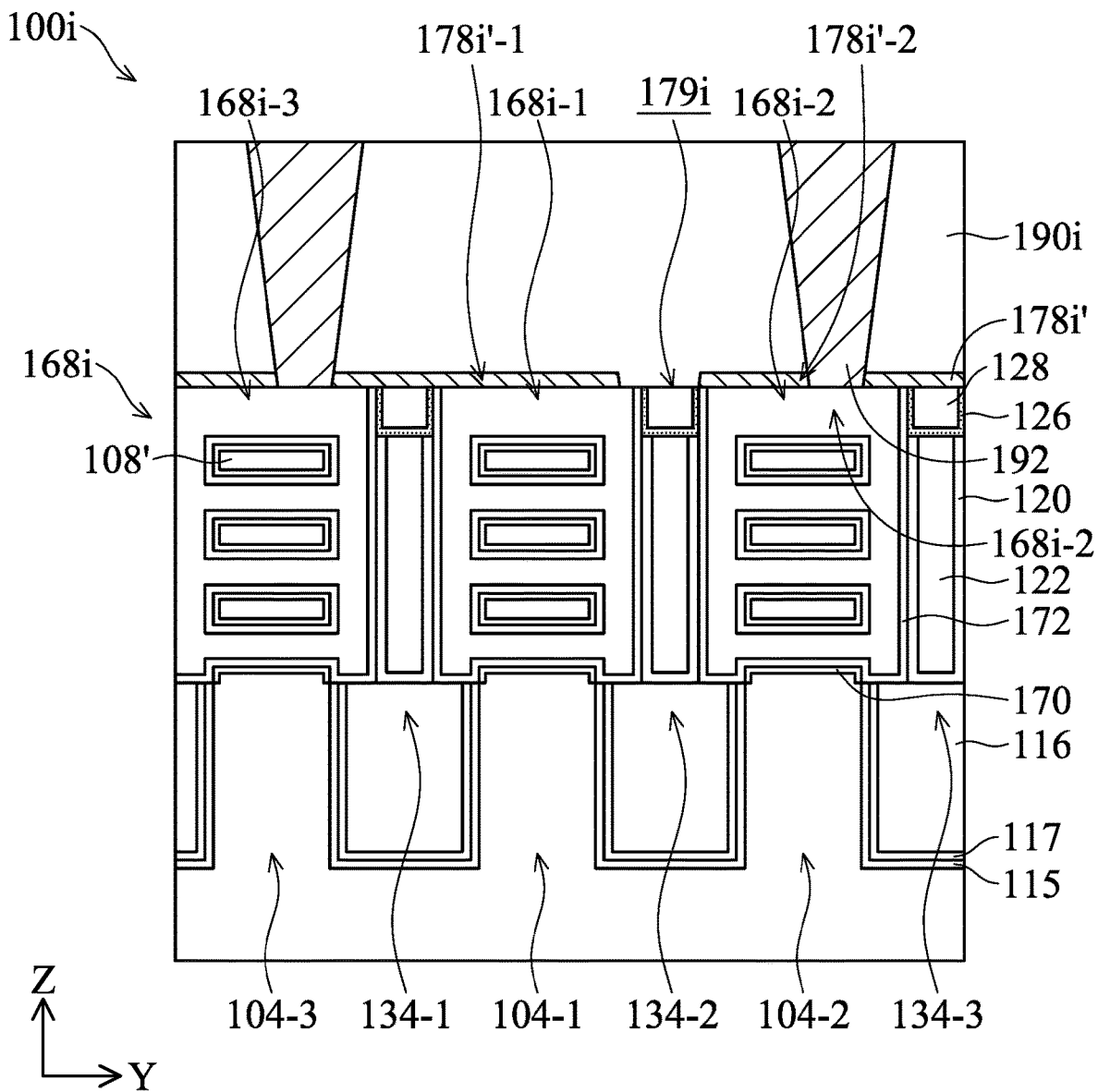
FIG. 12 illustrates a cross-sectional view of a semiconductor structure in accordance with some embodiments.

FIG. 12 illustrates a cross-sectional view of a semiconductor structure 100*i* shown along the Y direction at the channel region in accordance with some embodiments. The semiconductor structure 100*i* may be similar to the semiconductor structure 100, except the opening in the metal layer is not fully aligned with the dielectric feature exposed by the opening in accordance with some embodiments. Materials and processes for manufacturing the semiconductor structure 100*i* may be similar to, or the same as, those for manufacturing the semiconductor structure 100 described above and are not repeated herein.

Similar to the semiconductor structure 100*g*, although the dielectric feature 134-2 is exposed by an opening 179*i* of a metal layer 178*i*', the edges of the dielectric feature 134-2 and the opening 179*i* of the metal layer 178*i*' are not fully aligned with each other in accordance with some embodiments. More specifically, one of the sidewall of the opening 179*i* of the metal layer 178*i*' is aligned with one the sidewall of the dielectric feature 134-2, while another sidewall of the opening 179*i* is located over the top surface of the portion 168*i*-1 of the gate structure 168*i* in accordance with some embodiments.

In some embodiments, a dielectric layer 190*i* formed over the metal layer 178*i*' is in direct contact with the portion 168*i*-1 of the gate structure 168*i* and the dielectric feature 134-2, while the portions 168*i*-2 and 168*i*-3 of the gate structure 168*i* and the dielectric features 134-1 and 134-3 are separated from the dielectric layer 190*i* by the metal layer 178*i*'. The processes and materials for forming the metal layer 178*i*' and the dielectric layer 190*i* may be the same as those for forming the metal layer 178' and the dielectric layer 190 and therefore are not repeated herein.

Figure 13:
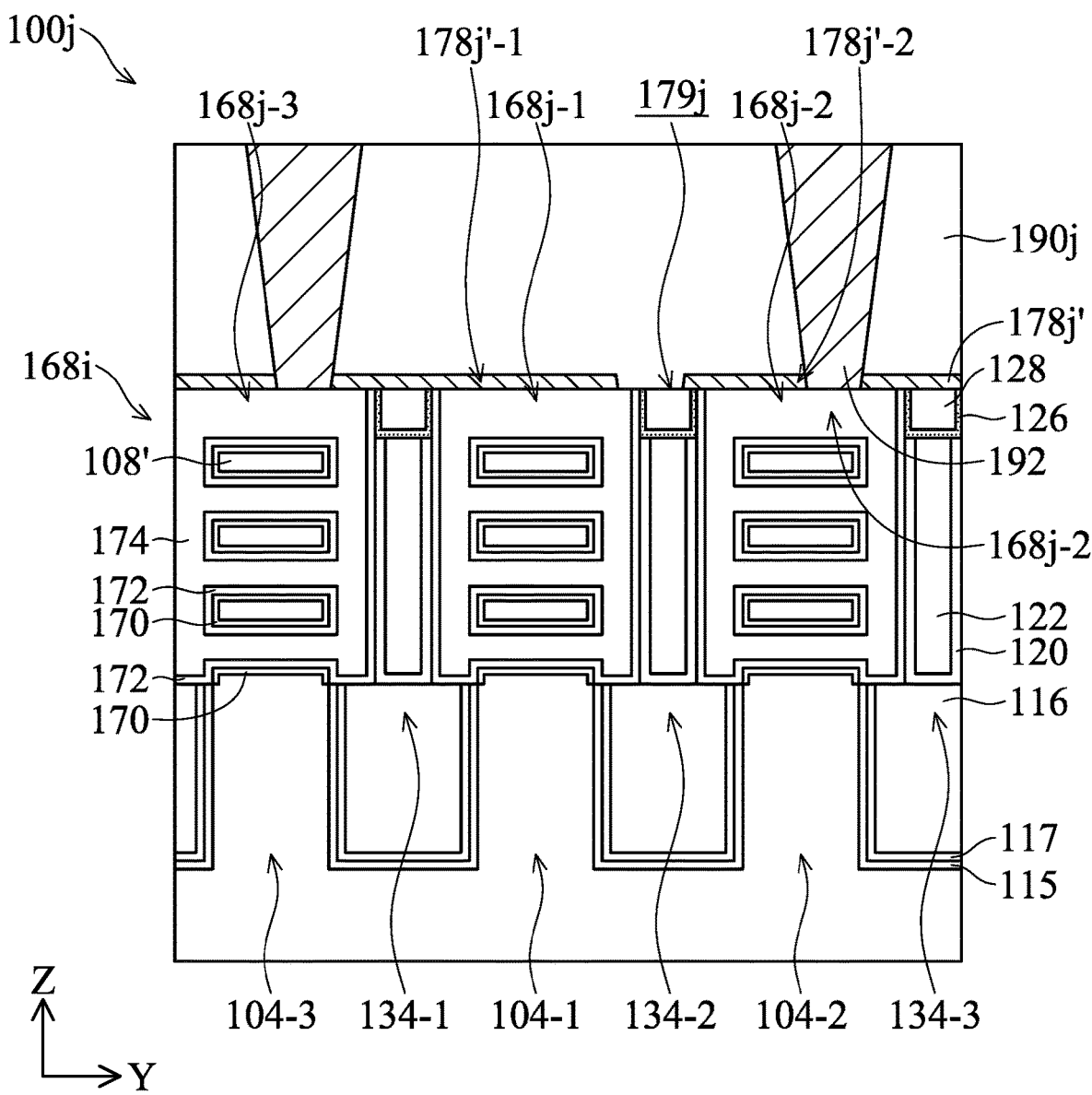
FIG. 13 illustrates a cross-sectional view of a semiconductor structure in accordance with some embodiments.

FIG. 13 illustrates a cross-sectional view of a semiconductor structure 100*j* shown along the Y direction at the channel region in accordance with some embodiments. The semiconductor structure 100*j* may be similar to the semiconductor structure 100, except the opening in the metal layer is not aligned with the dielectric feature exposed by the opening in accordance with some embodiments. Materials and processes for manufacturing the semiconductor structure 100*j* may be similar to, or the same as, those for manufacturing the semiconductor structure 100 described above and are not repeated herein.

Similar to the semiconductor structure 100*g*, although the dielectric feature 134-2 is exposed by an opening 179*j* of a metal layer 178*j*', the edges of the dielectric feature 134-2 and the opening 179*j* of the metal layer 178*j*' are not aligned with each other in accordance with some embodiments. More specifically, one of the sidewall of the opening 179*j* of the metal layer 178*j*' is located over the top surface of the dielectric feature 134-2, while another sidewall of the opening 179*j* is located over the top surface of the portion 168*j*-1 of the gate structure 168*j* in accordance with some embodiments.

In some embodiments, a dielectric layer 190*j* formed over the metal layer 178*j*' is in direct contact with the portion 168*j*-1 of the gate structure 168*j* and the dielectric feature 134-2, while the portions 168*j*-2 and 168*j*-3 of the gate structure 168*j* and the dielectric features 134-1 and 134-3 are separated from the dielectric layer 190*j* by the metal layer 178*j*'. In addition, the portion 178*j*'-2 of the metal layer 178*j*' extends over the top surface of the dielectric feature 134-2 in accordance with some embodiments. The processes and materials for forming the metal layer 178*j*' and the dielectric layer 190*j* may be the same as those for forming the metal layer 178' and the dielectric layer 190 and therefore are not repeated herein.

Figure 14A:
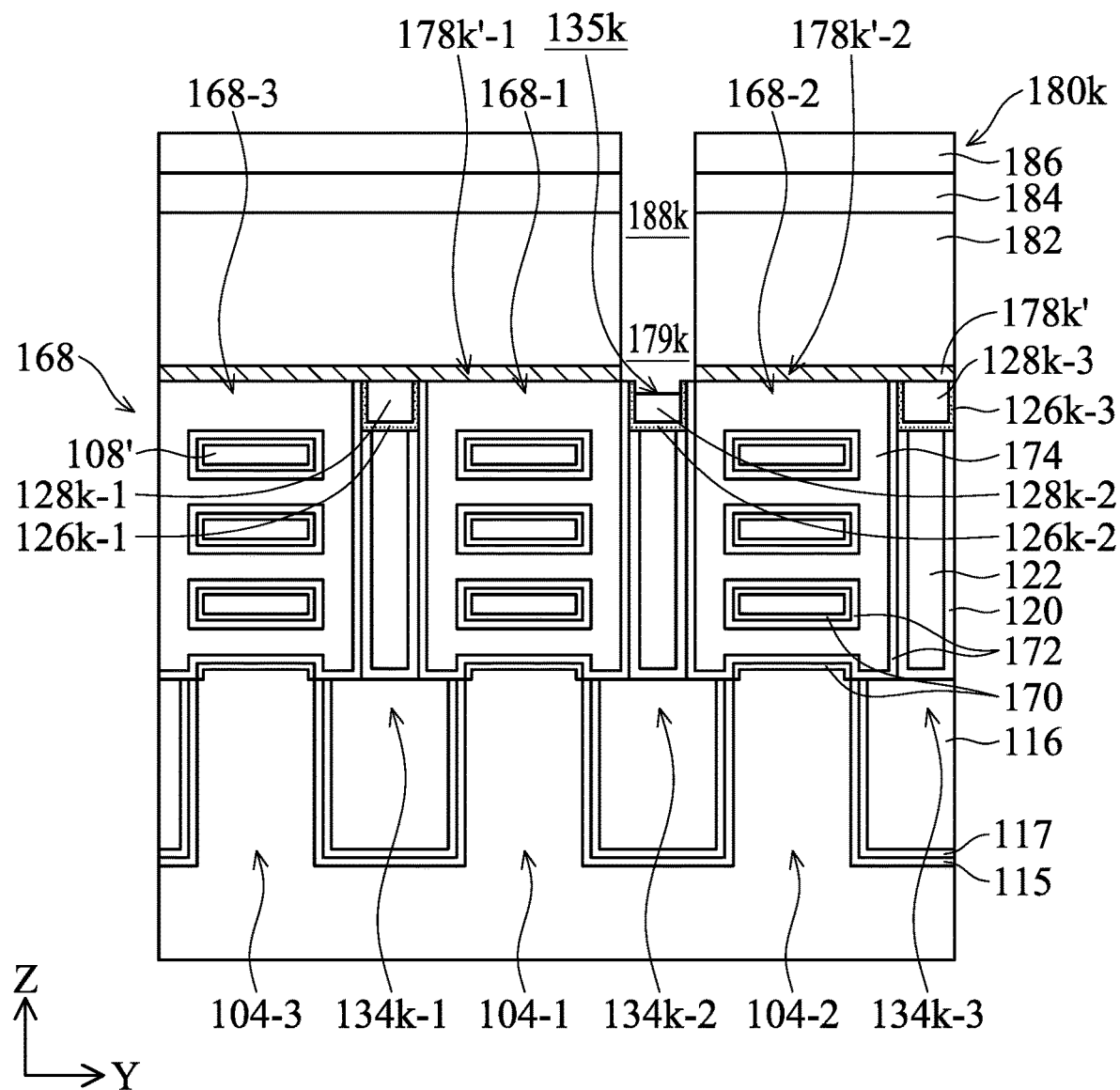
FIGS. 14A and 14B illustrate cross-sectional views of intermediate stages of manufacturing a semiconductor structure in accordance with some embodiments.
Figure 14B:
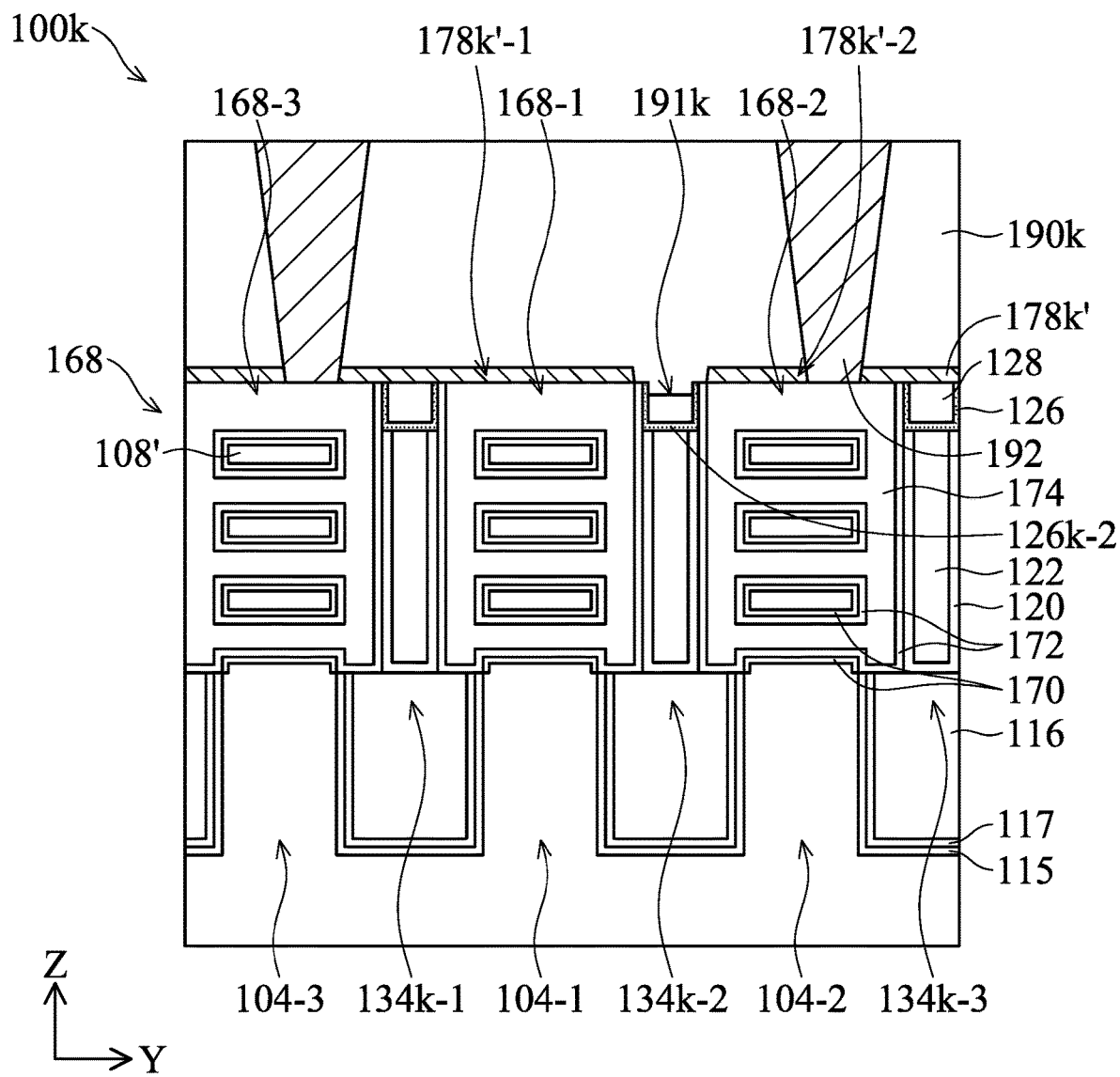

FIGS. 14A and 14B illustrate cross-sectional views of intermediate stages of manufacturing a semiconductor structure 100*k* shown along the Y direction at the channel region in accordance with some embodiments. The semiconductor structure 100*k* may be similar to the semiconductor structure 100, except the dielectric feature exposed by the opening of the metal layer is partially removed in accordance with some embodiments. Materials and processes for manufacturing the semiconductor structure 100*k* may be similar to, or the same as, those for manufacturing the semiconductor structure 100 described above and are not repeated herein.

More specifically, the processes shown in FIGS. 2A to 2W are performed, and then a metal layer is patterned through the opening 188*k* of the photoresist structure 180*k* to form a patterned metal layer 178*k*' having an opening 179*k*, as shown in FIG. 14A in accordance with some embodiments. In some embodiments, the dielectric feature 134*k*-2 under the opening 179*k* of the metal layer 178*k*' is also etched to form a recess 135*k* during the etching process for patterning the metal layer. In some embodiments, a bottom portion of the recess 135*k* is lower than a top surface of the gate structure 168. In some embodiments, the top portion of the core portion 128*k*-2 of the dielectric feature 134*k*-2 is removed (e.g. etched), so that the top surface a core portion 128*k*-2 of the dielectric feature 134*k*-2 is lower than the top surface of a core portion 128*k*-1 of a dielectric feature 134*k*-1 and a top surface of a core portion 128*k*-3 of a dielectric feature 134*k*-3. In some embodiments, the top portion of the shell layer 126*k*-2 of the dielectric feature 134*k*-2 is higher than the top surface of the core portion 128*k*-2 and is substantially level with top portion of the shell layers 126*k*-1 and 126*k*-3 of the dielectric features 134*k*-1 and 134*k*-3.

Afterwards, the processes shown in FIGS. 2Y and 2Z are performed to form the semiconductor structure 100*k*, as shown in FIG. 14B in accordance with some embodiments. Since the core portion 128*k*-2 of the dielectric feature 134*k*-2 is partially removed, a dielectric layer 190*k* formed over the metal layer 178*k*' has an extending portion 191*k* extending into the recess 135*k* over the dielectric feature 134*k*-2 in accordance with some embodiments. In some embodiments, the extending portion 191*k* of the dielectric layer 190*k* is surrounded by the shell layer 126*k*-2. In addition, the bottom surface of the extending portion 191*k* of the dielectric layer 190*k* (or the top surface of the core portion 128*k*-2 of the dielectric feature 134*k*-2) is lower than the top surface of the gate structure 168, the top surface of the dielectric features 134*k*-1 and 134*k*-3, and the bottom surface of the metal layer 178*k*' in accordance with some embodiments. The processes and materials for forming the dielectric features 134*k*-1, 134*k*-2, and 134*k*-3, the metal layer 178*k*', the photoresist structure 180*k*, and the dielectric layer 190*k* may be the same as those for forming the dielectric features 134-1, 134-2, and 134-3, the metal layer 178', the photoresist structure 180, and the dielectric layer 190 and therefore are not repeated herein.

Figure 15A:
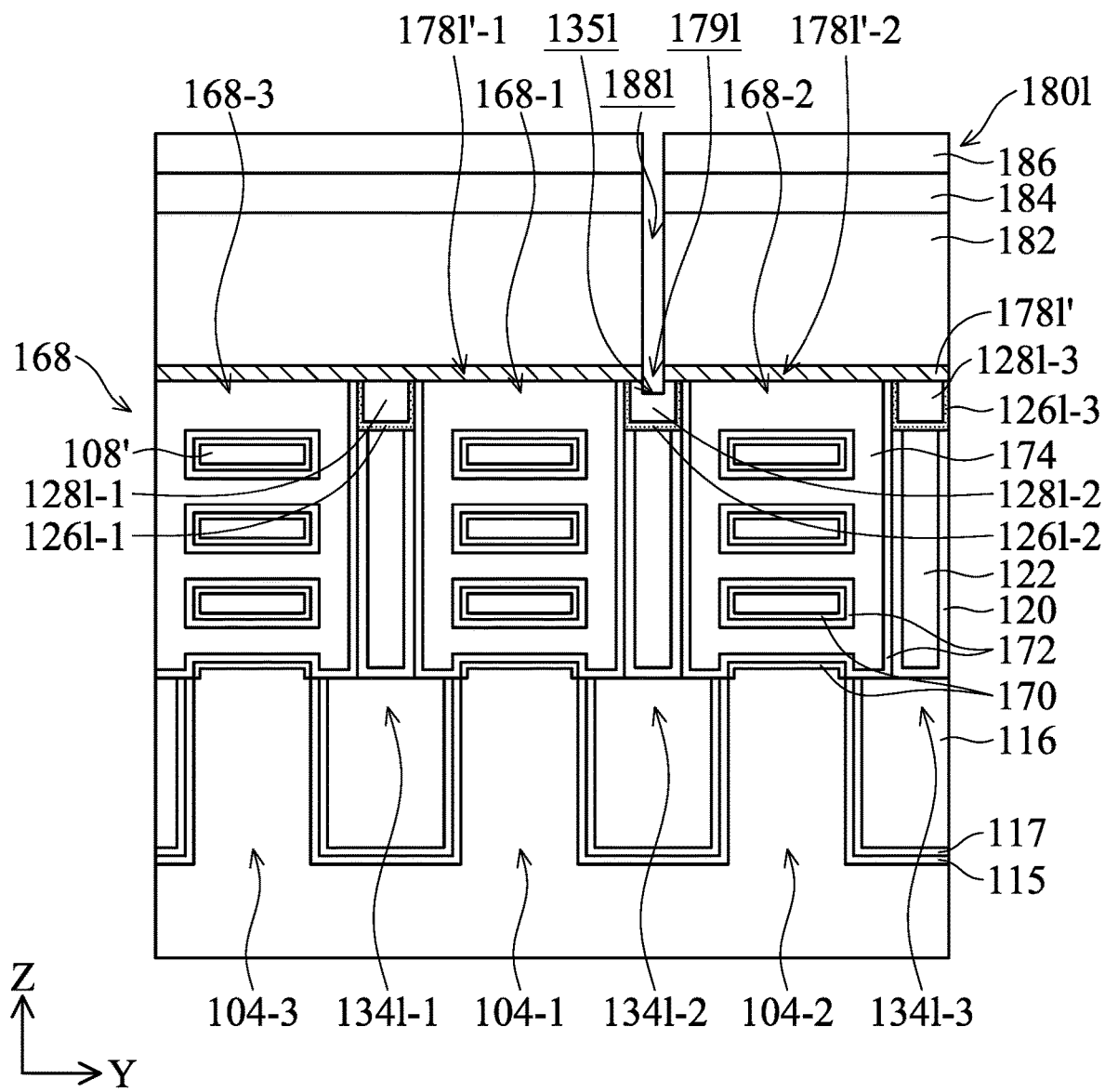
FIGS. 15A and 15B illustrate cross-sectional views of intermediate stages of manufacturing a semiconductor structure in accordance with some embodiments.
Figure 15B:
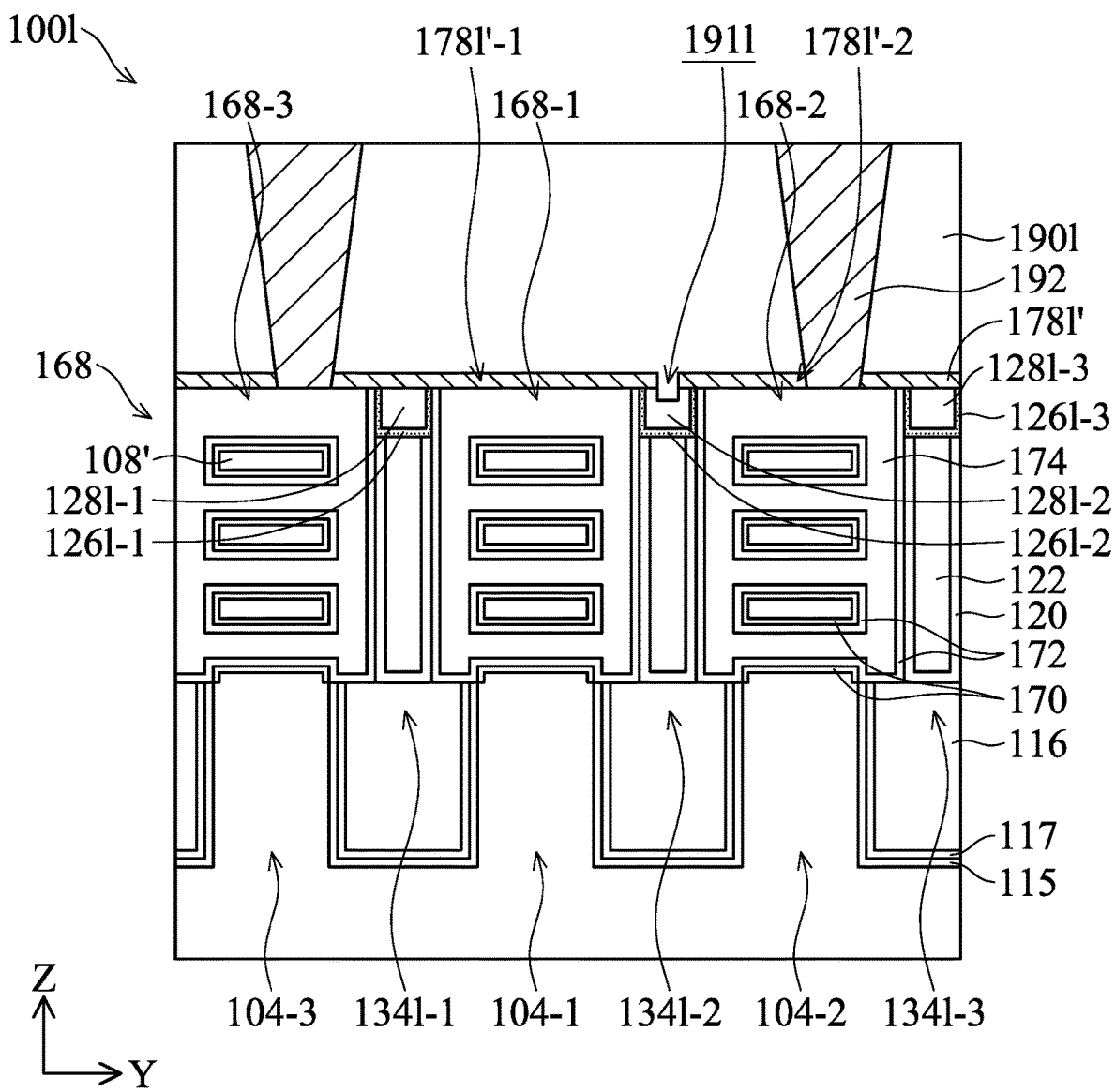

FIGS. 15A and 15B illustrate cross-sectional views of intermediate stages of manufacturing a semiconductor structure 100*l* shown along the Y direction at the channel region in accordance with some embodiments. The semiconductor structure 100*l* may be similar to the semiconductor structure 100, except the dielectric feature exposed by the opening of the metal layer is partially removed in accordance with some embodiments. Materials and processes for manufacturing the semiconductor structure 100*l* may be similar to, or the same as, those for manufacturing the semiconductor structure 100 described above and are not repeated herein.

More specifically, the processes shown in FIGS. 2A to 2W are performed, and then a metal layer is patterned through the opening 188*l* of the photoresist structure 180*l* to form a patterned metal layer 178*l*' having an opening 179*l*, as shown in FIG. 15A in accordance with some embodiments. In some embodiments, the dielectric feature 134*l*-2 under the opening 179*l* of the metal layer 178*l*' is also etched to form a recess 135*l* in a core portion 128*l*-2 of the dielectric feature 134*l*-2 during the etching process for patterning the metal layer. In some embodiments, the width of the recess 135*l* measured at the top surface of the core portion 128*l*-2 of the dielectric feature 134*l*-2 is smaller than the width of the core portion 128*l*-2 of the dielectric feature 134*l*-2.

Afterwards, the processes shown in FIGS. 2Y and 2Z are performed to form the semiconductor structure 100*l*, as shown in FIG. 15B in accordance with some embodiments. Since the core portion 128*l*-2 of the dielectric feature 134*l*-2 has the recess 135*l* formed therein, a dielectric layer 190*l* formed over the metal layer 178*l*' has an extending portion 191*l* extending into the recess 135*l* of the dielectric feature 134*l*-2 in accordance with some embodiments. In some embodiments, the extending portion 191*l* of the dielectric layer 190*l* is surrounded by the core portion 128*l*-2. In addition, the bottom surface of the extending portion 191*l* of the dielectric layer 190*l* is lower than the top surface of the gate structure 168, the top surfaces of the dielectric features 134*l*-1, 134*l*-2, and 134*l*-3, and the bottom surface of the metal layer 178*l*' in accordance with some embodiments. The processes and materials for forming the dielectric features 134*l*-1, 134*l*-2, and 134*l*-3, the metal layer 178*l*', the photoresist structure 180*l*, and the dielectric layer 190*l* may be the same as those for forming the dielectric features 134-1, 134-2, and 134-3, the metal layer 178', the photoresist structure 180, and the dielectric layer 190 and therefore are not repeated herein.

Figure 16A:
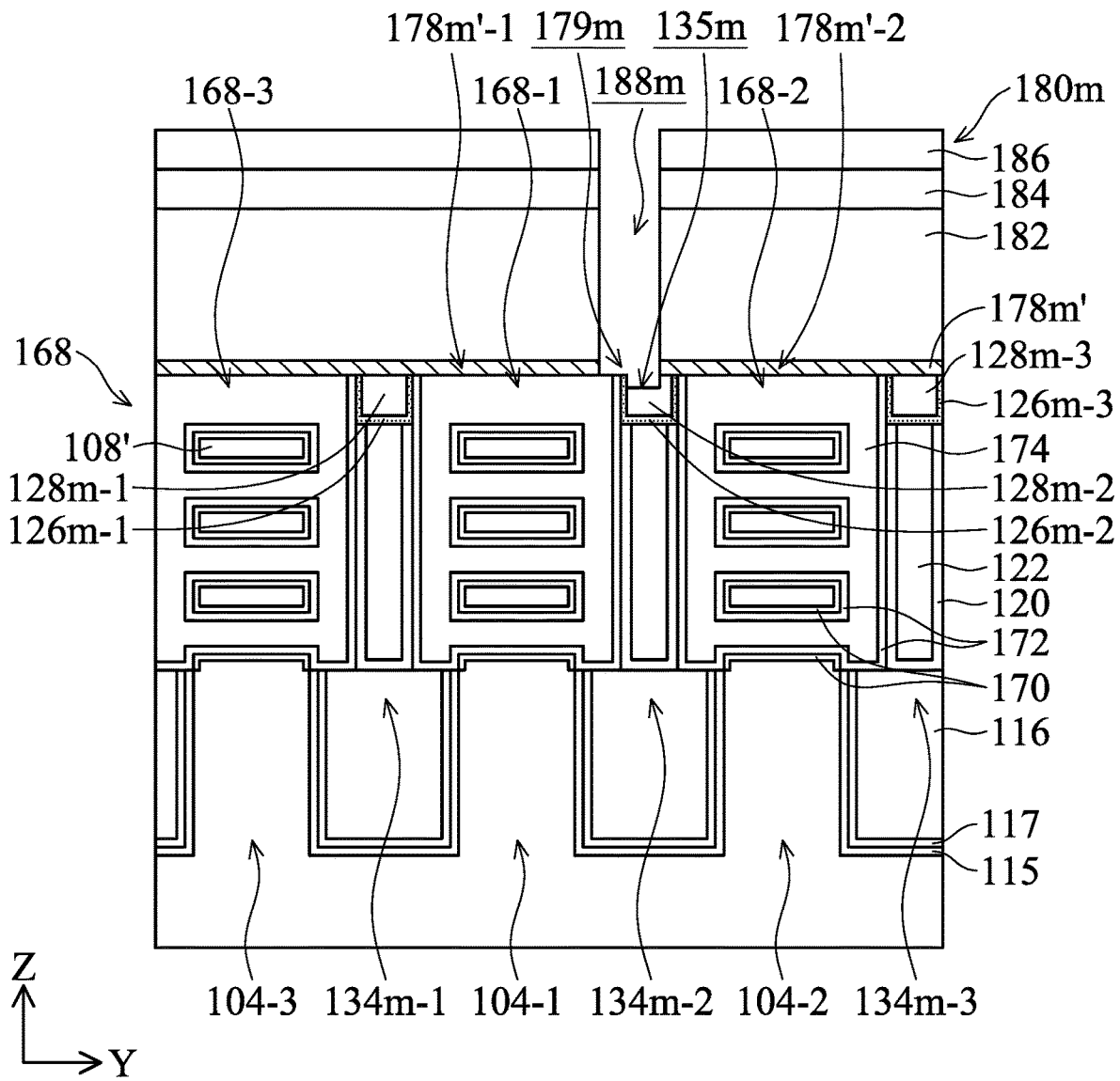
FIGS. 16A and 16B illustrate cross-sectional views of intermediate stages of manufacturing a semiconductor structure in accordance with some embodiments.
Figure 16B:
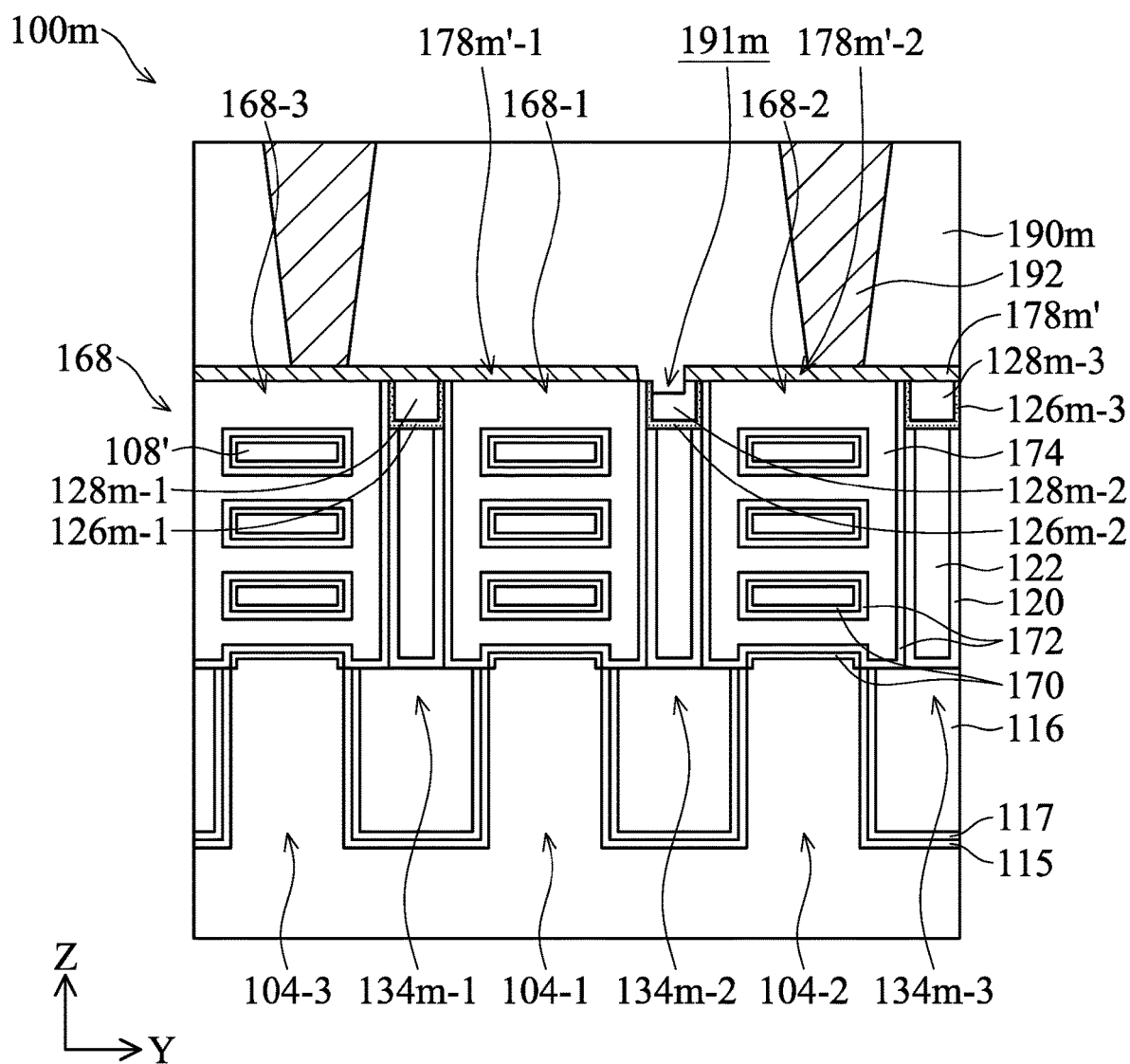

FIGS. 16A and 16B illustrate cross-sectional views of intermediate stages of manufacturing a semiconductor structure 100*m* shown along the Y direction at the channel region in accordance with some embodiments. The semiconductor structure 100*m* may be similar to the semiconductor structure 100, except the dielectric feature exposed by the opening of the metal layer is partially removed in accordance with some embodiments. Materials and processes for manufacturing the semiconductor structure 100*m* may be similar to, or the same as, those for manufacturing the semiconductor structure 100 described above and are not repeated herein.

More specifically, the processes shown in FIGS. 2A to 2W are performed, and a metal layer is patterned through the opening 188*m* of the photoresist structure 180*m* to form a patterned metal layer 178*m*' having an opening 179*m*, as shown in FIG. 16A in accordance with some embodiments. In some embodiments, the core portion 128*m*-2 of the dielectric feature 134*m*-2 is partially exposed by the opening 179*m* of the metal layer 178*m*' and is also etched to form a recess 135*m* during the etching process for patterning the metal layer. In some embodiments, the opening 179*m* of the metal layer 178*m*' is wider than the recess 135*m* of the dielectric feature 134*m*-2.

Afterwards, the processes shown in FIGS. 2Y and 2Z are performed to form the semiconductor structure 100*m*, as shown in FIG. 16B in accordance with some embodiments. Since the core portion 128*m*-2 of the dielectric feature 134*m*-2 has the recess 135*m* formed therein, a dielectric layer 190m formed over the metal layer 178m' has an extending portion 191m extending into the recess 135m over the dielectric feature 134m-2 in accordance with some embodiments. In some embodiments, the extending portion 191m of the dielectric layer 190m extends into the core portion 128m-2 and is in contact with the shell layer 126m-2. In addition, the bottom surface of the extending portion 191m of the dielectric layer 190m is lower than the top surface of the gate structure 168m, the top surfaces of the dielectric features 134m-1, 134m-2, and 134m-3, and the bottom surface of the metal layer 178m' in accordance with some embodiments. The processes and materials for forming the dielectric features 134m-1, 134m-2, and 134m-3, the metal layer 178m', the photoresist structure 180m, and the dielectric layer 190m may be the same as those for forming the dielectric features 134-1, 134-2, and 134-3, the metal layer 178', the photoresist structure 180, and the dielectric layer 190 and therefore are not repeated herein.

Generally, a gate structure may need to be divided into various portions by isolation features according to the design of a semiconductor device. However, if isolation features are formed through the gate structure to divide the gate structure, additional space may be needed to prevent mis-alignment issues when forming the isolation features. In some embodiments, dielectric features (e.g. the dielectric features 134, 134-1, 134-2, 134-3, 134b-1 to 134m-1, 134b-2 to 134m-2, 134b-3 to 134m-3) are self-aligned to the spacing between the fin structures (e.g. the fin structure 104-1, 104-2, and 104-3, which will be formed as the nanostructures 108'), and therefore the distance between the fin structures can be reduced. In addition, a metal layer (e.g. the metal layer 178') is formed over the separated portions of the gate structure and is patterned to connect some portions of the gate structure while some other portions of the gate structure are not connected. Since the connections and disconnections of different regions of the gate structure are achieved by the patterned metal layer and the patterning of the metal layer has a larger overlay shift tolerance, the device size may be further reduced. In addition, the nanostructures may therefore have a higher density and be wider.

Furthermore, the dielectric features are made of a top portion (e.g. the top portion 134T) and the bottom portion (134B), and the bottom portion and the core portion (e.g. the core portion 128) of the dielectric features may be made of low k dielectric materials. Therefore, the capacitance (e.g. gate structure to source/drain structure) may be reduced (e.g. 3-5%) and the speed of the resulting device may be improved (e.g. 3-5%). In addition, the power efficiency may also be improved (e.g. 4-6%).

In addition, although a cap layer (e.g. the cap layer 132) formed over the core portion and a shell layer (e.g. the shell layer 126) surrounding the core portion may be made of high k dielectric materials, these portions will be partially removed during the manufacturing process. Therefore, the dielectric features in the resulting device can still have a relatively low k value.

Moreover, although voids may tend to be formed in a thick high k structure (e.g. thicker than 4 nm), the high k portions in the dielectric features are relatively thin and the main portion of the dielectric features are the core portion and the bottom portion. In addition, an additional anneal process may be performed to prevent the formation of the voids during the formation of the core portions. Therefore, no or fewer voids will be formed in the dielectric features and the leakage paths resulting from the voids can be avoided. Accordingly, the reliability of the resulting device may be improved.

It should be appreciated that the elements shown in the semiconductor structures 100 and 100a to 100m may be combined and/or exchanged. For example, a semiconductor structure may include at least two of the kinds of dielectric features that are shown in semiconductor structures 100 and 100a to 100m.

In addition, it should be noted that same elements in FIGS. 1 to 16B may be designated by the same numerals and may include materials that are the same or similar and may be formed by processes that are the same or similar; therefore such redundant details are omitted in the interests of brevity. In addition, although FIGS. 1 to 16B are described in relation to the method, it will be appreciated that the structures disclosed in FIGS. 1 to 16B are not limited to the method but may stand alone as structures independent of the method.

Similarly, the methods shown in FIGS. 1 to 16B are not limited to the disclosed structures but may stand alone independent of the structures. Furthermore, the nanostructures described above may include nanowires, nanosheets, or other applicable nanostructures in accordance with some embodiments.

Also, while the disclosed methods are illustrated and described below as a series of acts or events, it should be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure may include a gate structure wrapped around nanostructures. In addition, dielectric features may be formed to separate the gate structures in various portions. The dielectric feature may include a bottom portion and a top portion over the bottom portion, and the top portion may include a shell layer and a core portion over the shell layer. The formation of the dielectric features may help to improve the performance of the semiconductor structure, such as the speed, the power efficiency, and the reliability may be improved.

In some embodiments, a semiconductor structure is provided. The semiconductor structure includes a substrate and first nanostructures and second nanostructures formed over the substrate. The semiconductor structure also includes a gate structure including a first portion wrapping around the first nanostructures and a second portion wrapping around the second nanostructures. The semiconductor structure also includes a dielectric feature sandwiched between the first portion and the second portion of the gate structure. In addition, the dielectric feature includes a bottom portion and a top portion over the bottom portion, and the top portion of the dielectric feature includes a shell layer and a core portion surrounded by the shell layer.

In some embodiments, a semiconductor structure is provided. The semiconductor structure includes a substrate and nanostructures formed over the substrate. The semiconductor structure also includes a gate structure wrapping around the nanostructures and a first dielectric feature separating the gate structure into a first portion and a second portion. In addition, the first dielectric feature includes a bottom portion and a top portion over the bottom portion. Furthermore, the top portion of the first dielectric feature includes a shell layer made of a first dielectric material and a core portion made of a second dielectric material, and a dielectric constant of the first dielectric material is higher than a dielectric constant of the second dielectric material.

In some embodiments, a method for manufacturing a semiconductor structure is provided. The method for manufacturing the semiconductor structure includes forming a fin structure protruding from a substrate. In addition, the fin structure includes first semiconductor material layers and second semiconductor material layers alternately stacked. The method for manufacturing the semiconductor structure also includes forming an isolation structure surrounding the fin structure and forming a dielectric feature over the isolation structure. The step of forming a dielectric feature over the isolation structure includes forming a bottom portion of the dielectric feature over the isolation structure and forming a shell layer over the bottom portion of the dielectric feature. The step of forming a dielectric feature over the isolation structure further includes forming a core portion over the shell layer and surrounded by the shell layer and recessing the shell layer and the core layer to form a recess. The step of forming a dielectric feature over the isolation structure further includes forming a cap layer in the recess. The method for manufacturing the semiconductor structure also includes removing the first semiconductor material layers of the fin structure to form nanostructures with the second semiconductor material layers and forming a gate structure wrapping around the nanostructure s.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a fin structure protruding from a substrate, wherein the fin structure comprises first semiconductor material layers and second semiconductor material layers alternately stacked;
    forming an isolation structure surrounding the fin structure;
    forming a dielectric feature over the isolation structure, comprising:
        forming a bottom portion of the dielectric feature over the isolation structure;
        forming a shell layer over a top surface of the bottom portion of the dielectric feature;
        forming a core portion over the shell layer and surrounded by the shell layer;
        recessing the core portion to form a recess; and
        forming a cap layer in the recess;
    removing the first semiconductor material layers of the fin structure to form nanostructures with the second semiconductor material layers; and
    forming a gate structure wrapping around the nanostructures.

2. The method for manufacturing the semiconductor structure as claimed in claim 1, wherein the dielectric feature interposes into the gate structure.

3. The method for manufacturing the semiconductor structure as claimed in claim 1, further comprising:
    removing a top portion of the gate structure and the cap layer of the dielectric feature;
    forming a metal layer over the gate structure and the dielectric feature;
    patterning the metal layer to form an opening in the metal layer; and
    forming a dielectric layer over the metal layer and in the opening of the metal layer.

4. The method for manufacturing the semiconductor structure as claimed in claim 3, wherein a portion of the dielectric feature and a portion of the gate structure are exposed by the opening of the metal layer.

5. The method for manufacturing the semiconductor structure as claimed in claim 3, wherein the dielectric feature is partially exposed by the opening of the metal layer and is partially covered by the metal layer.

6. The method for manufacturing the semiconductor structure as claimed in claim 3, further comprising:
    recessing the core portion of the dielectric feature before forming the dielectric layer over the metal layer.

7. The method for manufacturing the semiconductor structure as claimed in claim 6, wherein a bottom surface of the dielectric layer is lower than a top surface of the gate structure.

8. A method for manufacturing a semiconductor structure, comprising:
    alternately stacking first semiconductor material layers and second semiconductor material layers over a substrate;
    patterning the first semiconductor material layers, the second semiconductor material layers, and the substrate to form a first fin structure and a second fin structure;
    forming a bottom portion of a dielectric feature in a bottom portion of a first trench between the first fin structure and the second fin structure;
    forming a shell layer of the dielectric feature lining an upper portion of the first trench;
    forming a core portion of the dielectric feature over the shell layer in the upper portion of the first trench;
    recessing the core portion to form a recess;
    forming a cap layer in the recess;
    removing the first semiconductor material layers of the first fin structure and the second fin structure; and
    forming a gate electrode layer wrapping around the second semiconductor material layers of the first fin structure and the second fin structure, wherein the gate electrode layer covers a top surface of the cap layer.

9. The method for manufacturing the semiconductor structure as claimed in claim 8, further comprising:
    removing an upper portion of the gate electrode layer and the cap layer to expose a top surface of the core portion.

10. The method for manufacturing the semiconductor structure as claimed in claim 9, wherein the gate electrode layer is divided into a first portion and a second portion electrically separated by the dielectric feature.

11. The method for manufacturing the semiconductor structure as claimed in 10, further comprising:
 a metal layer covering the first portion and the second portion of the gate electrode layer and the top surface of the core portion.

12. The method for manufacturing the semiconductor structure as claimed in claim 11, further comprising:
 forming a dielectric layer over the metal layer, wherein the dielectric layer has an extending portion formed through the metal layer.

13. A method for manufacturing a semiconductor structure, comprising:
 forming a fin structure protruding from a substrate, wherein the fin structure comprises first semiconductor material layers and second semiconductor material layers alternately stacked;
 forming an isolation structure around the fin structure;
 forming a cladding layer covering sidewalls and a top surface of the fin structure over the isolation structure;
 forming a liner layer covering a lower portion of a sidewall of the cladding layer and over the isolation structure;
 forming a filling layer over the liner layer;
 forming a shell layer covering an upper portion of the sidewall of the cladding layer and over the filling layer;
 forming a core portion over the shell layer;
 removing the cladding layer and the first semiconductor material layers; and
 forming a gate structure wrapping around the second semiconductor material layers, wherein a portion of the gate structure is laterally sandwiched between the liner layer and the second semiconductor material layers.

14. The method for manufacturing the semiconductor structure as claimed in claim 13, further comprising:
 forming a source/drain structure attached to the second semiconductor material layers in a first direction and attached to the liner layer in a second direction that is different from the first direction.

15. The method for manufacturing the semiconductor structure as claimed in claim 14, wherein the gate structure comprises a gate dielectric layer and a gate electrode layer, and the gate dielectric layer is in contact with both the liner layer and the shell layer in the second direction.

16. The method for manufacturing the semiconductor structure as claimed in claim 13, wherein a dielectric constant of a material for forming the shell layer is higher than a dielectric constant of a material for forming the core portion.

17. The method for manufacturing the semiconductor structure as claimed in claim 13, further comprising:
 partially removing the shell layer; and
 forming a metal layer continuously extending over the gate structure, the shell layer, and the core portion.

18. The method for manufacturing the semiconductor structure as claimed in claim 17, further comprising:
 forming an opening in the metal layer to expose the core portion; and
 forming a dielectric material in the opening and covering a top surface of the metal layer.

19. The method for manufacturing the semiconductor structure as claimed in claim 8, further comprising:
 forming a first source/drain structure attaching to the second semiconductor material layers of the first fin structure and a second source/drain structure attaching to the second semiconductor material layers of the first fin structure; and
 forming a source/drain contact covering both the first source/drain structure and the second source/drain structure.

20. The method for manufacturing the semiconductor structure as claimed in claim 19, wherein the source/drain contact has an unflat bottom surface.

* * * * *